United States Patent
Morihara et al.

(10) Patent No.: US 6,747,582 B2
(45) Date of Patent: Jun. 8, 2004

(54) DATA COMPRESSING APPARATUS, RECONSTRUCTING APPARATUS, AND ITS METHOD

(75) Inventors: Takashi Morihara, Kawasaki (JP); Yahagi Hironori, Kawasaki (JP); Satoh Noriko, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/308,000

(22) Filed: Dec. 3, 2002

(65) Prior Publication Data

US 2003/0091241 A1 May 15, 2003

Related U.S. Application Data

(62) Division of application No. 09/099,421, filed on Jun. 18, 1998, now Pat. No. 6,542,640.

(30) Foreign Application Priority Data

Jan. 22, 1998 (JP) .......................................... 10-010076

(51) Int. Cl.⁷ ................................................ H03M 7/00
(52) U.S. Cl. ........................................ 341/106; 341/50
(58) Field of Search ........................... 341/106, 51, 87; 375/240; 382/229

(56) References Cited

U.S. PATENT DOCUMENTS

| | | | |
|---|---|---|---|
| 4,558,302 A | 12/1985 | Welch | |
| 4,843,389 A | 6/1989 | Lisle et al. | |
| 5,086,439 A | 2/1992 | Asai et al. | |
| 5,109,433 A | 4/1992 | Notenboom | |
| 5,374,916 A | 12/1994 | Chu | |
| 5,389,922 A | 2/1995 | Seroussi et al. | |
| 5,412,429 A | 5/1995 | Glover | |
| 5,590,317 A | 12/1996 | Iguchi et al. | |
| 5,649,030 A | 7/1997 | Normile et al. | |
| 5,710,562 A | 1/1998 | Gormish et al. | |
| 5,861,827 A | 1/1999 | Welch et al. | |
| 5,867,114 A | 2/1999 | Barbir | |
| 5,877,714 A | 3/1999 | Satoh | |
| 5,907,637 A | 5/1999 | Murashita et al. | |
| 5,982,437 A | 11/1999 | Okazaki et al. | |
| 6,026,198 A | 2/2000 | Okada | |
| 6,047,298 A | 4/2000 | Morishita | |
| 6,304,601 B1 * | 10/2001 | Davison | ...................... 375/240 |

FOREIGN PATENT DOCUMENTS

| | | |
|---|---|---|
| JP | 61232724 | 10/1986 |
| JP | 4086126 | 3/1992 |
| JP | 5046358 | 2/1993 |
| JP | 6266531 | 9/1994 |

OTHER PUBLICATIONS

Tsay, et al. "Data Compression on Multifont Chinese Charater Patterns", IEEE, pp. 139–146, 1994.

U.S. patent application Ser. No. 09/099,421, Morihara et al., filed Jun. 18, 1998, Fujitsu Limited.

* cited by examiner

*Primary Examiner*—Brian Young
(74) *Attorney, Agent, or Firm*—Staas & Halsey LLP

(57) ABSTRACT

A dictionary in which a character train serving as a processing unit upon compression has been registered is stored into a character train dictionary storing unit. In a character train comparing unit, the registration character train in the character train dictionary storing unit and a partial character train in non-compression data are compared, thereby detecting the coincident partial character train. A code output unit allocates a predetermined code every partial character train detected by the character train comparing unit and outputs. The character train dictionary storing unit allocates character train codes of a fixed length of 17 bits to about 130,000 words and substantially compresses a data amount to the half or less irrespective of an amount of document data.

62 Claims, 54 Drawing Sheets

FIG. 4

| PART OF SPEECH CLASS | THE NUMBER OF MORPHEMES (THE TOTAL NUMBER) | COMPONENT RATIO (%) | THE NUMBER OF MORPHEMES (THE DIFFERENT NUMBER) | COMPONENT RATIO (%) |
|---|---|---|---|---|
| NOUN CLASS | 1,375,378 | 26.1 | 110,912 | 81.3 |
| VERB CLASS | 622,125 | 11.8 | 14,638 | 10.7 |
| ADJECTIVE CLASS | 58,742 | 1.1 | 1,204 | 0.9 |
| ADJECTIVE VERB CLASS | 61,192 | 1.2 | 3,796 | 2.8 |
| ADVERB CLASS | 74,332 | 1.4 | 2,934 | 2.1 |
| PARTICIPIAL ADJECTIVE CLASS | 40,271 | 0.8 | 247 | 0.2 |
| CONJUNCTION CLASS | 23,562 | 0.4 | 247 | 0.2 |
| PREFIX CLASS | 21,063 | 0.4 | 318 | 0.2 |
| SUFFIX CLASS | 122,954 | 2.3 | 1,330 | 1.0 |
| WORD' D ENDING CLASS | 631,304 | 12.0 | 155 | 0.1 |
| POST POSITIONAL WORD CLASS | 1,402,757 | 26.7 | 171 | 0.1 |
| AUXILIARY VERB CLASS | 319,852 | 6.1 | 203 | 0.1 |
| INTERJECTION CLASS | 356 | 0.0 | 105 | 0.1 |
| OTHERS | 508,333 | 9.7 | 226 | 0.2 |
| TOTAL | 5,262,221 | 100.0 | 136,486 | 100.0 |

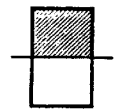
FIG. 6A
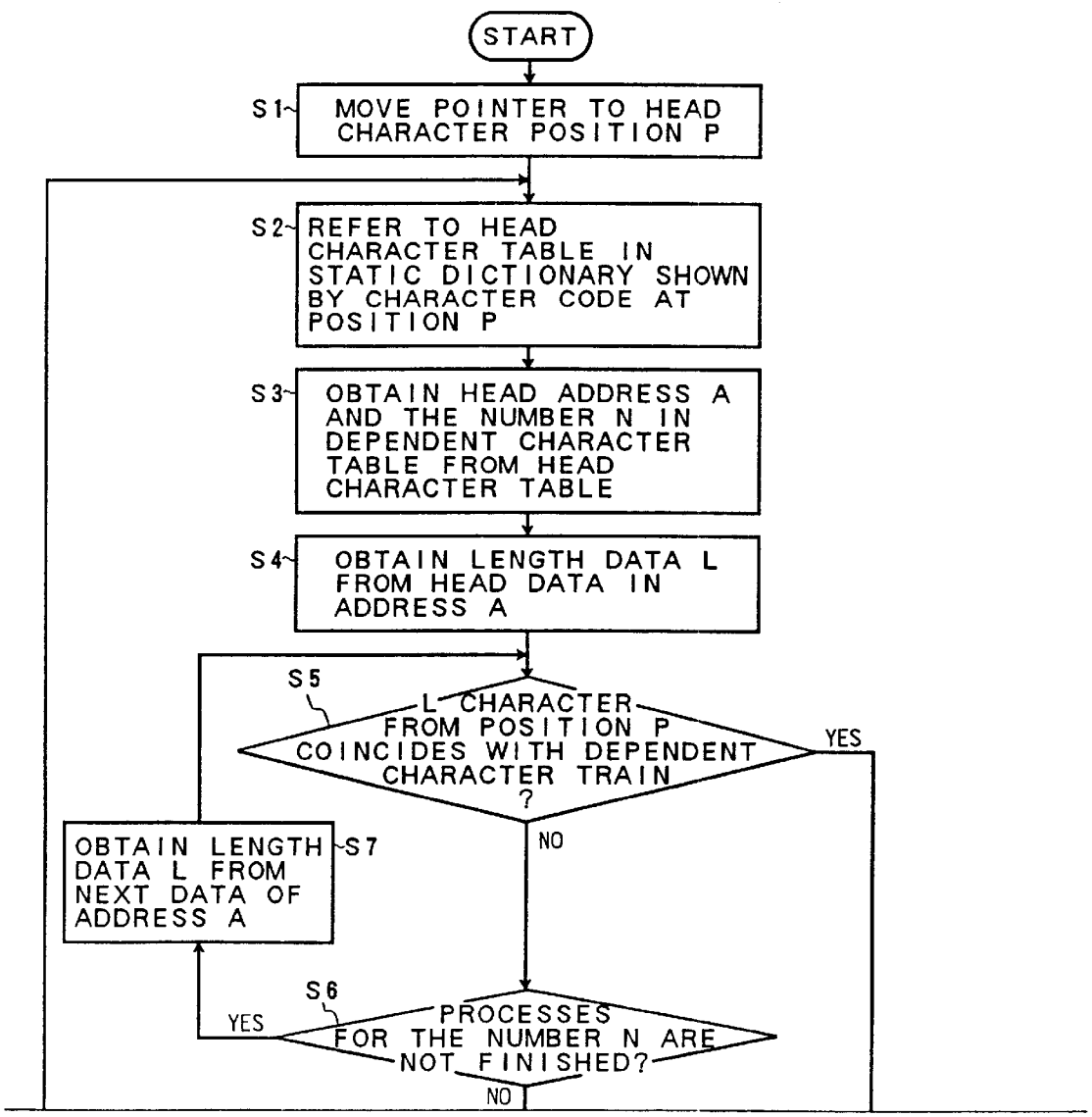

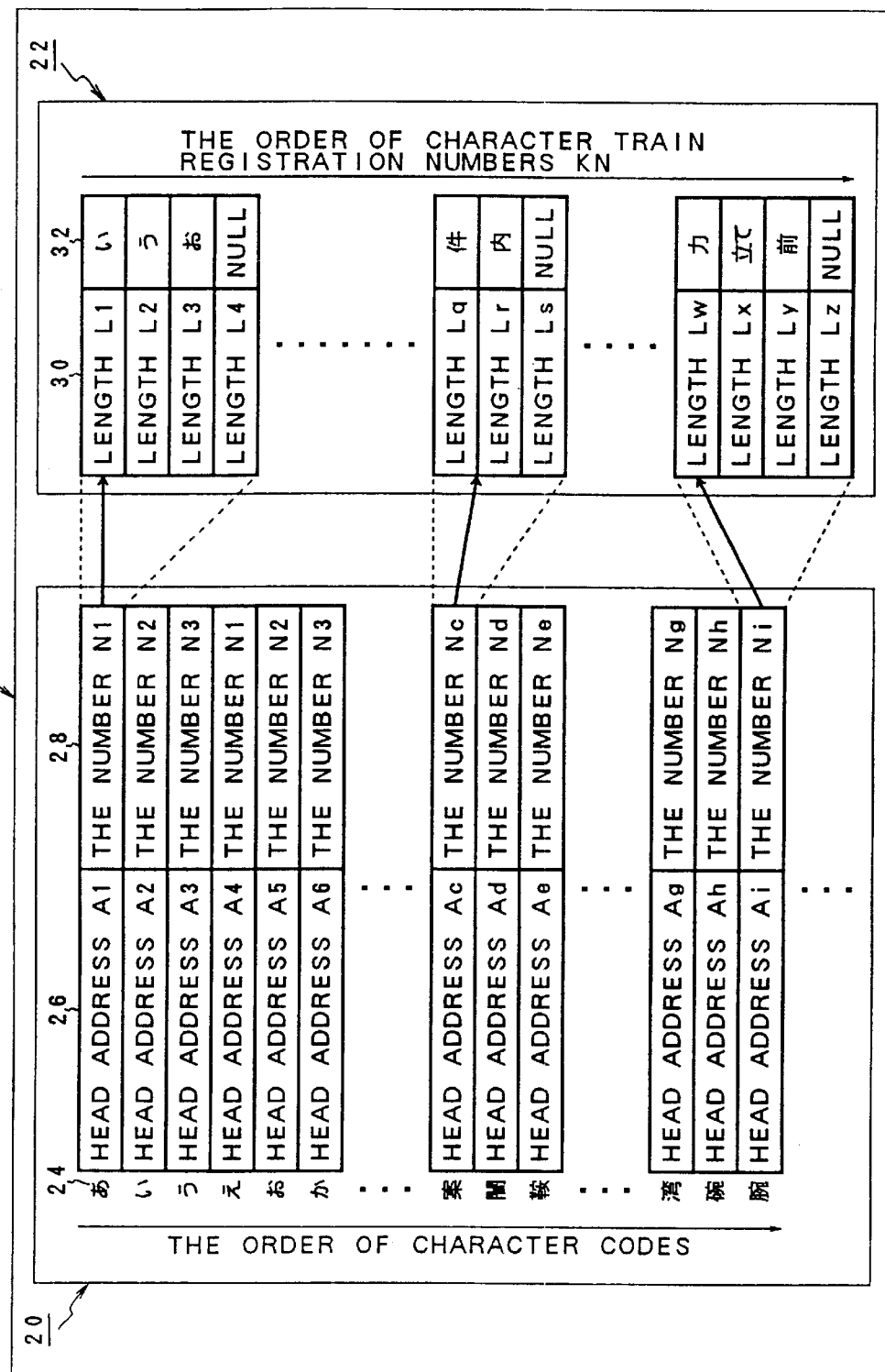

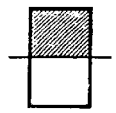
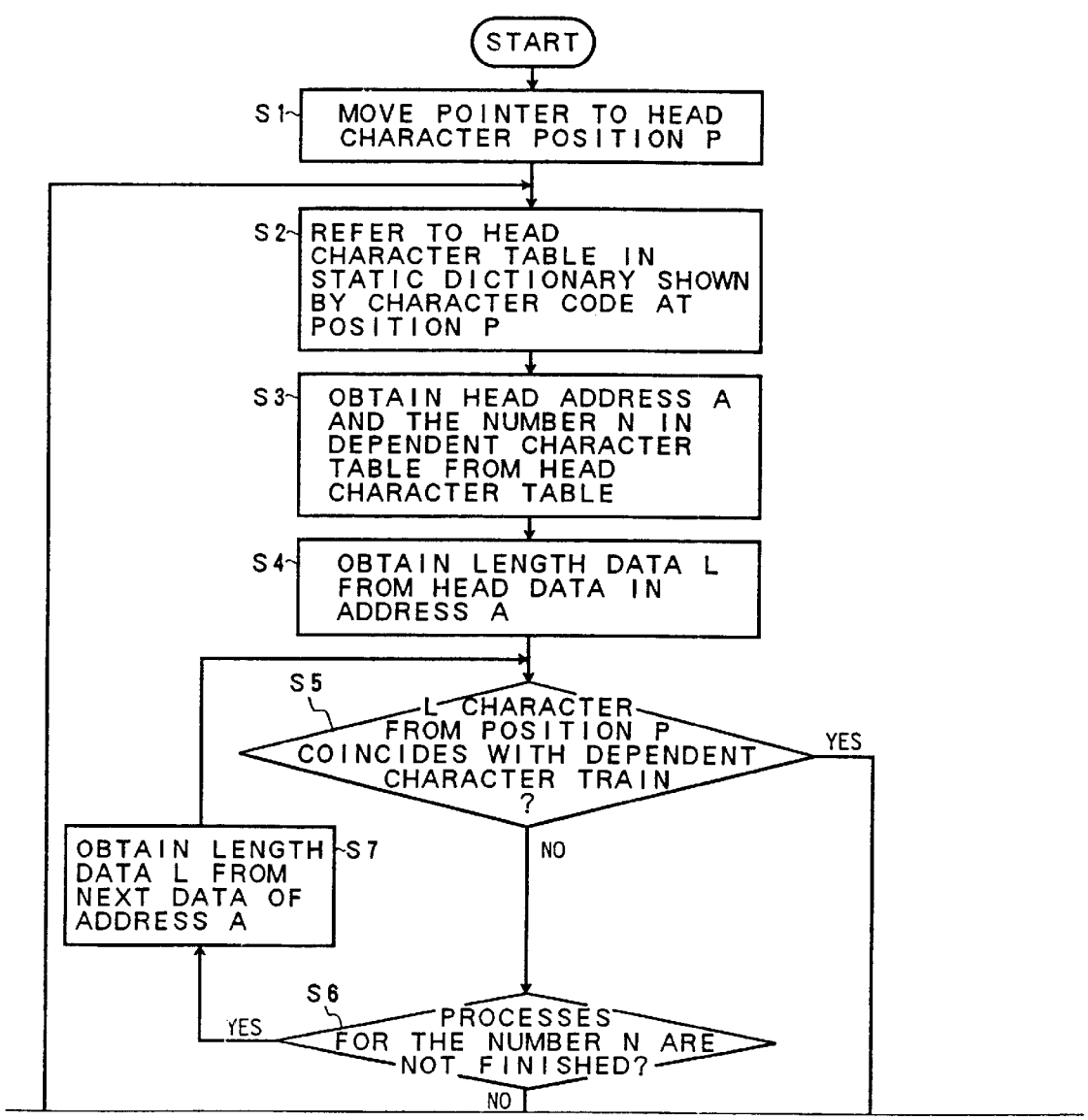
FIG. 8A

FIG. 12

| 60 | 61 | 62 | 63 |
|---|---|---|---|
| HEAD CHARACTER あ | LENGTH L1 | い | CHARACTER TRAIN CODE |
| HEAD CHARACTER す | LENGTH L99 | る | CHARACTER TRAIN CODE |

15

F I G. 1 4

| | 6,4 | 6,5 | 6,6 | 6,7 |
|---|---|---|---|---|
| HEAD CHARACTER | あ | LENGTH L1 | い | CHARACTER TRAIN CODE |
| HEAD CHARACTER | す | LENGTH L99 | る | CHARACTER TRAIN CODE |

45

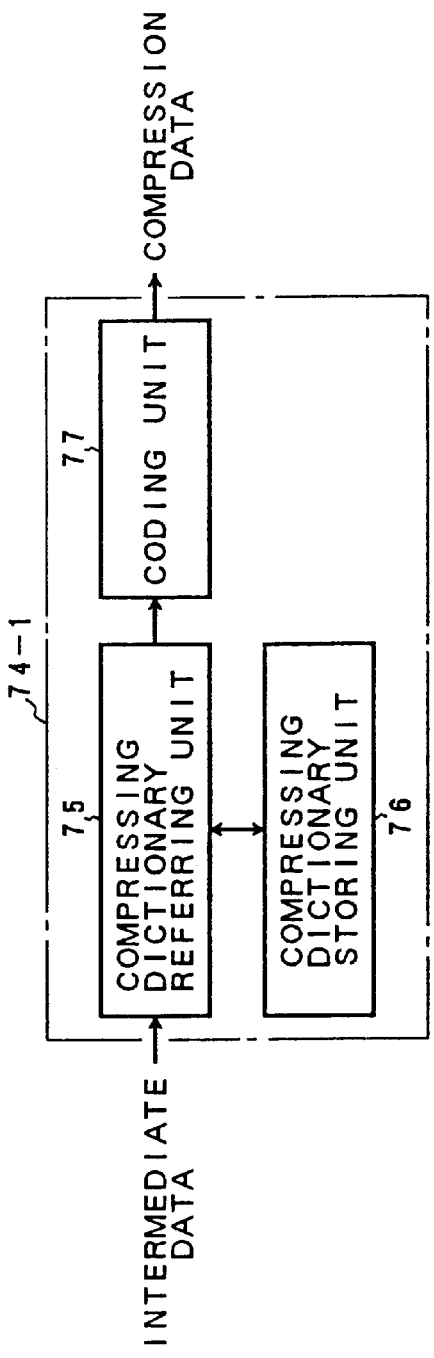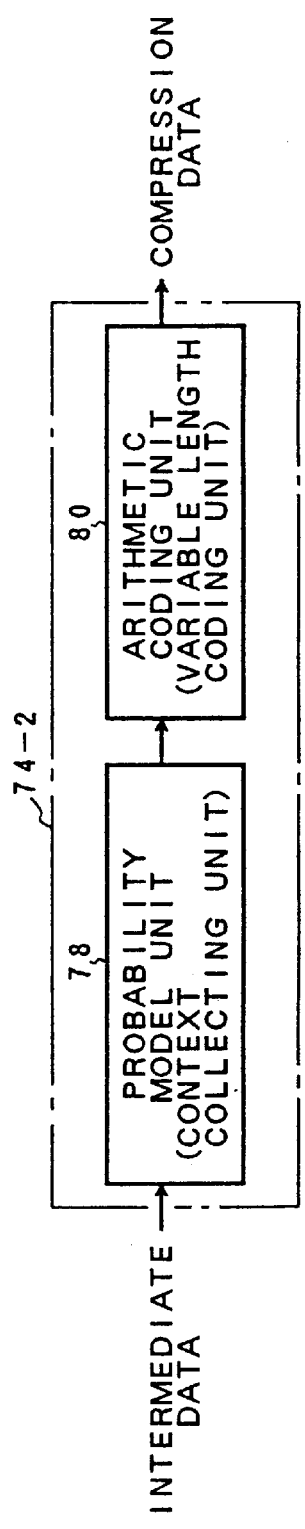

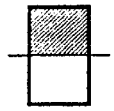
FIG. 18A
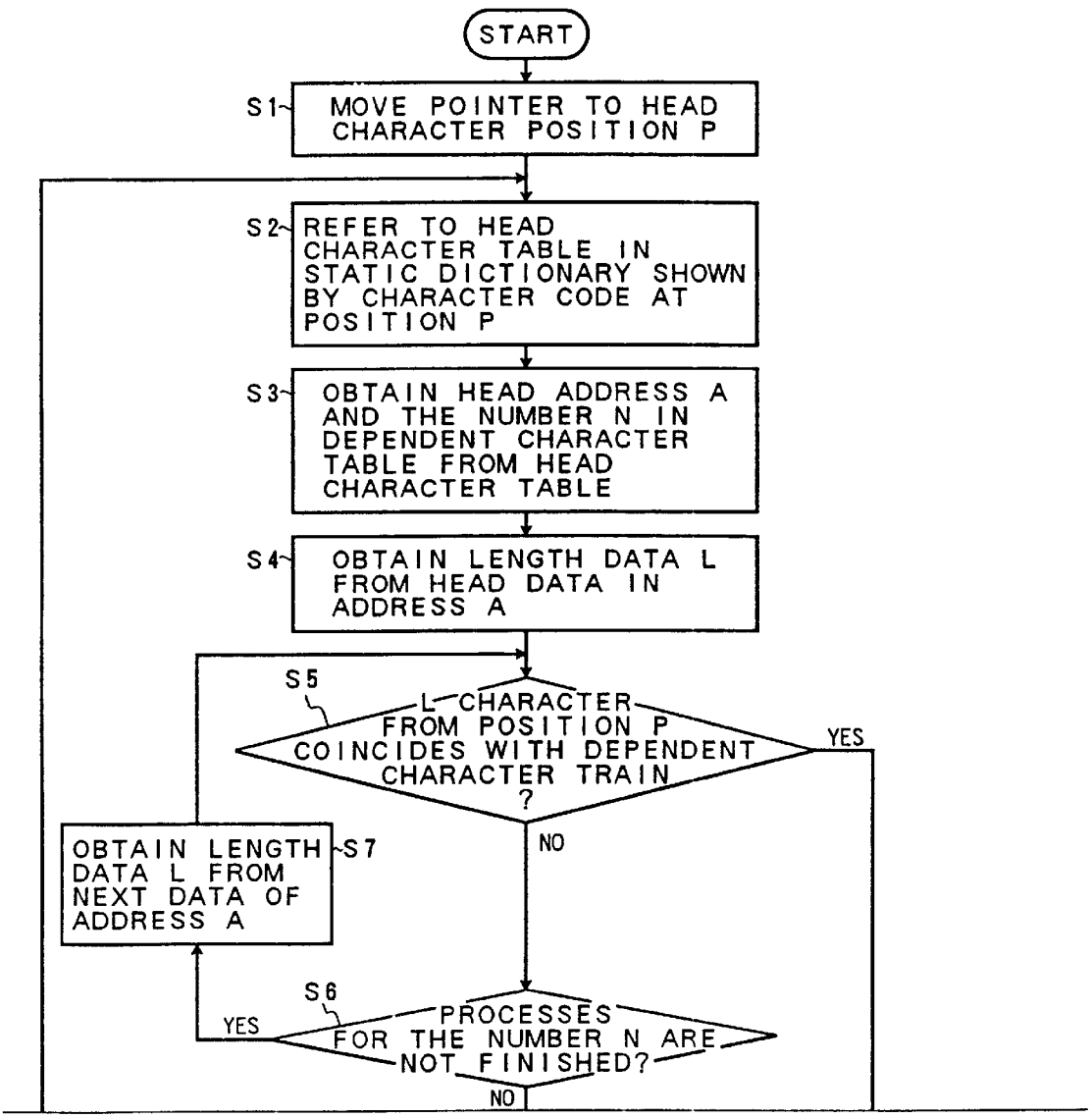

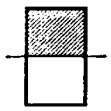
FIG. 19A
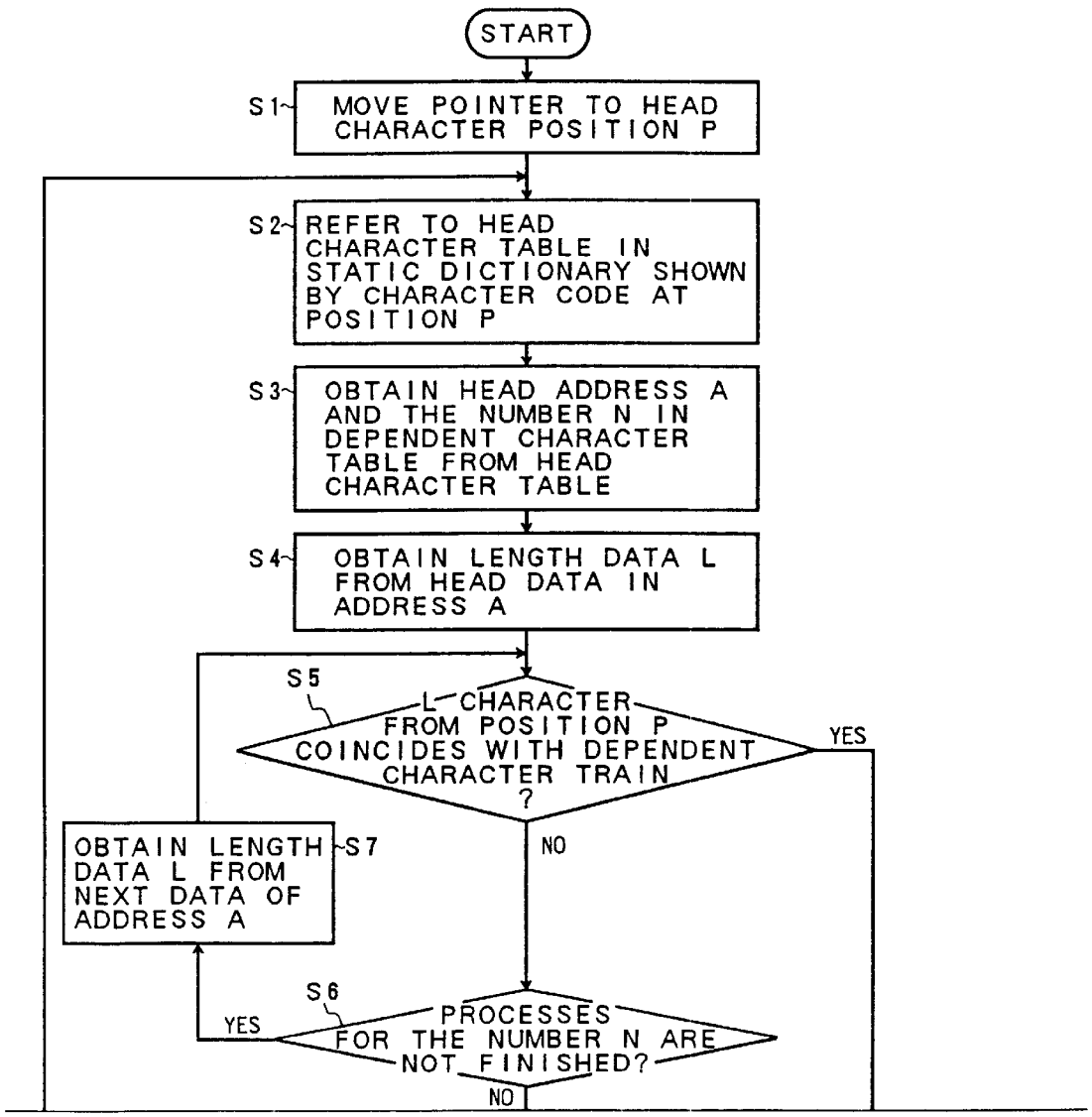

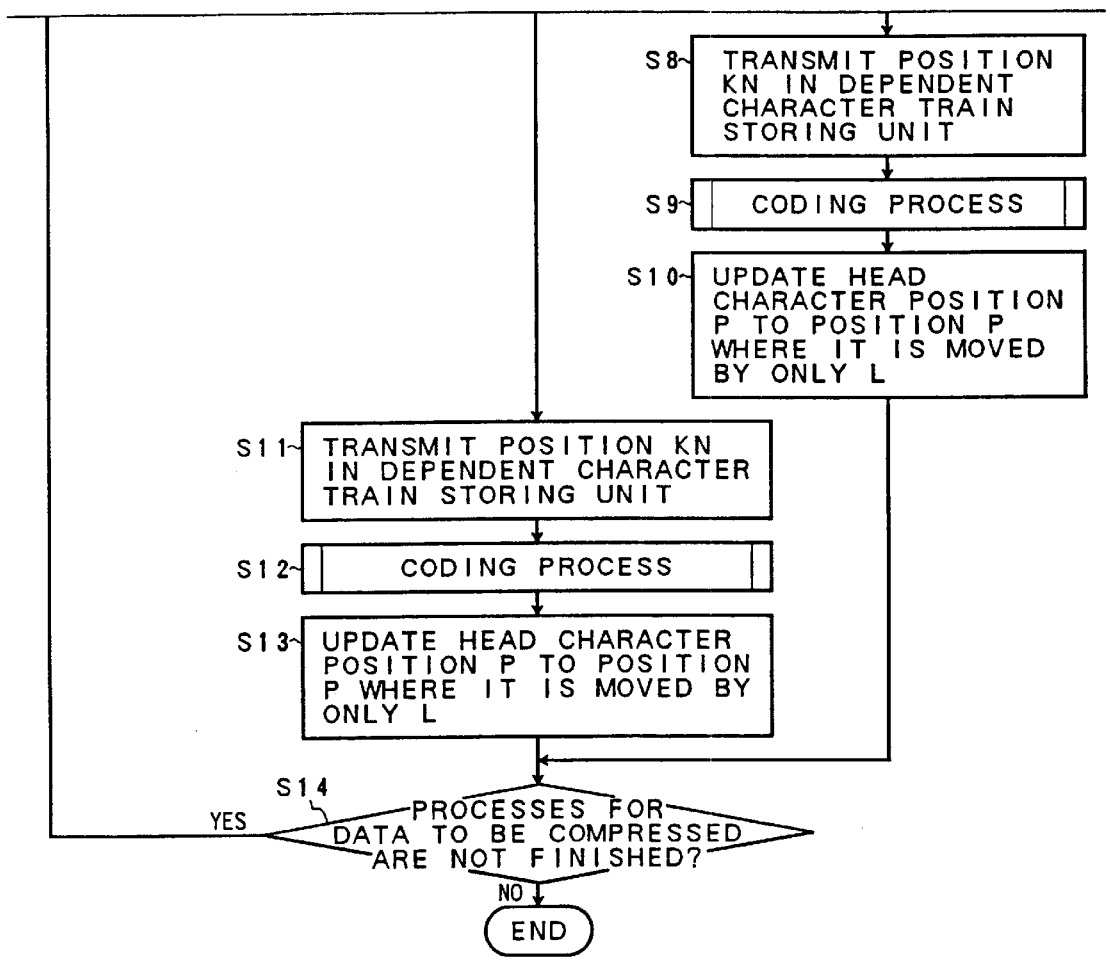

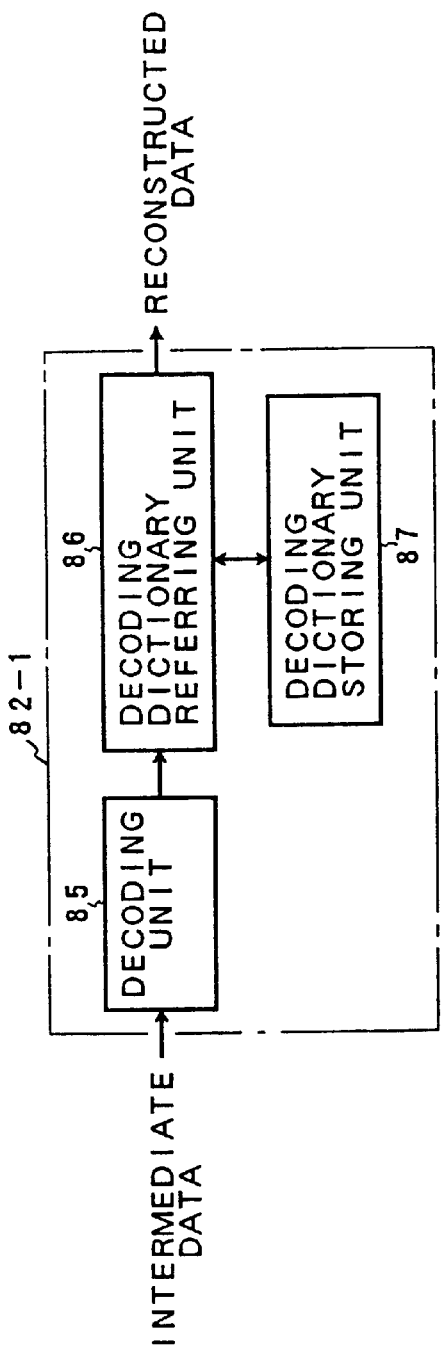
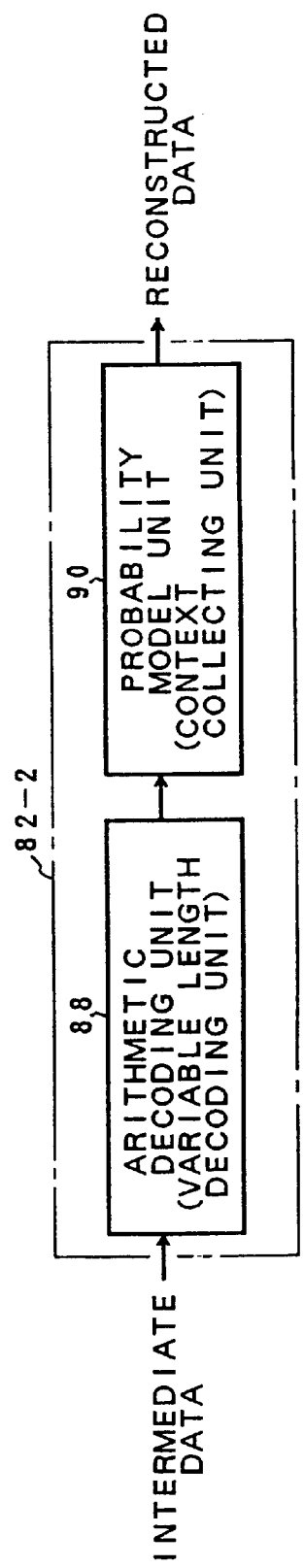

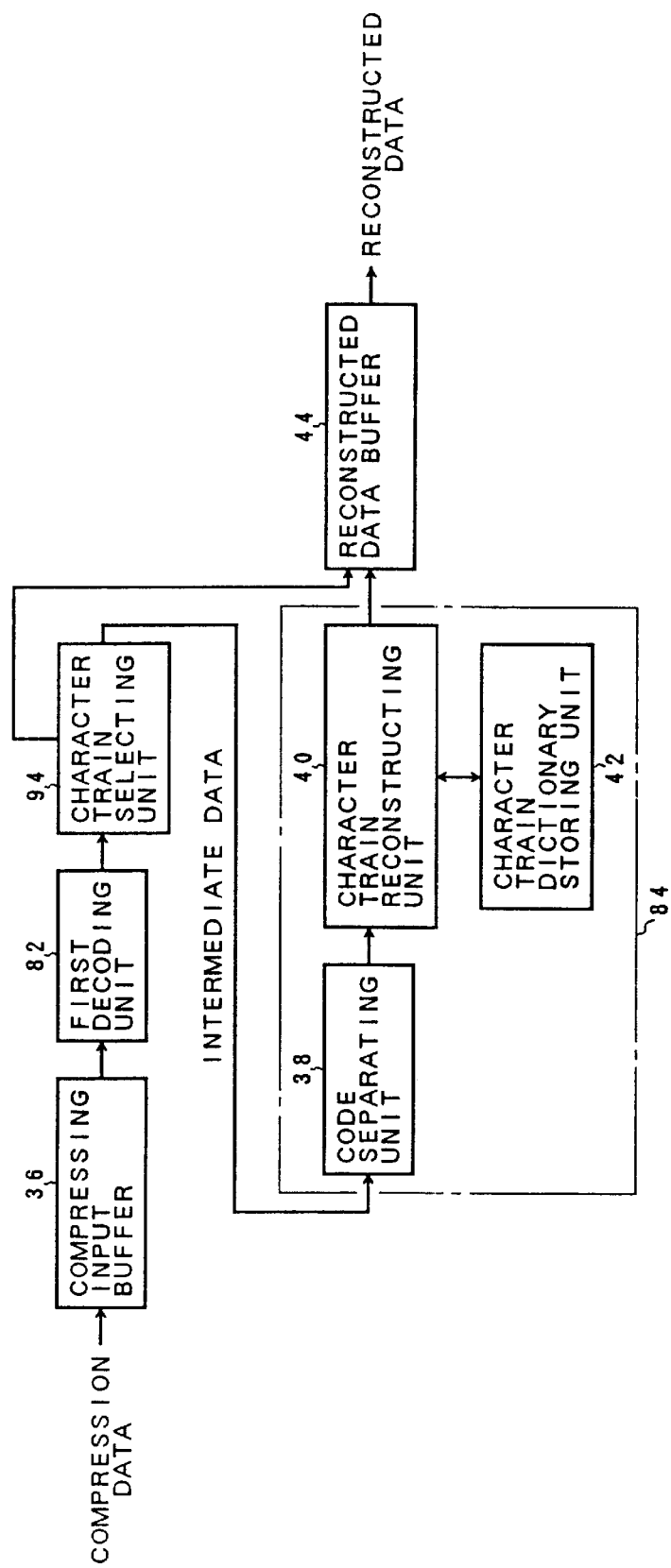
F I G. 24

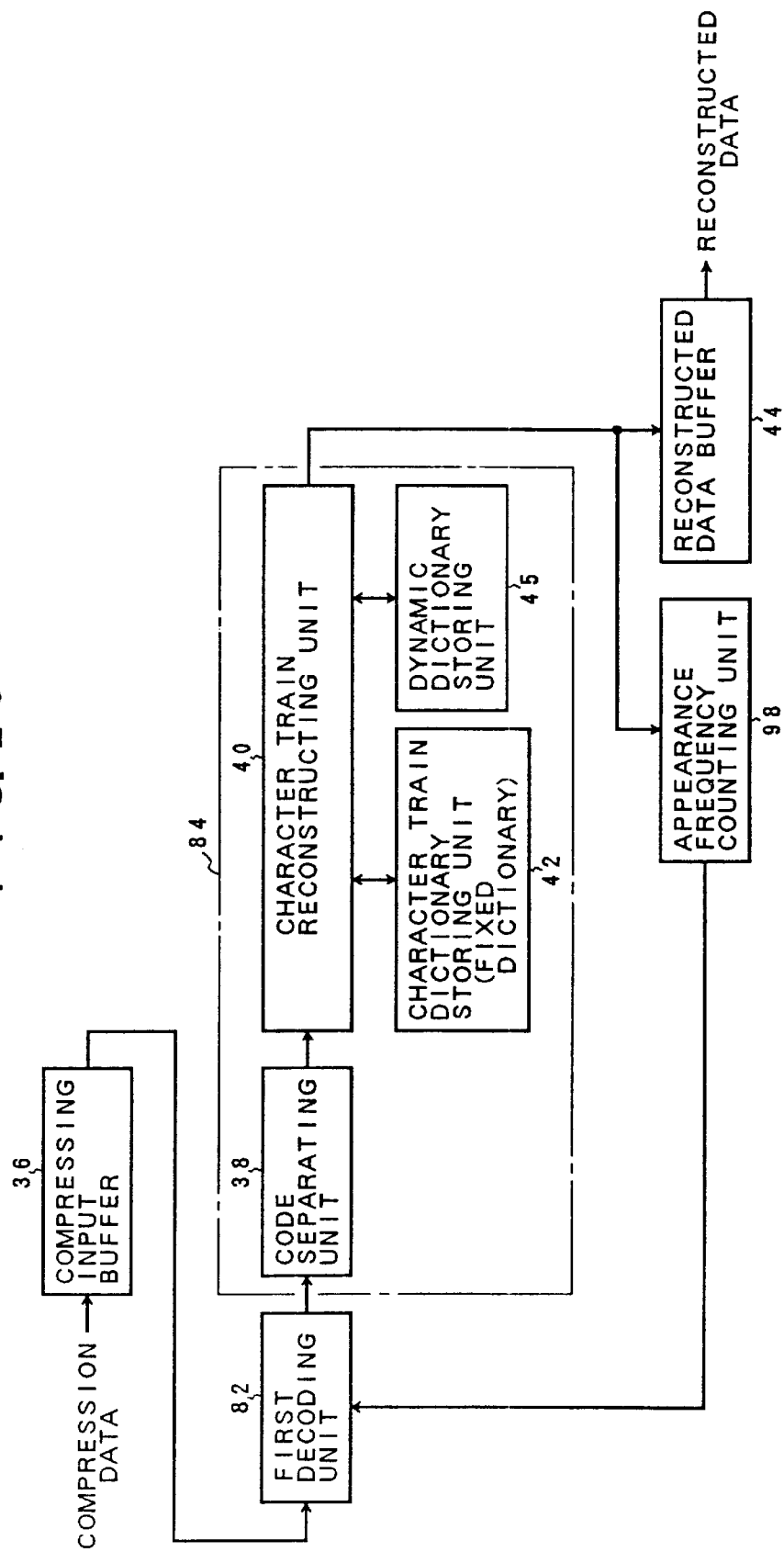

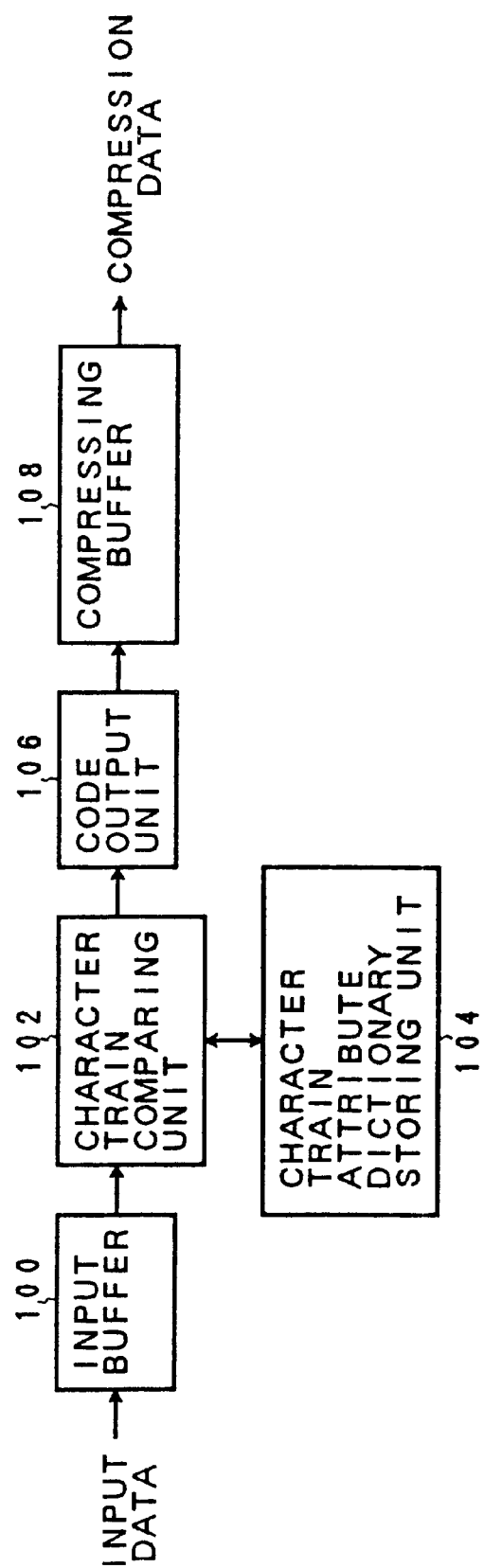

FIG. 28

| PART OF SPEECH CLASS | THE NUMBER OF WORDS | THE NUMBER OF ATTRIBUTE INFORMATION BITS | THE NUMBER OF WORD INFORMATION BITS | THE TOTAL NUMBER OF BITS |
|---|---|---|---|---|
| NOUN CLASS | 110,912 | 4 | 17 | 21 |
| VERB CLASS | 14,638 | 4 | 14 | 18 |
| ADJECTIVE CLASS | 1,204 | 4 | 10 | 14 |
| ADJECTIVE VERB CLASS | 3,796 | 4 | 12 | 16 |
| ADVERB CLASS | 2,934 | 4 | 8 | 12 |
| PARTICIPIAL ADJECTIVE CLASS | 247 | 4 | 8 | 12 |
| CONJUNCTION CLASS | 247 | 4 | 8 | 12 |
| PREFIX CLASS | 318 | 4 | 9 | 13 |
| SUFFIX CLASS | 1,330 | 4 | 11 | 15 |
| WORD' D ENDING CLASS | 155 | 4 | 8 | 12 |
| POST POSITIONAL WORD CLASS | 171 | 4 | 8 | 12 |
| AUXILIARY VERB CLASS | 203 | 4 | 8 | 12 |
| INTERJECTION CLASS | 105 | 4 | 7 | 11 |
| OTHERS | 226 | 4 | 8 | 12 |

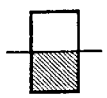
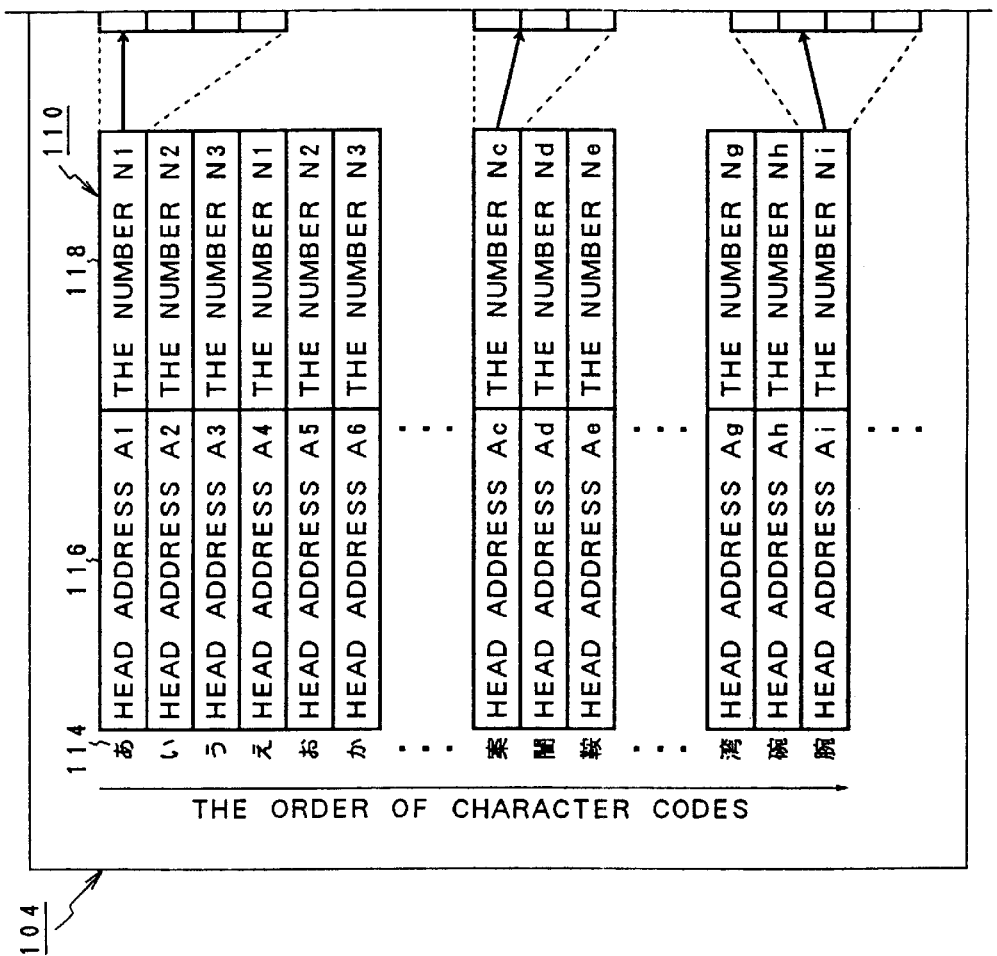
FIG. 29A

FIG. 29B

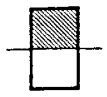

| | 120 | 122 | 124 | 126 112 |
|---|---|---|---|---|
| | LENGTH L1 | い | CHARACTER TRAIN CODE | ATTRIBUTE CODE |
| | LENGTH L2 | う | CHARACTER TRAIN CODE | ATTRIBUTE CODE |
| | LENGTH L3 | お | CHARACTER TRAIN CODE | ATTRIBUTE CODE |
| | LENGTH L4 | NULL | CHARACTER TRAIN CODE | ATTRIBUTE CODE |
| | LENGTH Lq | 牛 | CHARACTER TRAIN CODE | ATTRIBUTE CODE |
| | LENGTH Lr | 肉 | CHARACTER TRAIN CODE | ATTRIBUTE CODE |
| | LENGTH Ls | NULL | CHARACTER TRAIN CODE | ATTRIBUTE CODE |
| | LENGTH Lw | 力 | CHARACTER TRAIN CODE | ATTRIBUTE CODE |
| | LENGTH Lx | 立 | CHARACTER TRAIN CODE | ATTRIBUTE CODE |
| | LENGTH Ly | 前 | CHARACTER TRAIN CODE | ATTRIBUTE CODE |
| | LENGTH Lz | NULL | CHARACTER TRAIN CODE | ATTRIBUTE CODE |

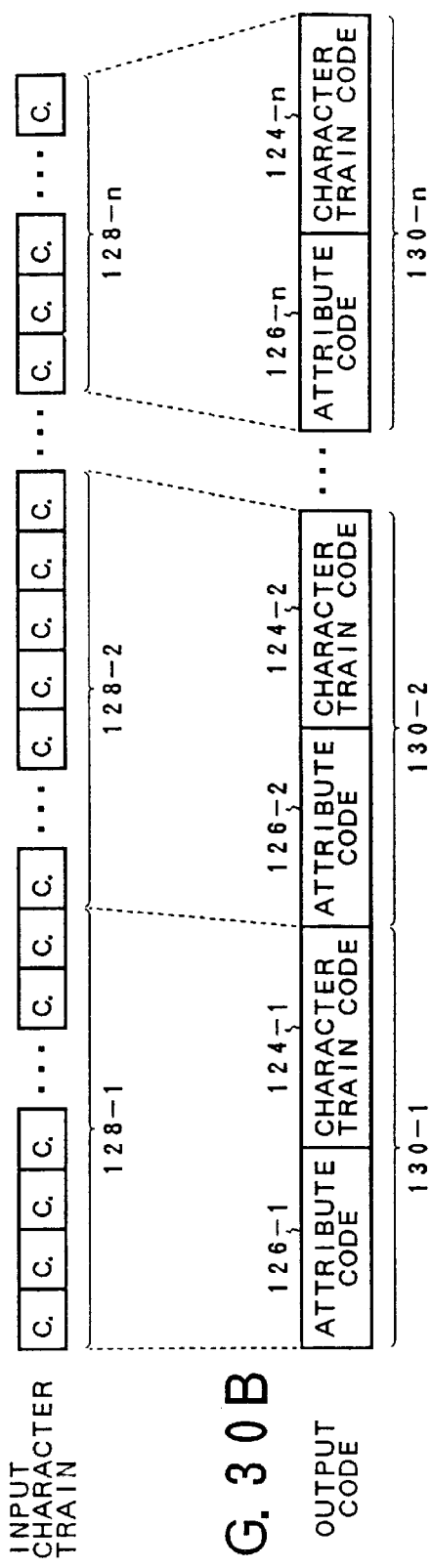

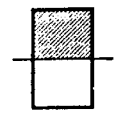
FIG. 31A
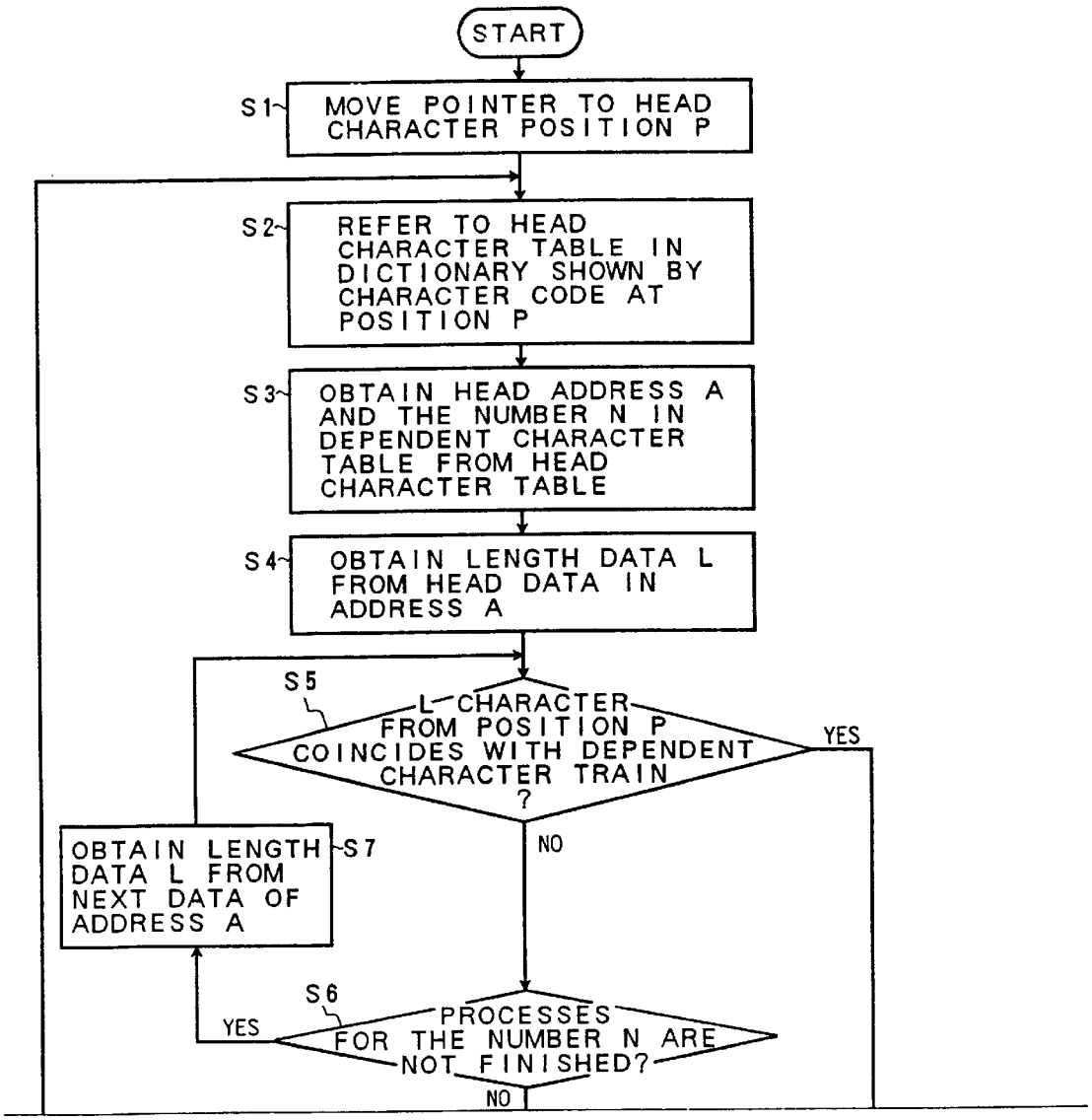

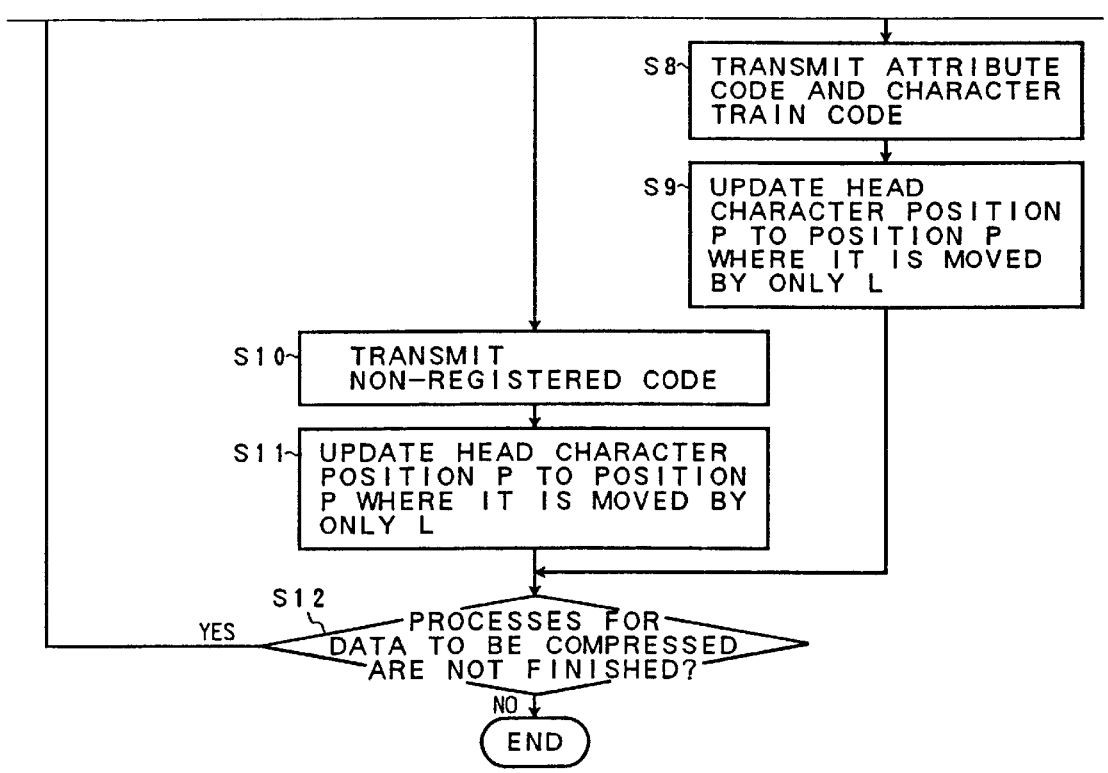

FIG. 32B

| ATTRIBUTE CODE (DICTIONARY NUMBER) DN | START ADDRESS AA OF DIVISION STORING UNIT |
|---|---|
| 1 | AA1 |
| 2 | AA2 |
| 3 | AA3 |
| 13 | AA13 |

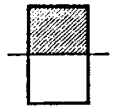
FIG. 33A
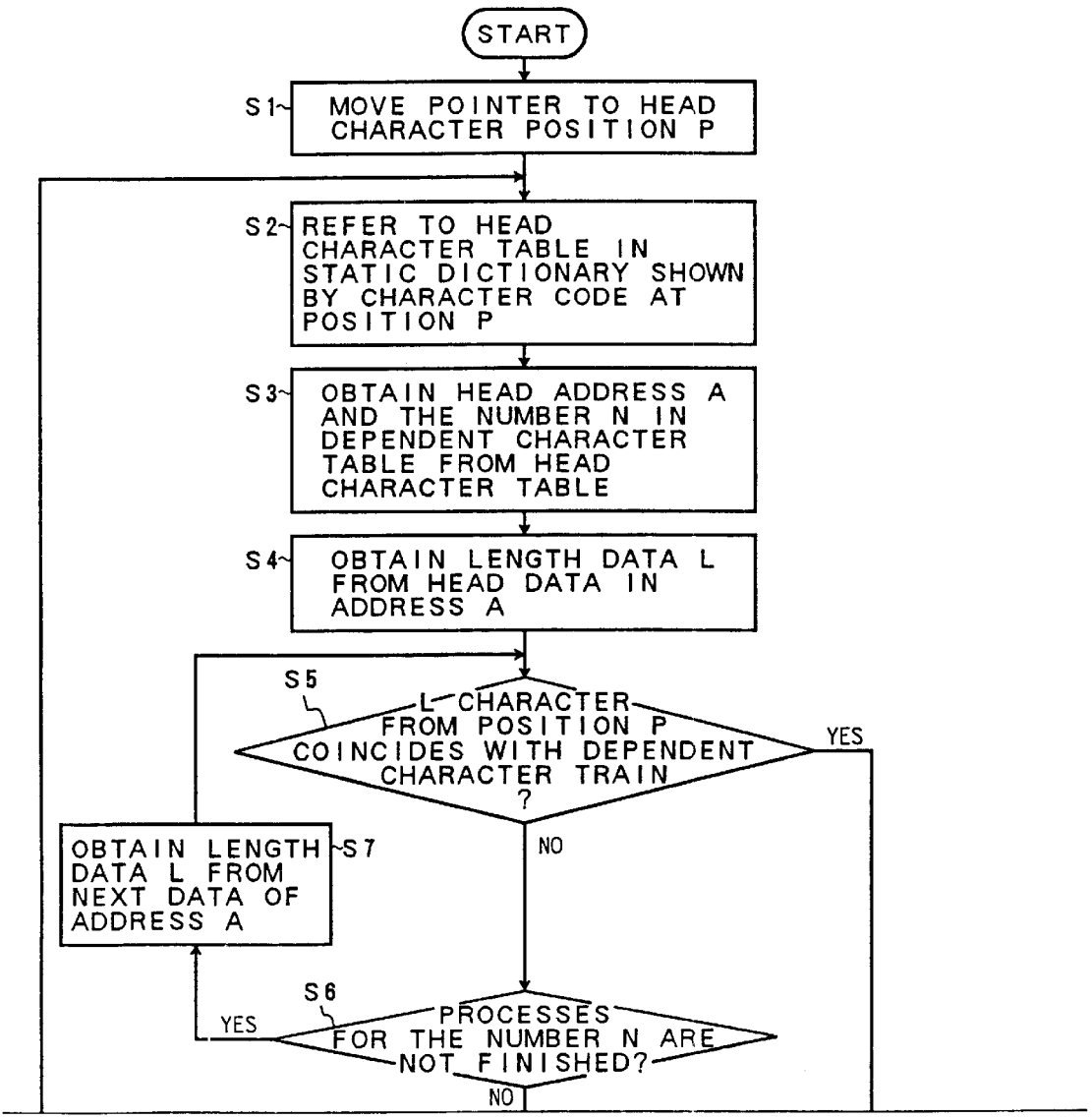

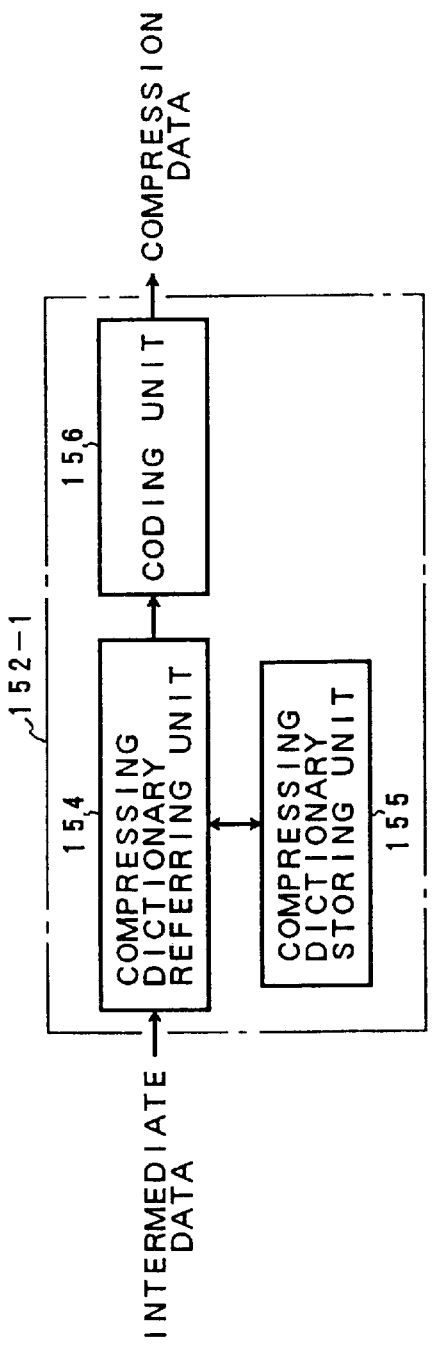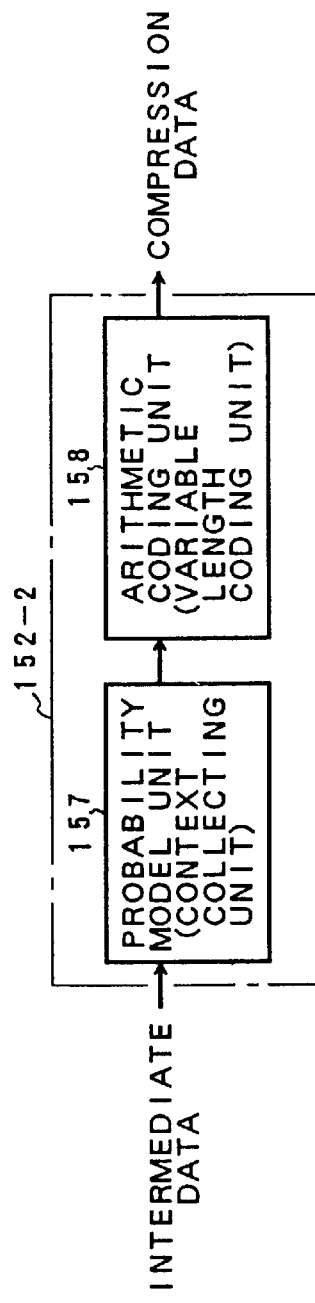

FIG.39A

| PART OF SPEECH CLASS | THE NUMBER OF WORDS | THE NUMBER OF ATTRIBUTE INFORMATION BITS | THE NUMBER OF WORD INFORMATION BITS |
|---|---|---|---|
| NOUN CLASS | 110,912 | 4 | 17 |
| VERB CLASS | 14,638 | 4 | 14 |
| ADJECTIVE CLASS | 1,204 | 4 | 10 |
| ADJECTIVE VERB CLASS | 3,796 | 4 | 12 |
| ADVERB CLASS | 2,934 | 4 | 8 |
| PARTICIPIAL ADJECTIVE CLASS | 247 | 4 | 8 |
| CONJUNCTION CLASS | 247 | 4 | 8 |
| PREFIX CLASS | 318 | 4 | 9 |
| SUFFIX CLASS | 1,330 | 4 | 11 |
| WORD'D ENDING CLASS | 155 | 4 | 8 |
| POST POSITIONAL WORD CLASS | 171 | 4 | 8 |
| AUXILIARY VERB CLASS | 203 | 4 | 8 |
| INTERJECTION CLASS | 105 | 4 | 7 |
| OTHERS | 226 | 4 | 8 |

| THE NUMBER OF DUMMY BITS | THE TOTAL NUMBER OF BITS | THE NUMBER OF BYTES |
|---|---|---|
| 3 | 24 | 3 |
| 6 | 24 | 3 |
| 2 | 16 | 2 |
| 0 | 16 | 2 |
| 4 | 16 | 2 |
| 4 | 16 | 2 |
| 3 | 16 | 2 |
| 1 | 16 | 2 |
| 4 | 16 | 2 |
| 4 | 16 | 2 |
| 4 | 16 | 2 |
| 5 | 16 | 2 |
| 4 | 16 | 2 |

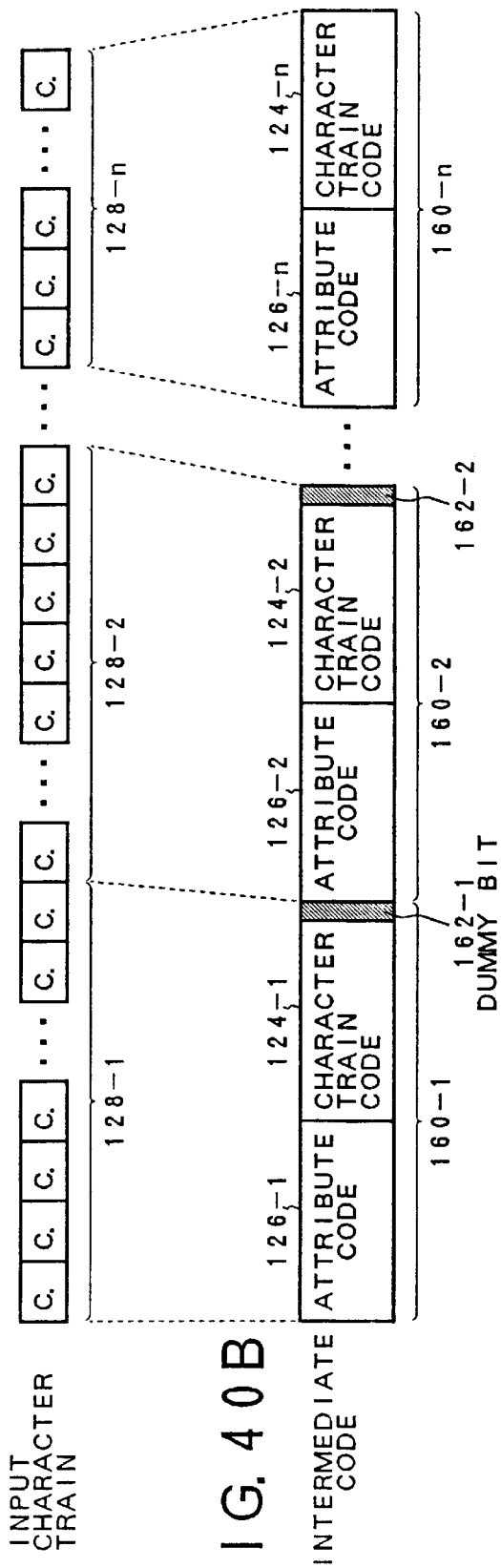

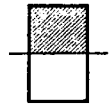
FIG. 41A
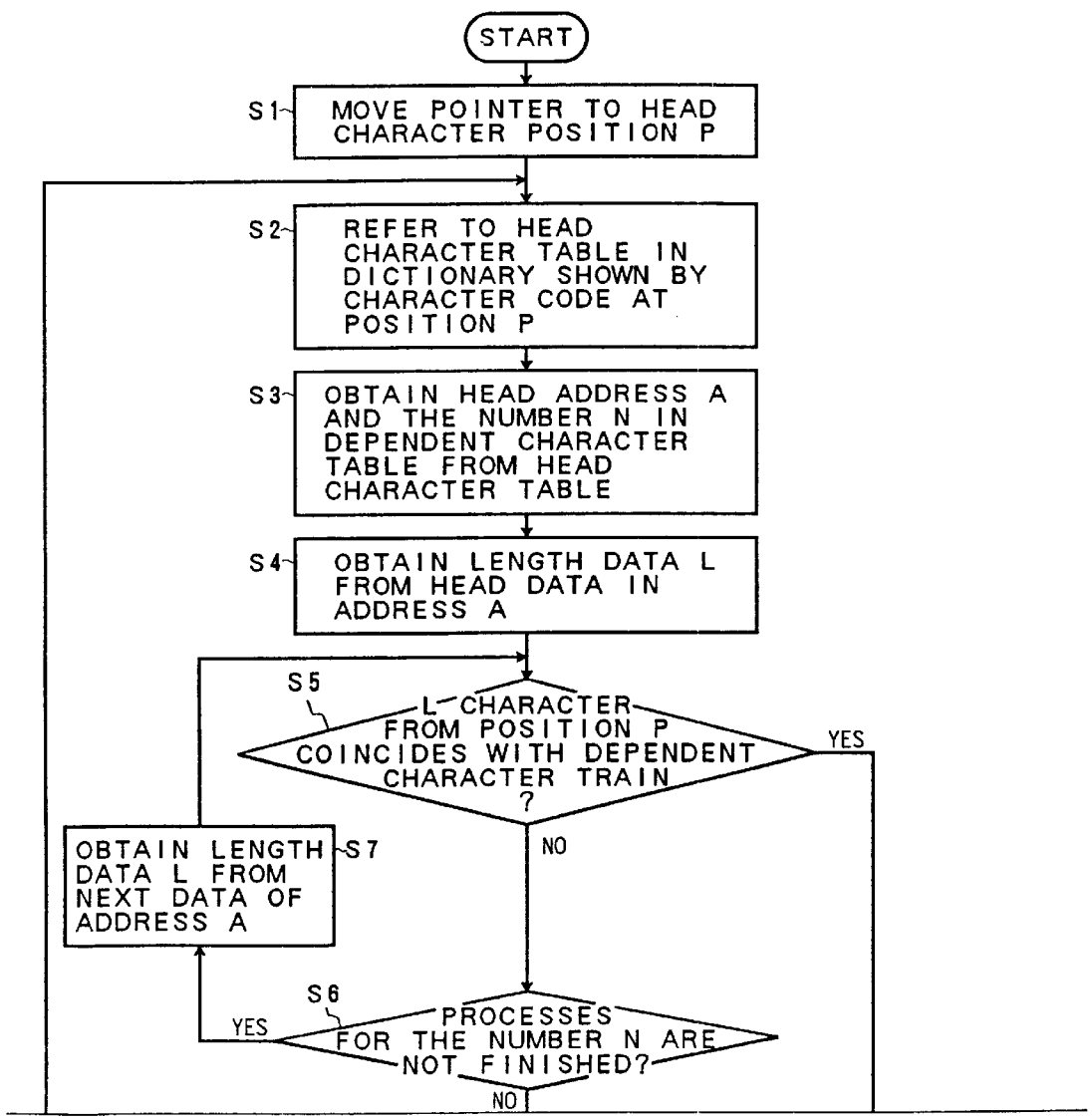

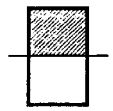
FIG. 42A
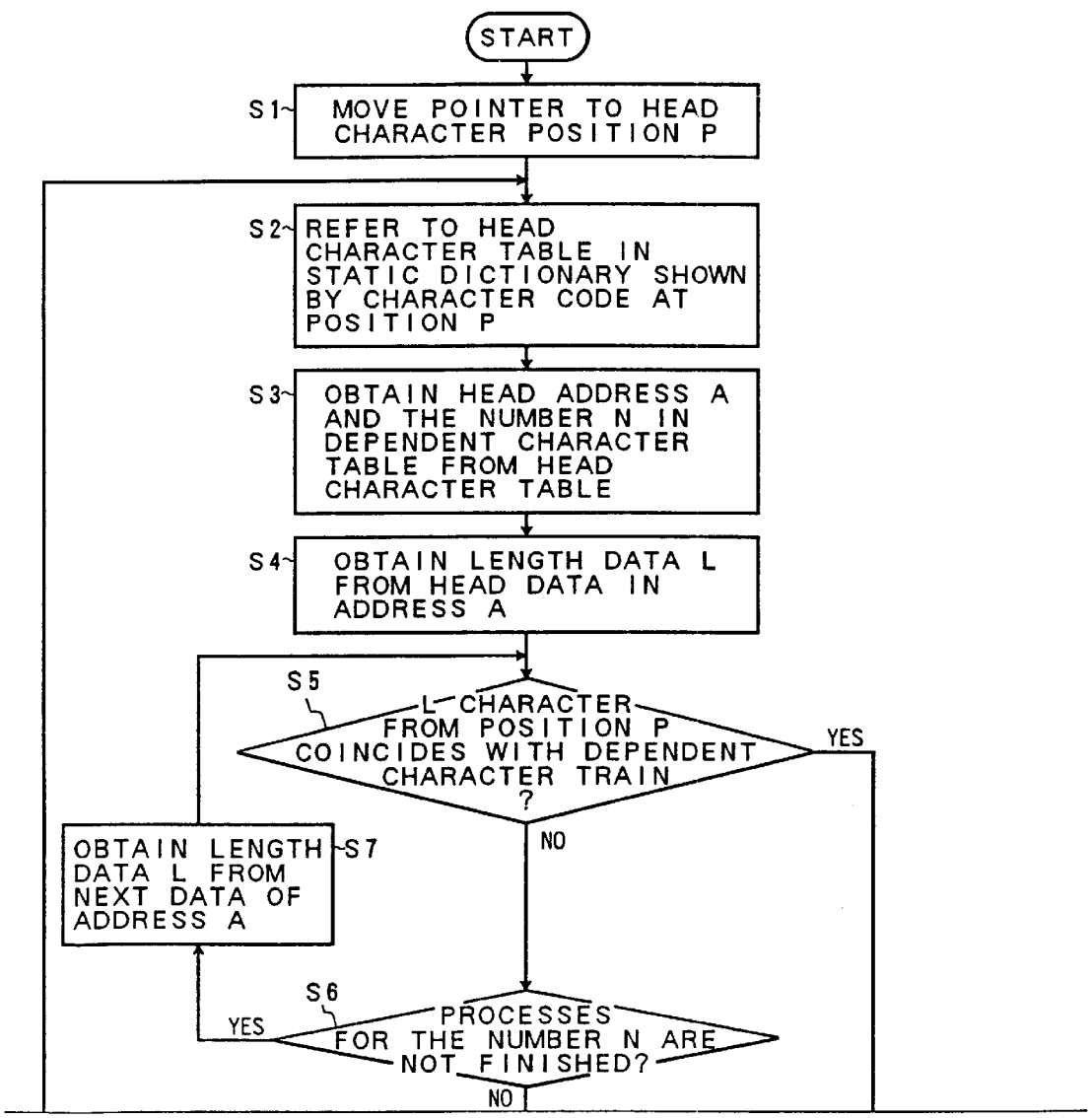

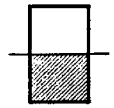
FIG. 42B
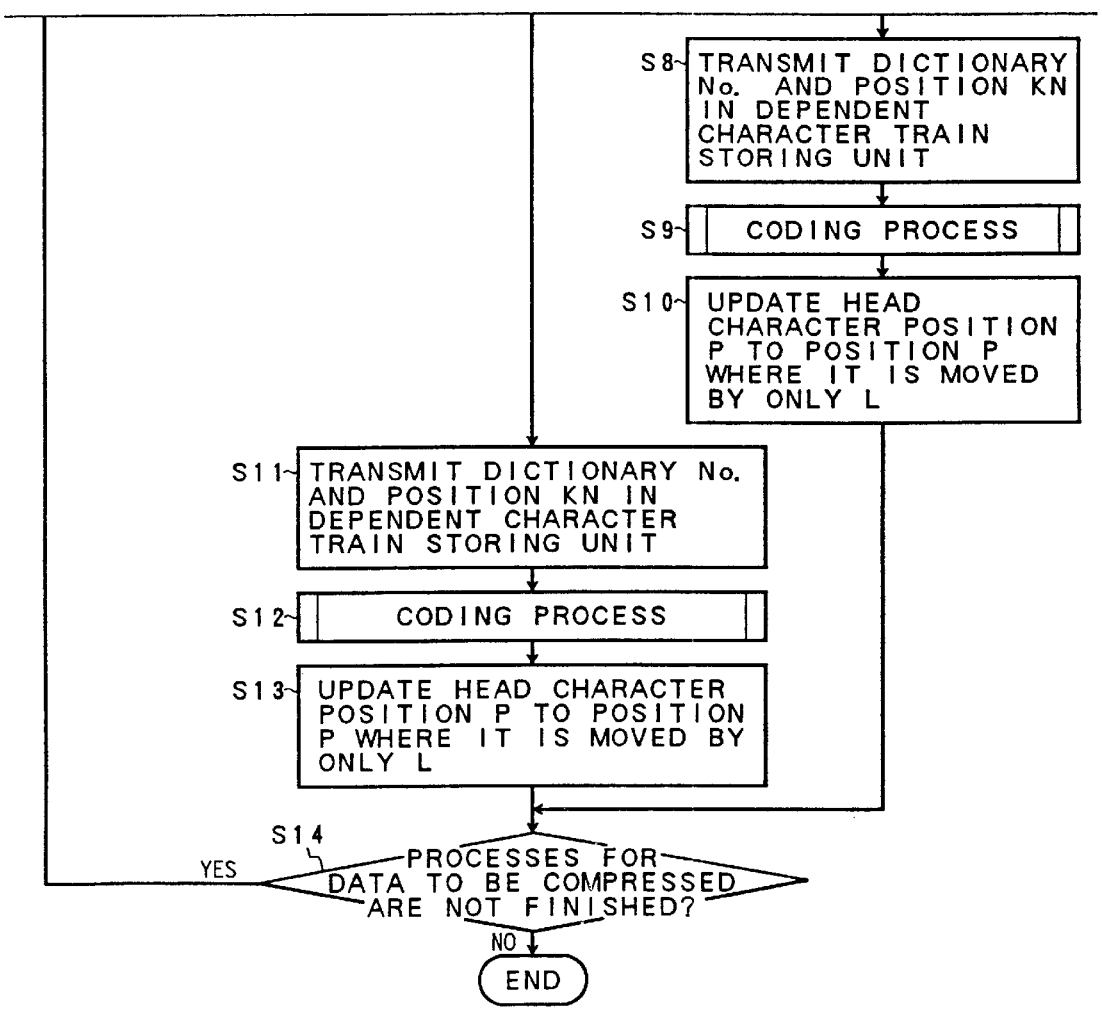

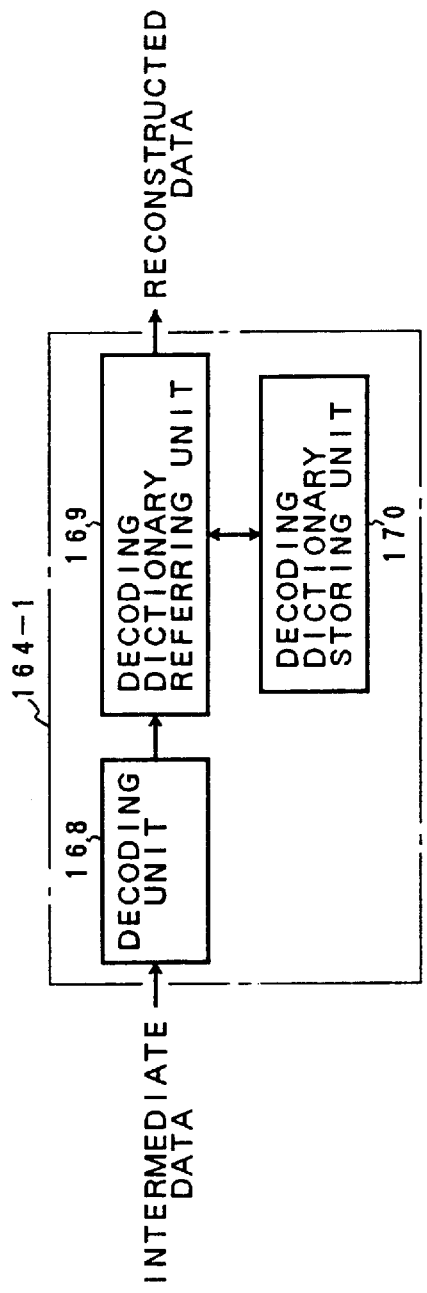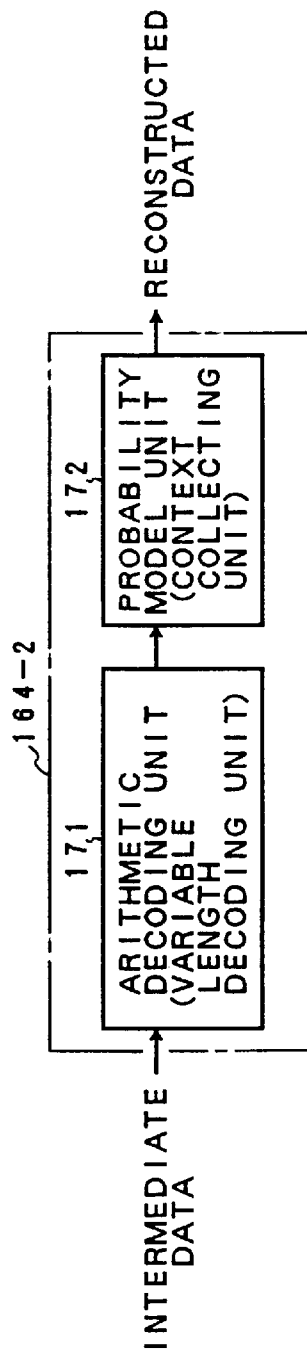

DATA COMPRESSING APPARATUS, RECONSTRUCTING APPARATUS, AND ITS METHOD

CROSS-REFERENCE TO RELATED APPLICATIONS

This application is a divisional of application Ser. No. 09/099,421, filed Jun. 18, 1998 now allowed U.S. Pat. No. 6,542,640.

This application is based upon and claims priority of Japanese patent application no. 10/010,076, filed Jan. 22, 1998, and U.S. patent application Ser. No. 09/099,421, filed Jun. 18, 1998, the contents being incorporated herein by reference.

BACKGROUND OF THE INVENTION

The present invention relates to data compressing apparatus, reconstructing apparatus, and its method for compressing and reconstructing document data. More particularly, the invention relates to data compressing apparatus, reconstructing apparatus, and its method for compressing and reconstructing document data formed by character codes of a language such as Japanese, Chinese, Hangul, or the like having a word structure which is not separated by spaces.

In recent years, various data such as character codes, image data, and the like is dealt in a computer. Further, in association with the spread of the internet and intranet, the number of mails and electronized documents is increasing. In such a large amount of data, by compressing the data by omitting redundant portions in the data, a storage capacity can be reduced or the compressed data can be sent to a remote place in a short time. The field of the invention is note limited to the compression of character codes but can be applied to various data. The denominations which are used in the information theory are adopted, one word unit of data is called a character, and data in which an arbitrary plurality of words are connected is called a character train hereinbelow.

As data compression, there are a dictionary type coding using similarity of a data series and a probability statistic type coding using appearance frequency of only data. The dictionary type coding is a method whereby a character train is replaced to a registration number of a dictionary and a character train is registered in a manner such that as the appearance frequency of the character train is higher, the longer the character train is registered in the dictionary, thereby obtaining a high compression ratio. As a typical method of the dictionary type coding, there are LZ77 and LZ78 (for example, refer to Tomohiko Uematsu, "Document data compression algorithm handbook", CQ publisher). According to LZ77, a buffer of a predetermined amount is provided and a position and a length of a character train of the longest line which coincides in the buffer are encoded. On the other hand, according to LZ78, a character train appeared in the past is registered in a dictionary and a registration number is encoded. The probability statistic type coding algorithm is a method of obtaining a high compression ratio by allocating a short code length to a character having a high appearance frequency in accordance with a statistic appearance frequency of each character. As a typical probability statistic type coding, there are an arithmetic coding (for example, refer to Ian H. Witten et al., "Arithmetic Coding for Data Compression", Commun. of ACM, Vol. 130, No. 6, pp. 520 to 540) and a Huffman coding (for example, refer to Donald E. Knuth, "Dynamic Huffman Coding", Journal of Algorithms, Vol. 6, pp. 163–180).

In order to obtain a further compression effect, a coding using a context collecting unit 200 and a variable length coding unit 202 in FIG. 1 for variable length coding on the basis of, not an appearance probability of each character, but a conditional appearance probability in which a context expressing a dependence relation between an input character and a character just before the input character is taken has been proposed. The method whereby the variable length coding is performed by using the conditional probability in which the context is taken is called a context model. The context and a coding target character are expressed by a tree structure of FIG. 2B when input characters of three characters of a, b, and c in FIG. 2A are used as an example. The tree structure is called a context tree and the number of times of appearance is counted at each node each time the character train which passes the character of each node appears, thereby obtaining the conditional probability.

There are three kinds of LZ78 systems and probability statistic type codings irrespective of an actual appearance frequency of a non-compression data train.

I. a static coding for dividing in accordance with a preset appearance frequency;
  II. a semi-adaptive coding for dividing in accordance with an appearance frequency obtained by first scanning all of character trains; and
  III. an adaptive coding for recalculating a frequency each time a character appears and dividing in accordance with the recalculated appearance frequency.

In a compression which doesn't restrict the kind of non-compression data train, the semi-adaptive coding or the adaptive coding is used.

According to the conventional semi-adaptive coding and adaptive coding, when large data of about a few Mbytes is compressed, since a code adapted to the non-compression data train can be allocated, a high compression ratio can be obtained. In case of compressing small data of about a few kbytes, however, since every character train appears only about a few times, a code adaptive to a statistic appearance frequency cannot be allocated, so that a high compression ratio cannot be obtained by the semi-adaptive coding and the adaptive coding. On the other hand, in the static coding for dividing in accordance with the preset appearance frequency, although a constant compression ratio can be obtained irrespective of a data size, since the number of preset codes is fixed to one, there is a problem that a high compression ratio cannot be obtained with respect to data having a statistic amount different from the prepared code. Especially, when small data of about a few kbytes of document data of a language such as Japanese, Chinese, Hangul, or the like in which one character is expressed by word data of two bytes is compressed, a compression effect can be hardly expected by the conventional codings. There is also a case where the data amount after compression increases depending on a document. Further, the conventional codings have a problem that since a process is executed on a byte unit basis, the process is complicated and it is difficult to realize a high processing speed.

SUMMARY OF THE INVENTION

According to the invention, there are provided data compressing apparatus, reconstructing apparatus, and its method which can compress and reconstruct even data of a small kbyte order at a high speed while holding a high compression ratio.

(First Embodiment)

A target of the invention is a data compressing apparatus for compressing non-compression data formed by character codes of a language having a word structure which is not separated by spaces. As a language having the word structure which is not separated by spaces, for example, there are Japanese, Chinese, Hangul, and the like. Such a data compressing apparatus (basic apparatus) is characterized by comprising: a character train dictionary storing unit for storing a dictionary in which character trains each serving as a processing unit at the time of compression have been registered; a character train comparing unit for detecting the partial character train which coincides with the registration character train by comparing the registration character train in the character train dictionary storing unit with a partial character train in the non-compression data; and a code output unit for allocating a predetermined character train code every partial character train in which the coincidence has been detected by the character train comparing unit and outputting.

When considering Japanese as an example, there is a study result of Japan Electronic Dictionary Research Institute (EDR) Co., Ltd. regarding Japanese words (Yokoi, Kimura, Koizumi, and Miyoshi, "Information structure of electronic dictionary at surface layer level", the papers of Information Processing Society of Japan, Vol. 37, No. 3, pp. 333–344, 1996). In the study result, morphemes constructing Japanese, that is, parts of speech of words are added up. When words are simply classified into parts of speech class and the parts of speech class are registered, the number of parts of speech class is equal to 136,486 and they can be expressed by codes of 17 bits (maximum 262,143). The number of characters constructed every word of about 130,000 words constructing a Japanese word dictionary formed by Institute for New Generation Computer Technology (ICOT) is detected and a distribution of the words is obtained. Consequently, it has been found that each of the 70,000 words whose number is more than the half of all of the registered words is constructed by two characters and that the average number of characters is equal to 2.8 characters (44.8 bits).

In the data compressing apparatus of the invention, a dictionary in which a character train code of a fixed length of, for example, 17 bits is allocated to each word of, for example, about 130,000 words which is practical as a dictionary of Japanese is formed and stored in the character train dictionary storing unit, a registration character train in the dictionary which coincides with the partial character train of the non-compression data is retrieved and the fixed length code of 17 bits is allocated and outputted as a character train code, thereby enabling the data amount to be substantially compressed to ½ or less irrespective of the size of document data. The character train dictionary storing unit comprises: a head character storing unit in which a head character of the partial character train to be compressed has been stored; and a dependent character train storing unit in which a dependent character train that is dependent on the head character stored in the head character storing unit has been stored. The head character storing unit stores a head address and the number of dependent character trains in the dependent character train storing unit while using the head character as an index. The dependent character train storing unit stores the length of dependent character train, the dependent character train, and the character train code as a set at one or a plurality of storing positions (corresponding to the number of dependent character trains) which are designated by the head address in the head character storing unit. The character train comparing unit obtains the length of dependent character train from the dependent character train storing unit by referring to the head character storing unit in the character train dictionary storing unit by the head character in the non-compression data which is being processed at present, extracts the partial character train of the length of dependent character train subsequent to the head character from the non-compression data, and detects coincidence between the partial character train and the registered dependent character train. When a detection result indicative of the coincidence with the registration character train is received from the character train comparing unit, the code output unit allocates the character train code stored in the dependent character train storing unit to the character train in which the coincidence was detected and outputs. By divisionally storing the character train dictionary in two layers as mentioned above, the dictionary size can be reduced and the retrieving speed can be raised. The head character storing unit stores the head address and the number of dependent character trains of the dependent character train storing unit while using the head character as an index. The dependent character train storing unit stores the length of dependent character train and the dependent character train as a set at one or a plurality of storing positions (corresponding to the number of dependent character trains) which are designated by the head address in the head character storing unit. Since the character train code is not stored in the dependent character train storing unit in the double-layer structure of the character train dictionary, the dictionary size can be reduced by such an amount. In this case, the character train comparing unit obtains the length of dependent character train from the dependent character train storing unit by referring to the head character storing unit in the character train dictionary storing unit by a head character in the non-compression data which is being processed at present by extracting the partial character train of the length of dependent character train subsequent to the head character from the non-compression data and detects a coincidence with the dependent character train which has been registered. When a detection result indicative of the coincidence with the registration character train is received from the character train comparing unit, the code output unit allocates and outputs a character train registration number indicative of the storing position in the dependent character train storing unit as a character train code.

A data reconstructing apparatus (basic apparatus) for reconstructing such compression data is characterized by comprising: a code separating unit for separating the character train code serving as a reconstruction unit from the compression data; a character train dictionary storing unit for storing a dictionary in which a reconstruction character train corresponding to the character train code serving as a processing unit upon reconstruction has been registered; and a character train reconstructing unit for reconstructing an original character train by referring to the character train dictionary storing unit by the character train code separated by the code separating unit. The character train dictionary storing unit stores a head character, the length of dependent character train, and the dependent character train as a set every character train code as a reconstruction target. The character train reconstructing unit recognizes a storing position in the character train dictionary storing unit on the basis of the character train code which is being processed at present and reconstructs the character train. The character train dictionary storing unit is constructed by: a head character storing unit in which a head character of the partial character train to be compressed has been stored; and a dependent character train storing unit in which a dependent character train dependent on the head character stored in the head character storing unit has been stored. The head character storing unit stores a head address and the number of dependent character trains of the dependent character train storing unit while using the head character as an index. The dependent character train storing unit stores a return address to the head character storing unit, a length of dependent character train, and the dependent character train as a set at a storing position designated by the head address of the head character storing unit. The double-layer dictionary structure can be commonly used by both of the data compressing apparatus and the data reconstructing apparatus. The character train reconstructing unit in the data reconstructing apparatus reconstructs the dependent character train by referring to the dependent character train storing unit on the basis of the character train code which is being processed at present and also reconstructs the head character with reference to the head character storing unit by obtaining the return address.

In another embodiment of the invention, a double coding for again coding by further performing the existing coding by using the compressed character train code as an intermediate code is executed. That is, in a data compressing apparatus (modified apparatus) for compressing non-compression data formed by character codes of a language having a word structure which is not separated by spaces, a coding is performed by a first coding unit in a manner such that a registration character train which has been registered in a dictionary and serves as a processing unit at the time of compression is compared with a partial character train in the non-compression data, thereby detecting the partial character train which coincides with the registration character train, and a predetermined character train code is allocated and outputted as an intermediate code every partial character train in which the coincidence was detected. Subsequently, the intermediate code train compressed by the first coding unit is inputted and is encoded again by a second coding unit. The second coding unit is a dictionary type coding unit such that the intermediate code train is replaced by a registration number of the dictionary and the intermediate code train having a higher appearance frequency is registered by a longer code train and is coded. LD77, LZ88, and the like are included in the dictionary type coding. The second coding unit can be a statistic type coding unit for allocating a short code to the intermediate code having a high appearance frequency on the basis of a statistic appearance frequency of the intermediate code and outputting. The arithmetic coding and the like are included in the statistic type coding unit. Further, there is provided a character train selecting unit for discriminating whether the non-compression data is a Japanese character train that is a first character train as a language which is not separated by a space or, for example, an English character train as a second character train that is a language which is separated by spaces, inputting the Japanese character train to the first coding unit, and inputting the English character train to a second coding unit 74. Consequently, an inconvenience such that English data which is not adapted to a word appearance tendency is encoded by the first coding unit in which a Japanese document is a target and a compression data amount becomes larger than the original data is eliminated. The details of the first coding unit 72 are the same as those of the data compressing apparatus.

A data reconstructing apparatus (modified apparatus) corresponding to the data compressing apparatus of another embodiment of the invention comprises: a first decoding unit for receiving compression data and reconstructing the intermediate code train; and a second decoding unit for receiving the intermediate code train decoded by the first decoding unit and reconstructing to the original non-compression data train. When the dictionary type coding such that the intermediate code train is replaced to a registration number of the dictionary and the intermediate code train of a higher appearance frequency is registered by a longer code train and is coded is executed on the data compressing side, the first decoding unit performs a dictionary type decoding such as LZ77, LZ78, or the like for reconstructing the intermediate code by referring to the dictionary by the input code. In the case where a statistic type coding for allocating a short code to the intermediate code having a high appearance frequency on the basis of a statistic appearance frequency of the intermediate codes and outputting is performed on the data compressing side, the first decoding unit executes a statistic type decoding such as an arithmetic decoding for reconstructing the intermediate code on the basis of the appearance frequency of the reconstructed intermediate code, or the like. Further, when the first stage coding and the second stage coding are performed to the Japanese character train which is not separated by spaces with respect to the non-compression data and the coding of only the second stage is performed to the English character train which is separated by spaces is executed on the data compressing side, a character train selecting unit is provided subsequently to the first decoding unit, the intermediate code train in which the Japanese code train obtained by the codings at the first and second stages has been decoded by the first decoding unit is inputted to the second coding unit. The character train in which the English code train obtained by the coding at only the second stage has been reconstructed by the first decoding unit is outputted as it is. The details of the second decoding unit in the data reconstructing apparatus are the same as those of the first data reconstructing apparatus.

Further, the data compressing apparatus (basic apparatus) has a dynamic dictionary storing unit in which a dynamic dictionary for registering the character train code outputted from the code output unit together with the partial character train of the non-compression data in which the coincidence was detected has been stored. In this case, with respect to the second and subsequent times, the character train comparing unit compares the registration character train in the dynamic dictionary storing unit with the partial character train in the non-compression data, thereby detecting the partial character train which coincides with the registration character train. When the coincident character train cannot be detected, the character train dictionary storing unit 14 is retrieved, thereby detecting the coincident partial character train. By forming the dynamic dictionary each time such a coding is executed, the dictionary retrieval when the character train which has been once encoded is subsequently encoded can be executed at a high speed. Similarly, the data reconstructing apparatus (basic apparatus) has a dynamic dictionary storing unit in which a dynamic dictionary for registering the character train outputted from the character train reconstructing unit together with the character train code of the compression data in which the coincidence was detected has been stored. In this case, with respect to the second and subsequent times, the character train reconstructing unit 40 compares the registration character train code in the dynamic dictionary storing unit with the character train code in the compression data, thereby detecting the character train code which coincides with the registration character train code. In the case where the coincident character train code cannot be detected, the character train dictionary storing unit is retrieved and the coincident character train code is detected, thereby raising the dictionary retrieving speed upon reconstruction.

Similarly, a data compressing apparatus (modified apparatus) of another embodiment also has a dynamic dictionary storing unit in which a dynamic dictionary for registering the character train code outputted from the code output unit together with the partial character train of the non-compression data in which the coincidence was detected has been stored. In this case, with respect to the second and subsequent times, the character train comparing unit 12 compares the registration character train in the dynamic dictionary storing unit with the partial character train in the non-compression data, thereby detecting the partial character train which coincides with the registration character train. When the coincident character train cannot be detected, the character train dictionary storing unit is retrieved and the coincident partial character train is detected, thereby enabling the dictionary retrieving speed at the time of coding to be raised. There is also provided an appearance frequency counting unit for counting an appearance frequency of the character train code outputted from the code output unit and outputting a count value to the second coding unit. In this case, the second coding unit executes an adaptive coding.

Similarly, a data reconstructing apparatus (modified apparatus) of another embodiment also has a dynamic dictionary storing unit in which a dynamic dictionary for registering the character train outputted from the character train reconstructing unit together with the character train code of the compression data in which the coincidence was detected has been stored. In this case, with respect to the second and subsequent times, the character train reconstructing unit compares the registration character train code in the dynamic dictionary storing unit with the character train code in the compression data, thereby detecting the character train code which coincides with the registration character train code. When the coincident character train code cannot be detected, the character train reconsructing unit retrieves the character train dictionary storing unit and detects the coincident character train code, thereby raising the dictionary retrieving speed upon reconstruction. Further, there is also provided an appearance frequency counting unit for counting an appearance frequency of the character train outputted from the character train reconstructing unit and outputting a count value to the first decoding unit 82. In this case, the first decoding unit performs an adaptive decoding.

The invention provides a data compressing method and a data reconstructing method having processing procedures for each of the data compressing apparatus and data reconstructing apparatus as basic apparatuses and the data compressing apparatus and the data reconstructing apparatus as modified apparatuses according to another embodiment.

(Second Invention)

According to the second invention, in order to compress words in a Japanese document at a high speed, character trains of the words are preliminarily classified into a plurality of attributes (parts of speech groups) and a short code is allocated to each of the classified attributes, thereby performing a data compression.

That is, according to the invention, a data compressing apparatus (basic apparatus) for compressing non-compression data formed by character codes of a language having a word structure which is not separated by spaces is characterized by comprising: a character train attribute dictionary storing unit for storing a dictionary in which character trains serving as a processing unit upon compression have been classified in accordance with attributes and divided into a plurality of attribute groups and registered; a character train comparing unit for comparing the registration character train in the character train attribute dictionary storing unit with a partial character train in the non-compression data, thereby detecting the partial character train which coincides with the registration character train; and a code output unit for allocating a set of a predetermined character train code and an attribute code indicative of the attribute group every partial character train in which the coincidence has been detected by the character train comparing unit 102 and outputting.

By performing such a process, the Japanese document can be compressed at a high speed while keeping a high compression ratio. The reason is as follows. According to the study result of Japan Electronic Dictionary Research Institute (EDR) Co., Ltd. mentioned above, when words are classified into attribute groups by parts of speech class as attributes of words, for example, a use frequency of a post positional word in a Japanese document is high and words of about ¼ of the total number of words are post positional words. On the other hand, the number of kinds of post positional word classes is small and is equal to only 171. That is, by effectively expressing the post positional words, an effective compression can be realized. Further, when the lengths of post positional words in a Japanese word dictionary of about 130,000 words made by Institute for New Generation Computer Technology (ICOT) are obtained, the average length is equal to 3.6 characters (7.2 bytes). Even if all of the post positional words are used, there are only 171 kinds, so that they can be expressed by one byte (eight bits) which can express maximum 256 kinds. The average length of verbs is equal to 2.5 characters (five bytes) and there are 14,638 kinds of verbs, so that they can be expressed by two bytes (14 bits) or less. In a manner similar to the above, as for the other parts of speech as well, when they are divided into groups by the parts of speech, one word can be expressed by a small data amount in the group. Further, since there are 13 kinds of classification groups of the parts of speech, they can be expressed by four bits. Consequently, a code obtained by connecting an attribute code of four bits showing 13 kinds of groups of the parts of speech and a character train code for specifying the character train in the relevant group of the part of speech is allocated to the coincident character train by the dictionary retrieval and encoded, thereby enabling the Japanese document to be encoded at a high compression ratio. It is possible to construct in a manner such that with respect to a part of speech in which the number of characters of a word such as prefix or suffix is small or the other word classes which do not belong to any parts of speech, the number of kinds of parts of speech is reduced by outputting the original character train data as it is and the attribute code is reduced to, for example, three bits or less.

The character train attribute dictionary storing unit in the data compressing apparatus has a double-layer structure of a head character storing unit in which a head character of the partial character train to be compressed has been stored and a dependent character train storing unit in which a dependent character train which depends on the head character stored in the head character storing unit has been stored. The head character storing unit stores a head address and the number of dependent character trains in the dependent character train storing unit while using the head character as an index. The dependent character train storing unit stores a length of dependent character train, the dependent character train, a character train code, and the attribute code as a set at a storing position which is designated by the head address in the head character storing unit. By referring to the head character storing unit of the character train attribute dictionary storing unit by the head character in the non-compression data which is being processed at present, the character train comparing unit obtains the length of dependent character train from the dependent character train storing unit extracts the partial character train of the length of dependent character train subsequent to the head character from the non-compression data, and retrieves a coincidence with the registered dependent character train. When a retrieval result indicative of the coincidence with the registration character train is received from the character train comparing unit, the code output unit allocates the character train code and the attribute code stored in the character train attribute dictionary storing unit to the coincidence detected character train and outputs. The head character storing unit divided into two layers is divided into a plurality of attribute storing units according to the attribute groups. A dictionary number DN peculiar to each of the plurality of attribute storing units is set. The head address and the number of dependent character trains in the dependent character train storing unit are stored therein while using the head character as an index. The dependent character train storing unit corresponding to it stores a length of dependent character train and the dependent character train as a set at one or a plurality of storing positions (of the number corresponding to the number of dependent character trains) which are designated by the head address in the attribute storing unit and does not store the character train code and the attribute code, thereby reducing the dictionary size. In this case, when a retrieval result showing the coincidence with the registration character train is received from the character train comparing unit, the code output unit allocates the character train registration number indicative of the storing position in the dependent character train storing unit and the dictionary number DN of the attribute storing unit to the coincidence detected character train and outputs.

A data reconstructing apparatus (basic apparatus) corresponding to such a data compressing apparatus is characterized by comprising: a code separating unit for extracting a code serving as a reconstructing unit from compression data and separating into an attribute code and a character train code; a character train attribute dictionary storing unit which is divided into a plurality of attribute storing units according to attribute groups and stores a dictionary in which a reconstruction character train corresponding to the character train code serving as a processing unit upon reconstruction has been registered every attribute storing unit; and a character train reconstructing unit for reconstructing the original character train by referring to the character train attribute dictionary storing unit by the attribute code and the character train code separated by the code train separating unit. The character train attribute dictionary storing unit divides the head character as a reconstruction target, a length of dependent character train, and the dependent character train into the attribute groups and stores into the plurality of attribute storing units. The character train reconstructing unit selects the attribute storing unit on the basis of the separated attribute code, recognizes the storing position in the attribute storing unit selected on the basis of the separated character train code, and reconstructs the character train.

In another embodiment of the invention, a double coding in which compression data compressed by the data compressing apparatus as a basic apparatus is used as an intermediate code and is encoded again by an existing coding is performed. That is, a data compressing apparatus (modified apparatus) for compressing non-compression data formed by character codes of a language having a word structure which is not separated by spaces is characterized by comprising: a first coding unit for comparing a registration character train which has been registered in a character train attribute dictionary and serves as a processing unit upon compression, thereby detecting a partial character train which coincides with the registration character train, and allocating a set of a predetermined intermediate code and an attribute code every detected partial character train and outputting; and a second coding unit for inputting the intermediate code train compressed by the first coding unit and again compressing. The second coding unit is either a dictionary type coding unit such as LZ77, LZ78, or the like such that the intermediate code train is replaced by a registration number of the dictionary and the intermediate code train of a higher appearance frequency is registered by a longer code train and is coded or a statistic type coding unit of an arithmetic coding or the like such that a short code is allocated to the intermediate code of a high appearance frequency on the basis of a statistic appearance frequency of the intermediate code and is outputted. Further, by providing a character train selecting unit, the non-compression data is discriminated to see whether it is a first character train of Japanese which is not separated by spaces or a second character train such as English or the like which is separated by spaces. The first character train of Japanese is inputted to the first coding unit and the second character train of English is inputted to the second coding unit. Consequently, the inconvenience such that English data to which the word appearance tendency is not adapted is encoded and the compression data amount is larger than the original data amount in the first coding unit for the Japanese document as a target is solved. Although the details of the first coding unit are the same as those of the data compressing apparatus as a basic apparatus, since the encoding in the second coding unit is the process of the byte unit, the data is stored so that the sum of the attribute code and the character train code stored in the double-layer dependent character train storing unit provided for the character train attribute dictionary storing unit is set to a byte code of a multiple of eight bits. In the case where the attribute code and the character train code are not stored in the double-layer dependent character train storing unit provided for the character train attribute dictionary storing unit, when a retrieval result showing the coincidence with the registration character train is received from the character train comparing unit, the code output unit allocates a character train registration number indicative of the storing position in the double-layer dependent character train storing unit provided for the character train attribute dictionary storing unit and a dictionary number in the attribute storing unit to the byte code whose code length is a multiple of eight bits.

A data reconstructing apparatus (modified apparatus) corresponding to the data compressing apparatus (modified apparatus) of another embodiment is characterized by comprising: a first decoding unit for inputting compression data and reconstructing the intermediate code train; and a second decoding unit for inputting the intermediate code train reconstructed by the first decoding unit and reconstructing the original non-compression data train. The first decoding unit executes an attribute dictionary type decoding for reconstructing the intermediate code by referring to the attribute dictionary by the input code or a statistic type decoding for reconstructing the intermediate code on the basis of the appearance frequency of the reconstructed intermediate code. Further, when the codings at first and second stages is performed to a Japanese character train which is not separated by spaces and the coding only at the second stage is executed to a character train of English or the like which is separated by spaces on the data compression side, a character train selecting unit is provided subsequently to a first character train decoding unit. The intermediate code train in which the code train obtained by the codings at the first and second stages was decoded by the first decoding unit is inputted to the second decoding unit and the reconstruction character train obtained only by the coding at the second stage is outputted as it is. The details of the second decoding unit in this case are the same as those of the data reconstructing apparatus as a basic apparatus.

Further, the invention provides a data compressing method and a data reconstructing method having processing procedures for the data compressing apparatus and the data reconstructing apparatus as basic apparatuses and for the data compressing apparatus and the data reconstructing apparatus as modified apparatuses.

The above and other objects, features, and advantages of the present invention will become more apparent from the following detailed description with reference to the drawings.

BRIEF DESCRIPTION OF THE DRAWINGS

FIG. 4 is an explanatory diagram of a study result regarding a Japanese document;

FIGS. 6A and 6B are flowcharts for a data compressing process in FIG. 3 using the dictionary structure of FIG. 5;

FIG. 7 is an explanatory diagram of another dictionary structure of the character train dictionary storing unit in FIG. 2;

FIGS. 8A and 8B are flowcharts for a data compressing process in FIG. 3 using the dictionary structure of FIG. 7;

FIG. 12 is an explanatory diagram of a dictionary structure of the dynamic dictionary storing unit in FIG. 11;

FIG. 14 is an explanatory diagram of a dictionary structure of a dynamic dictionary storing unit in FIG. 13;

FIG. 16 is a block diagram in case of using a second coding unit in FIG. 15 as a dictionary type coding unit;

FIG. 17 is a block diagram in case of using the second coding unit in FIG. 15 as a statistic type coding unit;

FIGS. 18A and 18B are flowcharts for a data compressing process in FIG. 15 using the dictionary structure in FIG. 5;

FIGS. 19A and 19B are flowcharts for a data compressing process in FIG. 15 using the dictionary structure in FIG. 7;

FIG. 21 is a block diagram in case of using a second decoding unit in FIG. 20 as a dictionary type decoding unit;

FIG. 22 is a block diagram in case of using the second decoding unit in FIG. 20 as a statistic type decoding unit;

FIG. 24 is a block diagram of a data reconstructing apparatus for reconstructing compression data which was selectively coded in FIG. 23;

FIG. 26 is a block diagram of a data reconstructing apparatus for reconstructing the compression data coded in FIG. 23;

FIG. 27 is a block diagram of a data compressing apparatus according to the second invention for converting into a code obtained by adding a character train code to an attribute code;

FIG. 28 is an explanatory diagram of attribute groups classified by a part of speech obtained from the study result of a Japanese document;

FIGS. 29A and 29B are explanatory diagrams of a dictionary structure of a character train attribute dictionary storing unit in FIG. 27;

FIGS. 30A and 30B are structure explanatory diagrams of compression data which is encoded in FIG. 27;

FIGS. 31A and 31B are flowcharts for a data compressing process in FIG. 27 using a dictionary structure in FIGS. 29A and 29B;

FIGS. 32A and 32B are explanatory diagrams of another dictionary structure of the character train attribute dictionary storing unit in FIG. 27;

FIGS. 33A and 33B are flowcharts for a data compressing process in FIG. 27 using the dictionary structure of FIGS. 32A and 32B;

FIG. 37 is a block diagram using a dictionary type coding unit in FIG. 36;

FIG. 38 is a block diagram using a statistic type coding unit in the second coding unit in FIG. 36;

FIGS. 39A and 39B are explanatory diagrams in which Japanese to be converted to a code of a byte unit in a coding at the first stage in FIG. 36 is classified into attribute groups by a part of speech;

FIGS. 40A and 40B are structure explanatory diagrams for converting into an intermediate code of a byte unit in the coding at the first stage in FIG. 36;

FIGS. 41A and 41B are flowcharts for a data compressing process in FIG. 36 using the dictionary structure in FIG. 5;

FIGS. 42A and 42B are flowcharts for a data compressing process in FIG. 36 using the dictionary structure in FIG. 7;

FIG. 44 is a block diagram using a dictionary type decoding unit in a first decoding unit in FIG. 43;

FIG. 45 is a block diagram using a statistic type decoding unit in a first decoding unit in FIG. 43;

DETAILED DESCRIPTION OF THE PREFERRED EMBODIMENTS (Compression and Reconstruction of the First Invention)

Figure 1:
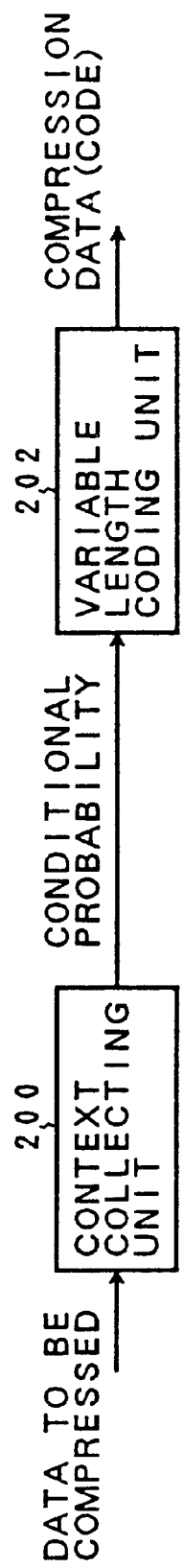
FIG. 1 is a block diagram of a conventional variable length coding based on the context collection.
Figure 2A:
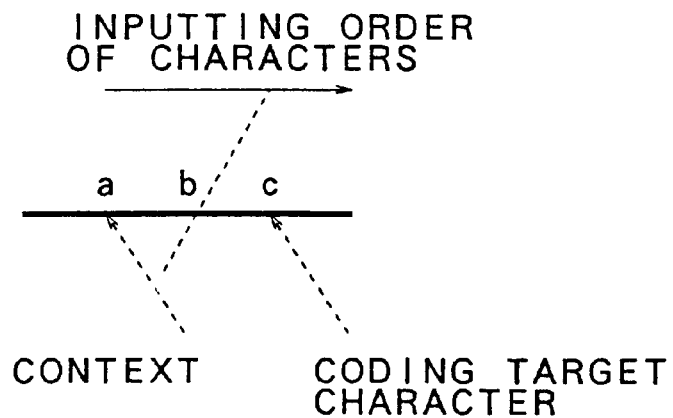
FIGS. 2A and 2B are explanatory diagrams of context trees in which the variable length coding of FIG. 1 is shown by a tree structure.
Figure 2B:
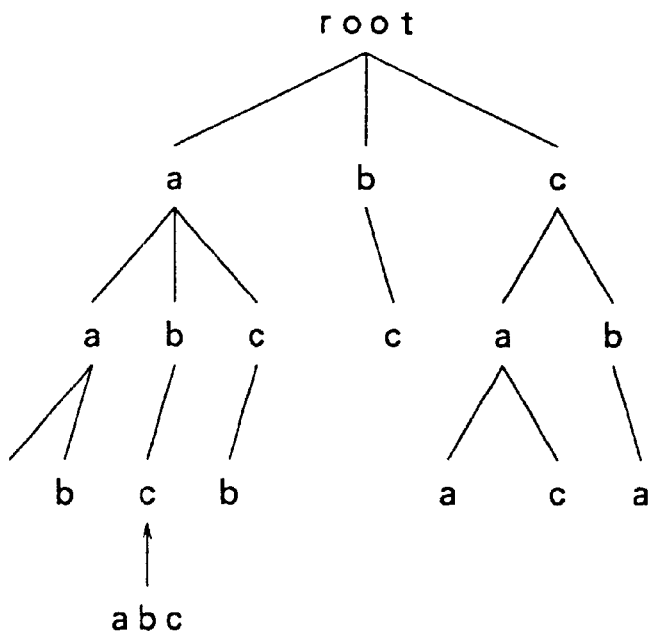
Figure 3:
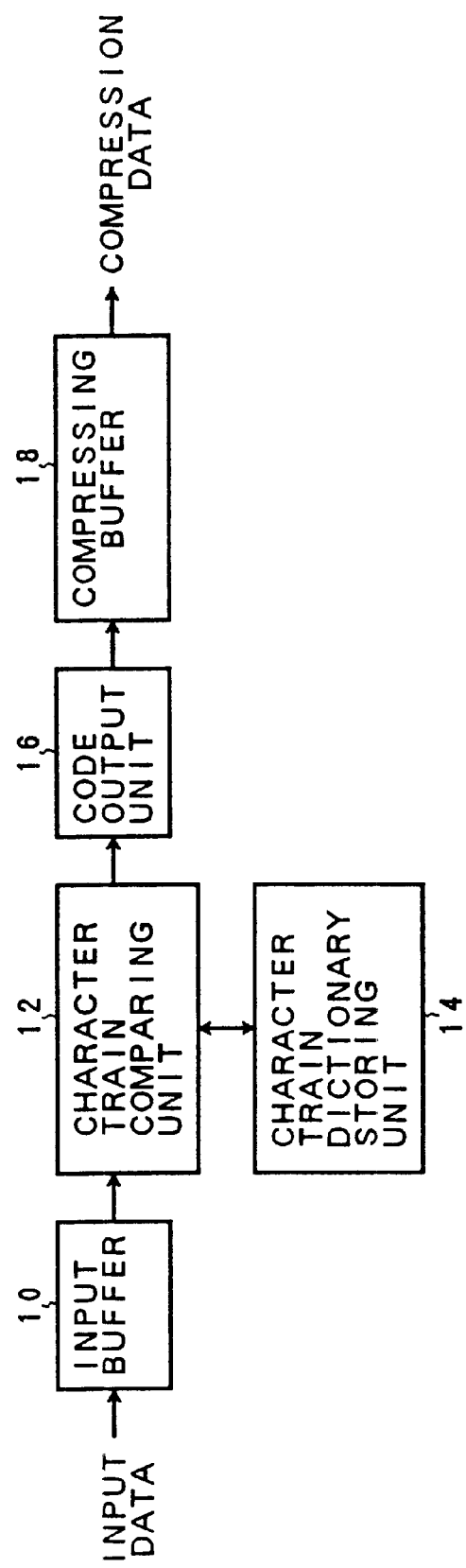
FIG. 3 is a block diagram of a data compressing apparatus of the invention.

FIG. 3 is a block diagram of a data compressing apparatus of the first invention in which a predetermined character train code is allocated every character train constructing a word. The data compressing apparatus is constructed by an input buffer 10, a character train comparing unit 12, a character train dictionary storing unit 14, a code output unit 16, and a compressing buffer 18. As document data serving as a target to be compressed, for example, Japanese document data is stored into the input buffer 10. In case of the Japanese document data, one character is constructed by word data of two bytes and a word in the document has a structure which is not separated by spaces. The Japanese document data which is inputted to the input buffer 10 is inputted on a unit basis of a document which is used for compression of one time and a document of a proper size from a kilobyte order to a megabyte order is inputted. The character train comparing unit 12 sequentially receives character trains of the Japanese document data stored in the input buffer 10 from the head and detects whether the inputted character train coincides with a registration character train of a word unit which has been preliminarily registered in the character train dictionary storing unit 14 or not. When the registration character train which coincides with the input character train is detected by the character train comparing unit 12, the code output unit 16 reads out and allocates the character train code which has been preliminarily registered in correspondence to the coincidence detected registration character train in the character train dictionary storing unit 14 and outputs the character train code to the compressing buffer 18. The character train dictionary storing unit 14 for converting the character train in the Japanese document data to the character train code on the word unit basis will now be described.

FIG. 4 is a sum result regarding parts of speech of morphemes constructing Japanese published by Japan Electronic Dictionary Research Institute (EDR) Co., Ltd. as a study result. According to the sum result, the number of morphemes corresponding to the number of words is equal to 136,486. When the number of words is expressed by binary numbers, they can be expressed by codes of 17 bits where the maximum number of expression items is equal to 262,143. On the other hand, as a result of obtaining a distribution by detecting the number of characters constructing the words from the Japanese dictionary having about 130,000 words formed by Institute for New Generation Computer Technology Development (ICOT), each of 70,000 words which are equal to or larger than ½ of all of the registered words is constructed by two characters and the average number of characters is equal to 2.8 characters.

When the average number of characters (2.8 characters) is expressed by the number of bits, it is equal to $$2.8 \text{ characters} \times 2 \text{ bytes} = 5.6 \text{ bytes} \times 8 \text{ bits}$$
$$= 44.8 \text{ bits}$$

According to the invention, by executing a coding such that a character train code of 17 bits expressing each of the 136,486 words in FIG. 4 is preliminarily allocated and the character train of the inputted Japanese data is converted to the character train code of 17 bits on a word unit basis, the data amount can be substantially reduced to the half or less.

Figure 5:
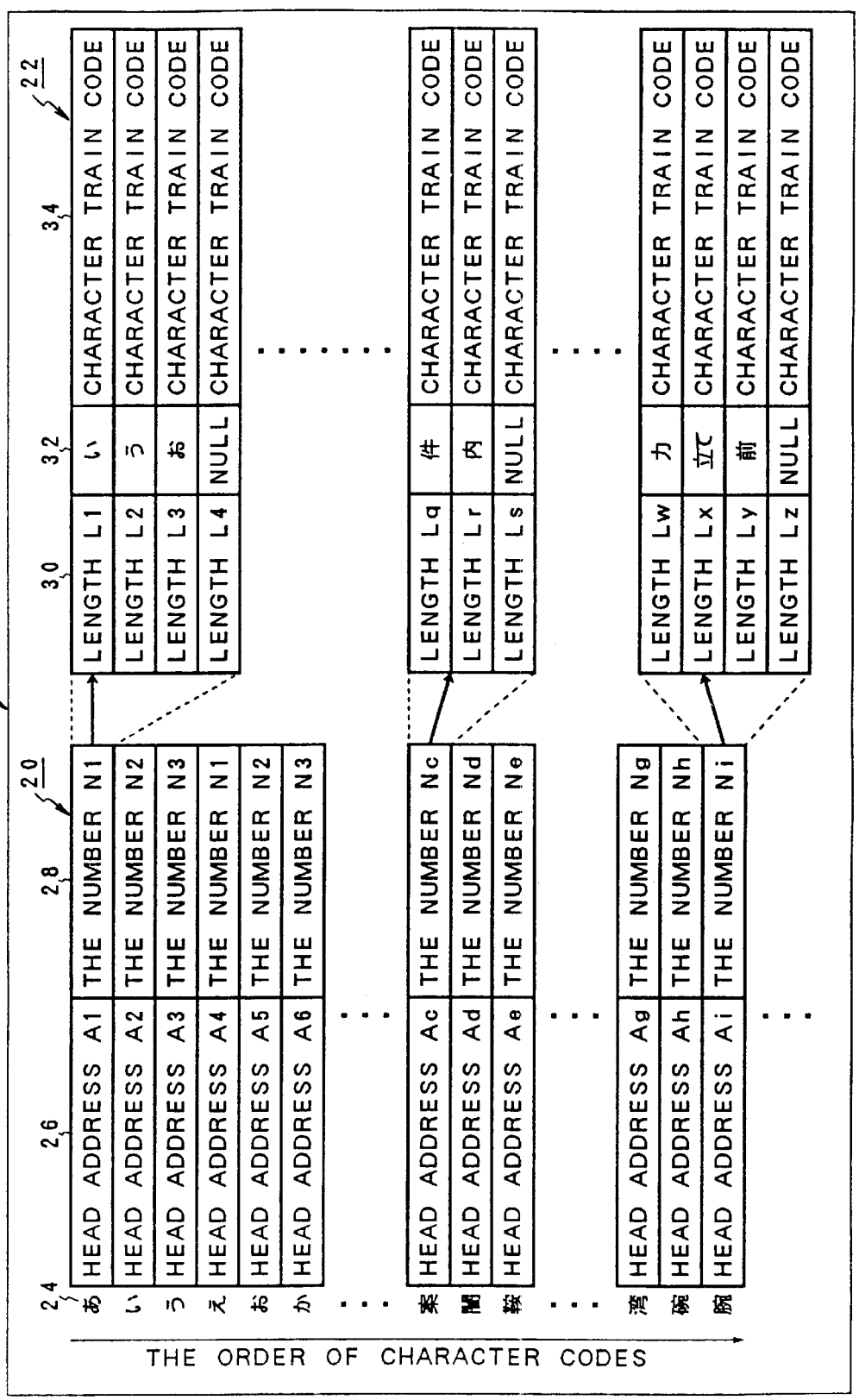
FIG. 5 is an explanatory diagram of a dictionary structure of a character train dictionary storing unit in FIG. 2.

FIG. 5 shows an embodiment of a dictionary structure of the character train dictionary storing unit 14 in FIG. 3. The dictionary stored in the character train dictionary storing unit 14 has a double-layer structure of a head character storing unit 20 and a dependent character train storing unit 22. The head character storing unit 20 uses character codes of Japanese characters "あ, い, う, え, お, ... (which pronounce a, i, u, e, o, ... in Roman characters)" as indices. Since the Japanese character code is two-byte data, as character codes 24, 131,072 kinds of storing positions from "0x0000" to "0xFFFF" as hexadecimal numbers are allocated. The character code 24 accesses to the position of the corresponding character code by using the head character read by the character train comparing unit 12 in FIG. 3. A head address 26 is stored subsequent to the character code 24. When the head character "あ (a)" of the character code 24 is taken as an example, the head address 26 designates a head address "A1" in the dependent character train storing unit 22 in which the dependent character train subsequent to the head character "あ (a)" has been stored. Subsequently, the number of dependent character trains (28) is provided. For example, in case of the head character "あ (a)", (N1=4) is stored as the number of dependent character trains (28). In the dependent character train storing unit 22, the head position is designated by the head address 26 stored in correspondence to the character code 24 of the head character in the head character storing unit 20 and the dependent character trains are stored at the storing positions of the number designated by the dependent character train storing unit 28 from the head position. For example, four storing positions when the number of dependent character trains (28) is (N1=4) are designated as dependent character train storing regions as targets from the address A1 of the head address 26 corresponding to the head character "あ (a)". In the dependent character train storing unit 22, a length 30 of dependent character train from the head, a dependent character train 32, and a character train code 34 which is expressed by 17 bits are stored. In the head address A1, for instance, a dependent character train "い (i)" having a length of L1 and its character train code are stored. A dependent character train "う (u)" having a length of L2 is stored together with its character train code at the next storing position. In the third region, a dependent character train "お (o)" having a length L3 is stored together with its character train code. In the fourth storing region, a code "NULL" indicating that a dependent character train having a length L4 does not exist is stored and a character train code indicative of the absence is stored. That is, the fourth storing region shows registration of the character train code of only one head character. "あ い う え お か. . . 室 閑 鞋 . . . 椀 椀 腕" of the head character codes 24 in FIG. 5 and "い う お. . . 件 内. . . カ 立て 前. . . " of the dependent character trains 32 are examples of Japanese characters each expressed by a 2-byte code and are expressed by Roman letters as "き (a), い (i), う (u), え (e), お (o), か (ka)... 案 (an), 闇 (an), 案 (an),..., 椀 (wan), 椀 (wan)" and "い (i), う (u), お (o),..., 件 (ken), 内 (nai),..., 力(chikara), 立て (tate), 前 (mae)...".

The first to 136,486th character train codes of 17 bits have preliminarily been allocated as character train codes 34 in the dependent character train storing unit 22 in FIG. 5 on the basis of the number of words and the relation between a character train code K and a position address X in case of storing as shown in FIG. 5 can be expressed by the following equation.

$$K=(N \cdot X - A1)/M \quad (1)$$

where,

X: position address in the dependent character train storing unit 22
N: number (1, 2, 3, ..., N) of the dependent character train in which the coincidence has been detected
A1: start address in the dependent character train storing unit
M: storage byte length in the dependent character train storing unit Since the storage byte length (M) in the dependent character train storing unit 22 is equal to the total length of the length 30 of dependent character train, dependent character train 32, and character train code 34, it can be expressed by, for example, the following equation.

$$\begin{aligned} \text{Storage byte length } M &= \text{length} + \text{character code train} + \quad (2) \\ &\quad \text{character train code} \\ &= 3 \text{ bits} + 96 \text{ bits} + 17 \text{ bits} \\ &= 116 \text{ bits} \\ &= 15 \text{ bytes} \end{aligned}$$

A case of allocating 96 bits to the dependent character train 32 by setting the maximum number of characters of the dependent character train which can be stored to six characters is shown as an example. It will be obviously understood that since the average number of characters of the dependent character train is equal to 2.8 characters, if the maximum number of characters is set to three characters (48 bits) or larger, a sufficient compressing effect can be obtained. In this case, the storage byte length (M) of one storing region in the dependent character train storing unit is equal to 12 bytes. When the character train code (K) of 17 bits which is calculated by the equation (1) is used, it is sufficient to calculate the storing position (address) X from the value of the character train code (K) by the following equation at the time of reconstruction.

$$X = M \cdot K + A1 \quad (3)$$

where,

K: character train code
A1: start address in the dependent character train storing unit -continued M: storage byte length in the dependent character train storing unit on the reconstruction side In the equation (3), since the start address A1 in the dependent character train storing unit in the dictionary which is used on the reconstruction side, that is, an offset and the storage byte length (M) of the dependent character train storing unit 22 have been determined as constants, by substituting the character train code (K) to be reconstructed into the equation (3), the dictionary position (position address) X in which the character train to be reconstructed has been stored can be unconditionally calculated.

FIG. 6 is a flowchart for the encoding process of the data compressing apparatus in FIG. 3 by the character train dictionary storing unit 14 having the dictionary structure of FIG. 5. First, in step S1, a pointer is moved to a position P of the head character of the character train read from the input buffer 10 to the character train comparing unit 12. A table in the head character storing unit 20 corresponding to the character code 24 in FIG. 5 shown by the character code at the head character position P is referred to in step S2. With reference to the table in the head character storing unit 20, the head address 26 and the number of dependent character trains (28) in the dependent character train storing unit 22 are obtained in step S3. Subsequently, in step S4, length data L of the length 30 of dependent character train is obtained from the head data in the head address in the dependent character train storing unit 22. In step S5, L characters based on the length data L of the dependent character train are extracted from the head character position P, the extracted L characters are compared with the registration character train of the dependent character train 32 in the dependent character train storing unit 22, thereby discriminating whether they coincide or not. When the extracted L characters coincide with the registered dependent character train, the processing routine advances to step S8, the next character train code 34 is read out and is allocated to the coincidence detected character train by the code output unit 16, and the character code train is transmitted to the compressing buffer 18. In step S9, the pointer at the head character position P is updated to the position P where it is moved by only the number L of characters of the dependent character train. If a process for non-compression data is not finished in step S12, the processing routine is again returned to step S2 and similar processes are repeated with respect to the updated head character position P. On the other hand, when the extracted character does not coincide with the registration dependent character train in the dependent character train storing unit 22 in step S5, a check is made to see whether the process to the number (N) of dependent character trains has been finished or not. If it is not finished yet, the processing routine is returned to step S7. The length data L of the dependent character train is obtained from the next storing region in the head address in the dependent character train storing unit 22. The dependent character train of the L characters is extracted again from the head character position P in step S5 and is compared with the registration dependent character train in the dependent character train storing unit 22 to see whether they coincide or not. In a case where they do not coincide even when the comparing process is performed with respect to all of the dependent character trains of the registration number (N) by repetition of steps S5 to S7, the end of the number (N) of dependent character trains is discriminated in step S6. The processing routine advances to step S10 and a non-registered code indicative of one character of the head character is transmitted. In step S11, the pointer is updated to a next position where the head character position P has been moved only by the number (L) of characters (L=1). The processing routine is returned to step S2 and the processes from the next head character position P are repeated.

FIG. 7 shows an embodiment of another dictionary structure of the character train dictionary storing unit 14 which is used in the data compressing apparatus of FIG. 3. In the dictionary structure of the character train dictionary storing unit 14, the head character storing unit 20 in which the character code 24 of the head character is used as an index has the same dictionary structure as that of FIG. 5. However, only the length 30 of dependent character train and the dependent character train 32 are stored in the dependent character train storing unit 22 which is designated by the head address 26 in the head character storing unit 20 and the character train code 34 of 17 bits showing the dependent character train is not stored.

In the dictionary structure of FIG. 7, therefore, when the character train coincides with the dependent character train 32 of the dependent character train storing unit 22, a character train registration number $K_N$ is allocated to the coincidence detected character train and is outputted in place of the character train code. When the relation of the dictionary structure of FIG. 5 in which the character train code 34 has been stored in the dependent character train storing unit 22 is outputted by allocating the character train registration number $K_N$ of the dependent character train storing unit 22 to the code without storing the character train code shown in FIG. 7, the character train registration number $K_N$ to be allocated to the code can be calculated by the following equation.

$$K_N = (X \cdot N - A1)/M \qquad (4)$$

where,

| |
|---|
| X: storage address in the dependent character train storing unit |
| N: number of the coincidence detected dependent character train (1, 2, 3, ..., N) |
| A1: start address (fixed offset value) of the dependent character train storing unit |
| M: storage byte length of the dependent character train storing unit |

In the case where a character train code K is not registered like a dependent character train storing unit 22 in FIG. 7, the storage byte length M of the dependent character train storing unit 22 is as follows.

$$\begin{aligned}
\text{Storage byte length } M &= \text{length} + \text{character code train} \qquad (5) \\
&= 3 \text{ bits} + 96 \text{ bits} \\
&= 99 \text{ bits} \\
&= 13 \text{ bytes}
\end{aligned}$$

As compared with the case of FIG. 5 shown in the equation (2), the storage byte length M can be reduced by two bytes. A size of character train dictionary storing unit 14 can be reduced by an amount corresponding to such a byte length reduction. In the reconstruction of the compression data in the case where the character train registration number $K_N$ of the dependent character train storing unit 22 which coincides with the character train in the dictionary structure of FIG. 7 is allocated to the code, the character train registration number $K_N$ allocated to the code is substituted into the equation (3). Thus, the position address X indicative of the storing position of the dependent character train storing unit corresponding to the character train registration number is unconditionally calculated and can be returned to the original character train with reference to the dictionary.

Figure 8B:
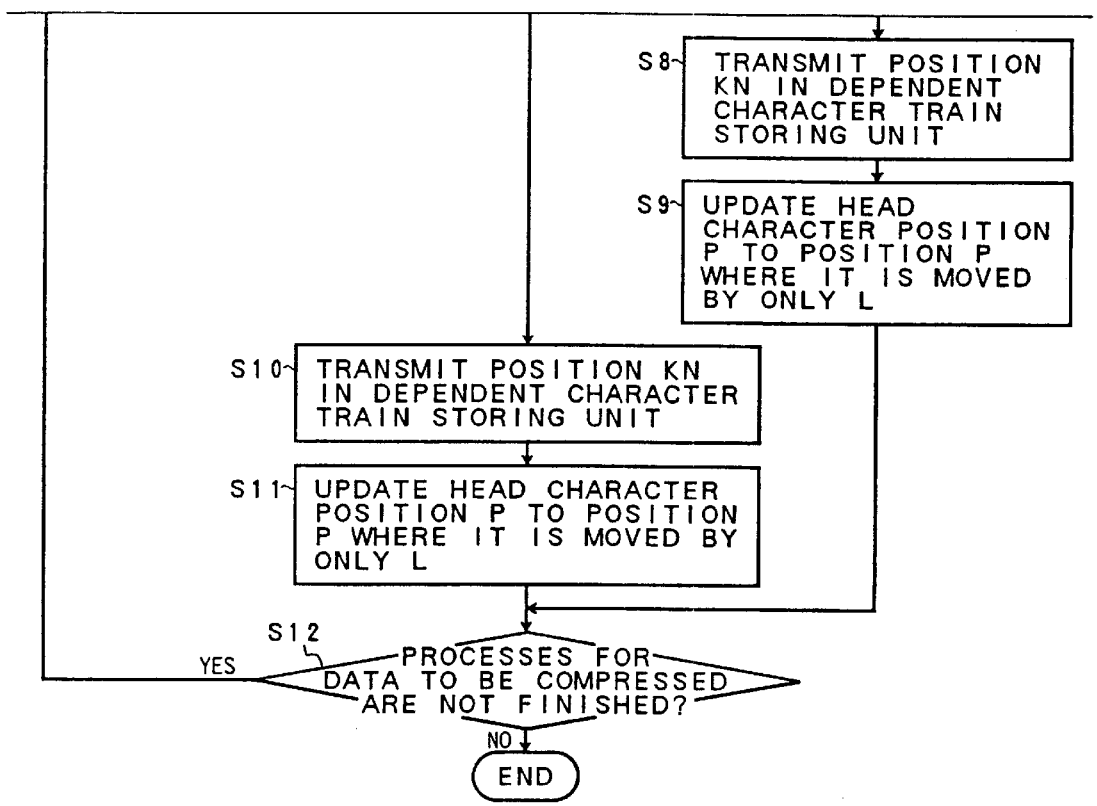

FIGS. 8A and 8B are flowcharts for the coding process by the data compressing apparatus in FIG. 3 using the dictionary structure in FIG. 7. A processing routine in steps S1 to S6 and steps S9, S11, and S12 of the coding process is the same as the coding process in FIGS. 6A and 6B using the dictionary structure in FIG. 5. However, it differs with respect to a code transmission by the code allocation when the coincidence with the dictionary registration character train is detected in steps S8 and S10. That is, L characters from the head character storing position P are extracted and if the coincidence with the dependent character train stored in the dependent character train storing unit 22 is obtained in step S5, the character train registration number $K_N$ showing the storing position in the dependent character train storing unit 22 is obtained by the equation (4) and the character train registration number $K_N$ is allocated to the code and is transmitted in step S8. When the character train doesn't coincide with the dependent character train in step S5 and the comparison with the (N) dependent character trains is finished in step S6, the character train registration number $K_N$ in which "NULL" in FIG. 7 has been stored is calculated by the equation (4) and is allocated to the code and is transmitted in step S10.

Figure 9:
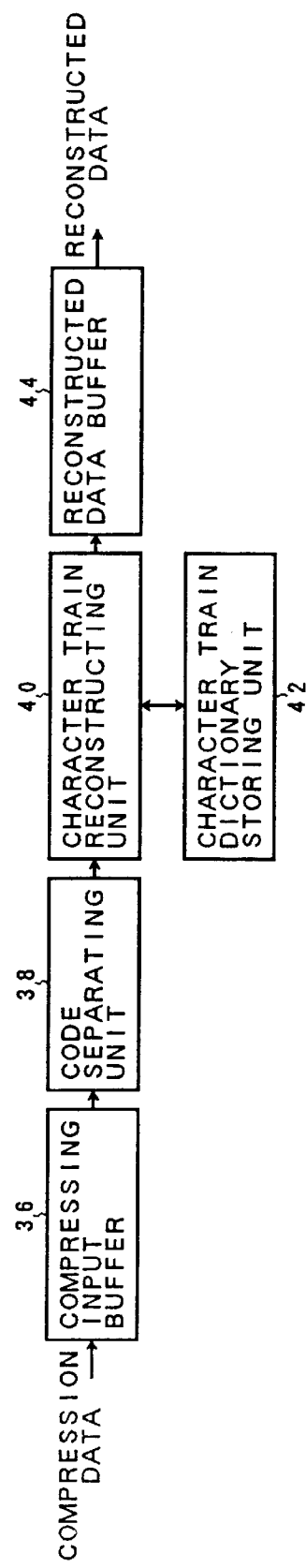
FIG. 9 is a block diagram of a data reconstructing apparatus for reconstructing compression data coded in FIG. 3.

FIG. 9 is a block diagram of a data reconstructing apparatus for reconstructing the compression data which was coded by the data compressing apparatus in FIG. 3. The data reconstructing apparatus is constructed by a compressing input buffer 36, a code separating unit 38, a character train reconstructing unit 40, a character train dictionary storing unit 42, and a reconstructed data buffer 44. The compression data coded by the data compressing apparatus in FIG. 3 is inputted to the compressing input buffer 36 through a bus or a communication line. The code separating unit 38 separates character train codes on a 17-bit unit basis from the compression data stored in the compressing input buffer 36 and supplies to the character train reconstructing unit 40. The character train reconstructing unit 40 reconstructs the corresponding character train and stores into the reconstructed data buffer 44 with reference to the character train dictionary storing unit 42 by the inputted character train code.

Figure 10:
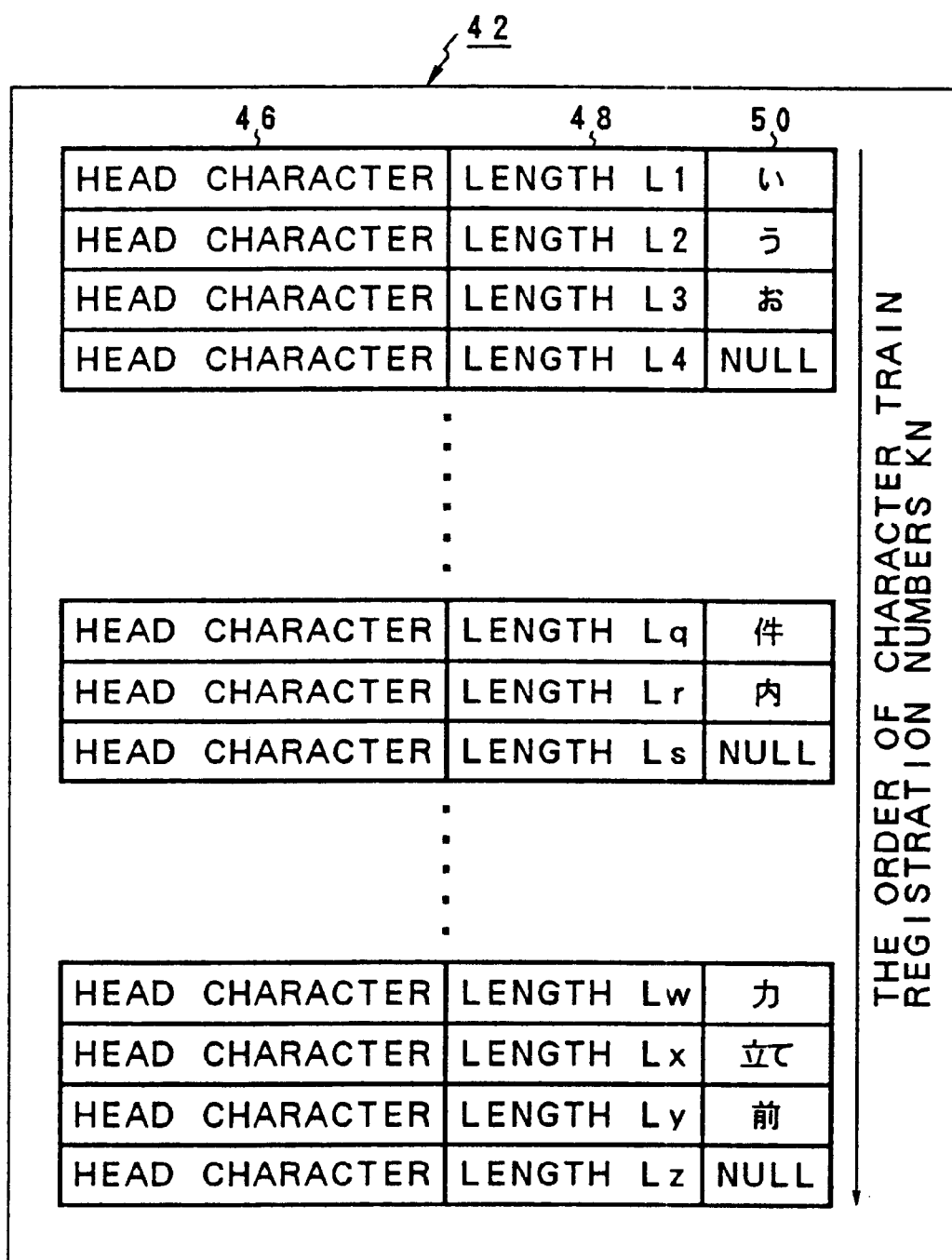
FIG. 10 is an explanatory diagram of a dictionary structure of a character train dictionary storing unit in FIG. 9.

FIG. 10 shows a dictionary structure of the character train dictionary storing unit 42 in FIG. 9. In the character train dictionary storing unit 42, a head character 46, dependent character train length 48, and a dependent character train 50 are sequentially stored in accordance with the order of the character train codes 34 of 17 bits in the dependent character train storing unit 22 shown in the dictionary structure in FIG. 5. This order is the same as that of the character train registration number $K_N$ in the dependent character train storing unit 22 in the dictionary structure in FIG. 7. In the character train reconstructing unit 40, therefore, the storage byte length (M) of the character train dictionary storing unit 42 which is used for reconstruction has been known as follows.

$$\begin{aligned}\text{Storage byte length }(M) &= \text{head character} + \text{length} + \quad (6)\\ &\quad \text{character train code}\\ &= 16 \text{ bits} + 3 \text{ bits} + 96 \text{ bits}\\ &= 115 \text{ bits}\\ &= 15 \text{ bytes}\end{aligned}$$

Therefore, the position address X corresponding to the character train code (K) or character train registration number $K_N$ can be calculated by the following equation.

$$X = M \cdot K + A1 \qquad (7)$$

where,

K: character train code (=character train registration number $K_N$)
A1: start address of the character train storing position
M: storage byte length By obtaining the position address X showing the dictionary storing position from the character train code K (or $K_N$) separated as mentioned above and referring, a character train in which the corresponding head character and the dependent character train are combined can be reconstructed.

Figure 11:
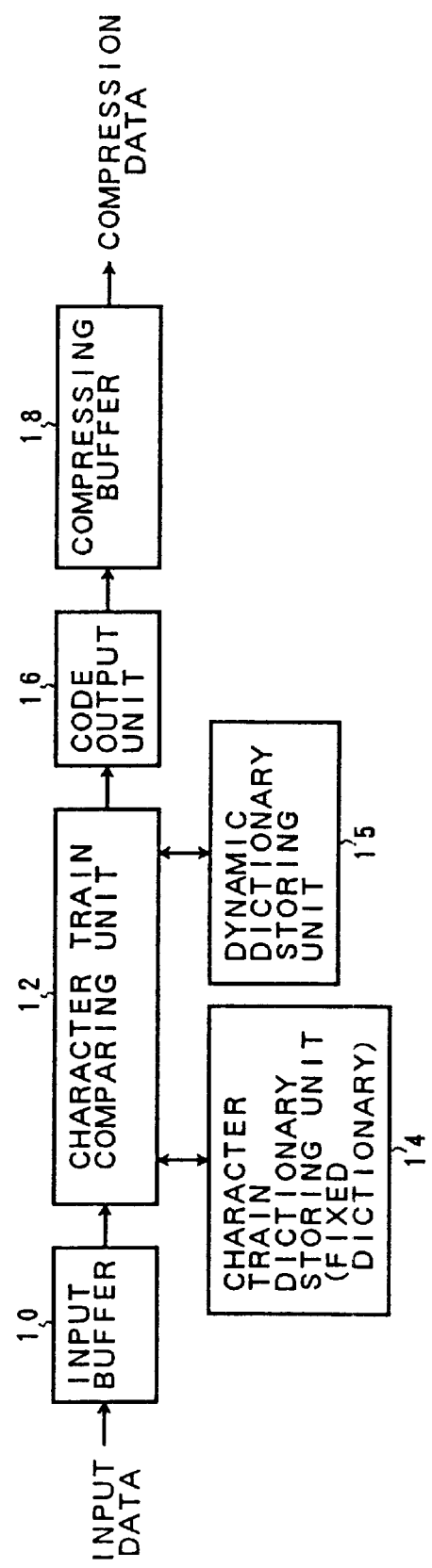
FIG. 11 is a block diagram of a data compressing apparatus according to the first invention having a dynamic dictionary storing unit.

FIG. 11 is a block diagram of a data compressing apparatus in which a dynamic dictionary storing unit 15 is further provided for the data compressing apparatus in FIG. 3. The character train dictionary storing unit 14 has the dictionary structure of either FIG. 5 or FIG. 7. On the other hand, the dynamic dictionary storing unit 15 is not registered at first. When the character train code is allocated by the code output unit 16 to the character train in which the coincidence was first detected with reference to the character train dictionary storing unit 14 in the character train comparing unit 12, the contents in the character train dictionary storing unit 14 in which the code allocation was performed are stored into the dynamic dictionary storing unit 15. With respect to the coding of the second and subsequent times, first, the dynamic dictionary storing unit 15 is referred. When the coincident character train cannot be detected, the character train dictionary storing unit 14 is referred.

FIG. 12 shows a dictionary structure of the dynamic dictionary storing unit 15 in FIG. 11 and indicates registration contents at the stage where the coding of two character trains has been finished. That is, a head character 60, a length 61 of dependent character train, a dependent character train 62, and a character train code 63 are registered in the dynamic dictionary storing unit 15. The registration contents have contents constructed by a combination of, for example, a head character designated by the character code 24 serving as an index of the character train dictionary storing unit 14 in FIG. 7 and the contents in the dependent character train storing unit 22. FIG. 12 relates to the example of using the dictionary structure of FIG. 5 as a character train dictionary storing unit 14. In case of using the dictionary structure of FIG. 7, however, the character train code 63 is not stored and, in place of it, the character train registration number $K_N$ based on the equation (4) is obtained and allocated to the code. Each time the character train is coded, by storing it into the dynamic dictionary storing unit 15 and executing a subsequent dictionary retrieval as mentioned above, the character train which has once been coded can be immediately coded with reference to the dynamic dictionary storing unit 15. As compared with the case where the character train has been coded by referring to only the character train dictionary storing unit 14, the dictionary retrieval can be performed at a higher speed.

Figure 13:
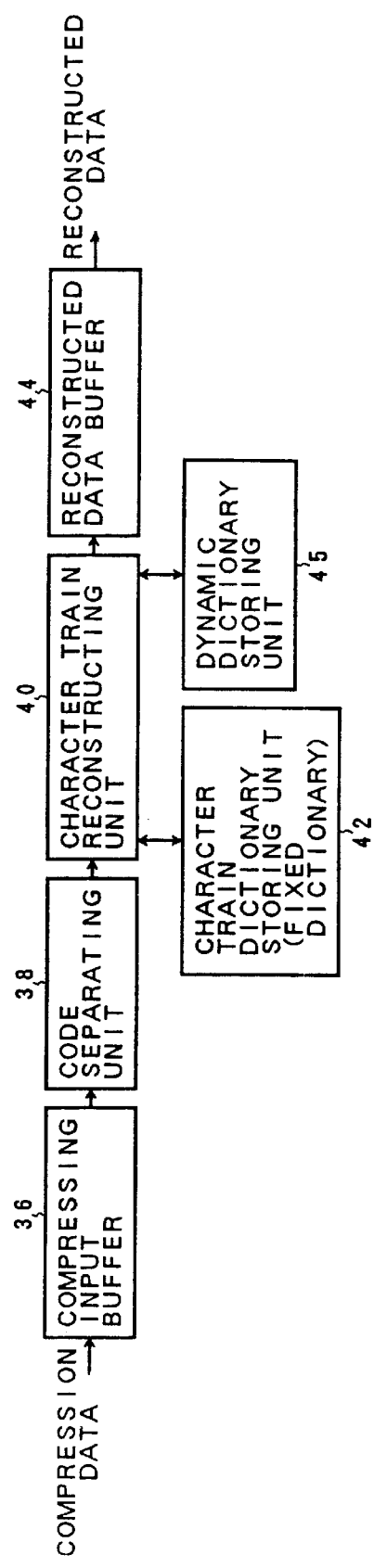
FIG. 13 is a block diagram of a data reconstructing apparatus for reconstructing compression data coded in FIG. 11.

FIG. 13 is a block diagram of a data reconstructing apparatus for reconstructing the compression data coded by FIG. 11. In addition to the fundamental construction of the data reconstructing apparatus shown in FIG. 9, a dynamic dictionary storing unit 45 is further newly provided for the character train reconstructing unit 40. The character train dictionary storing unit 42 has the dictionary structure shown in FIG. 10. On the other hand, each time the character train code is converted into the original character train by the character train reconstructing unit 40, a head character 64, a length 65 of dependent character train, a dependent character train 66, and a character train code 67 are registered in the dynamic dictionary storing unit 45. Therefore, in the second and subsequent decoding process, by referring to the dynamic dictionary storing unit 45 by the character train code at that time, a character train comprising a combination of the relevant head character and the dependent character can be reconstructed at a high speed. When the character train cannot be reconstructed even by referring to the dynamic dictionary storing unit 45, the character train is naturally reconstructed with reference to the first character train dictionary storing unit 42.

(Compression and Reconstruction by Double Coding of the First Invention)

Figure 15:
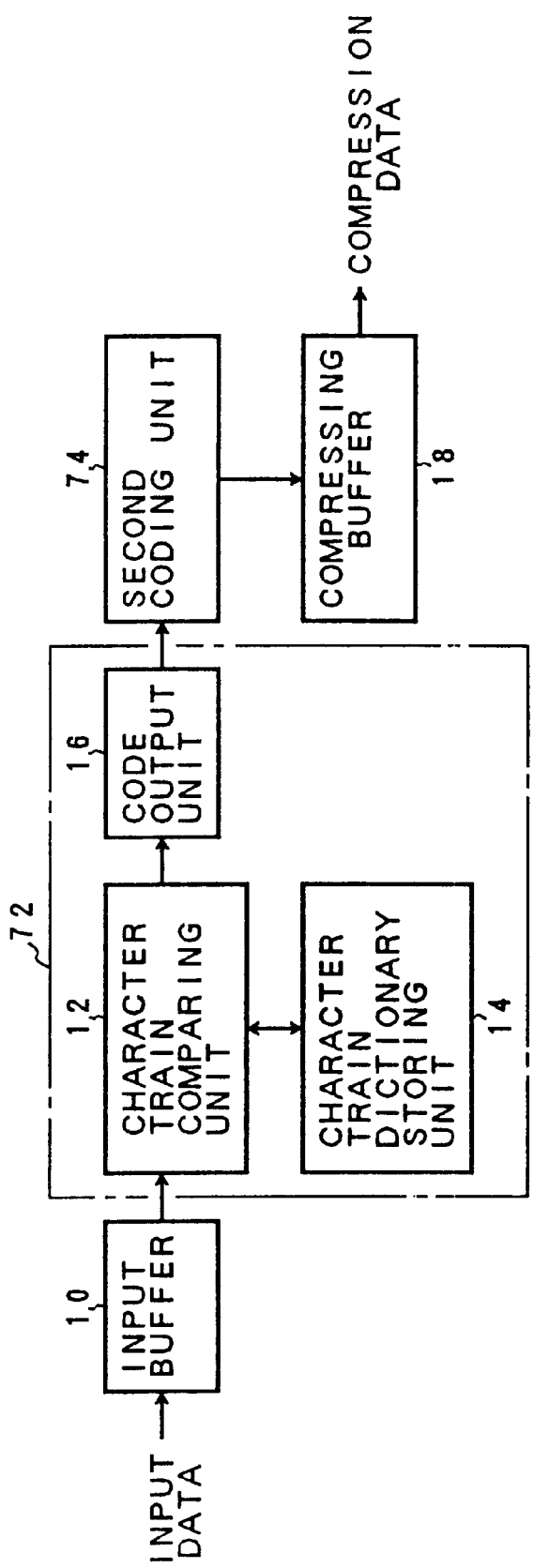
FIG. 15 is a block diagram of a data compressing apparatus for performing a double coding for further coding a character train code which was coded in FIG. 3.

FIG. 15 is characterized by performing a double coding process for further executing a coding in which the character train code obtained by the coding to allocate the character train code of 17 bits to the character train of the word in FIG. 3 is used as an intermediate code. In a data compressing apparatus, a first coding unit 72 is provided subsequently to the input buffer 10. The first coding unit 72 comprises the character train comparing unit 12, character train dictionary storing unit 14, and code output unit 16 in a manner similar to the data compressing apparatus in FIG. 3. Subsequent to the first coding unit 72, a second coding unit 74 is provided. An intermediate code which was coded as a character train code is further coded by the first coding unit 72 and is extracted as compression data through the compression buffer 18.

FIG. 16 shows a specific example of the second coding unit 74 in FIG. 15. In the embodiment, a dictionary type coding unit 74-1 is used as a second coding unit 74. The dictionary type coding unit 74-1 is constructed by a compressing dictionary referring unit 75, a compressing dictionary storing unit 76, and a coding unit 77. As a dictionary type coding unit 74-1, for example, LZ77 or LZ78 is used.

FIG. 17 shows another embodiment of the second coding unit 74 in FIG. 15. A statistic type coding unit 74-2 is used. Specifically speaking, an arithmetic operation coding is executed as a representative example of a statistic type coding having a probability model unit 78 and an arithmetic coding unit 80.

The character train dictionary storing unit 14 provided for the first coding unit 72 in FIG. 15 can use the dictionary structure of either FIG. 5 or FIG. 7. Therefore, a coding process for data compression in case of using the dictionary structure of FIG. 5 is as shown in flowcharts of FIGS. 18A and 18B.

Figure 6B:
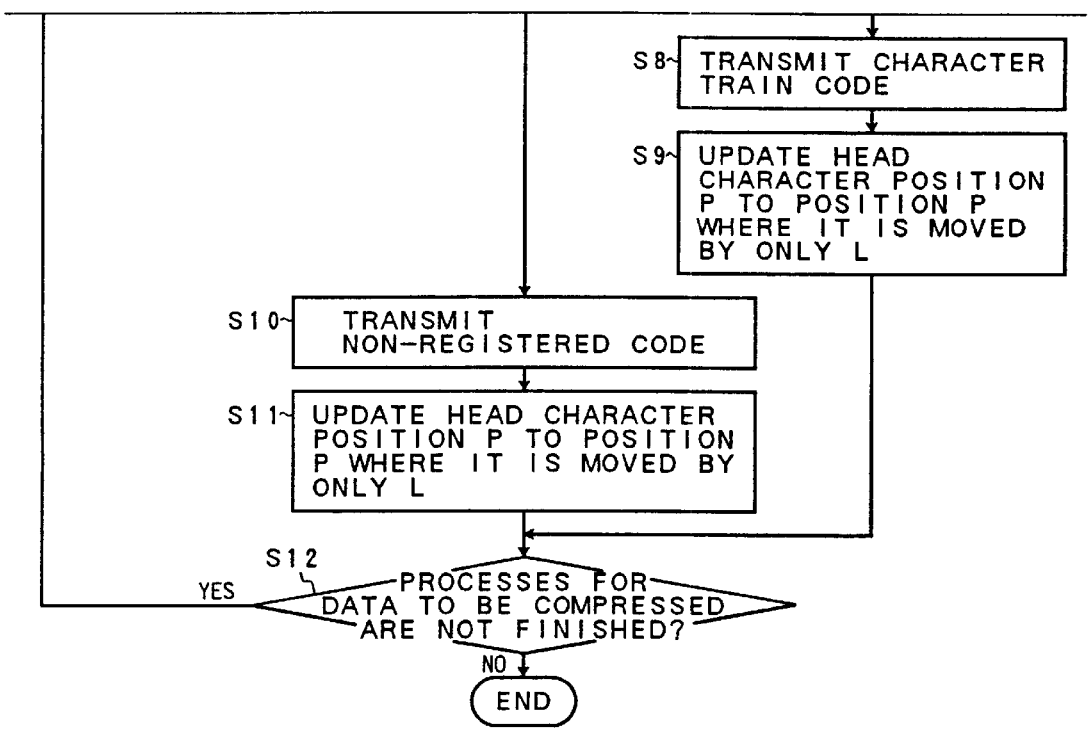
Figure 18B:
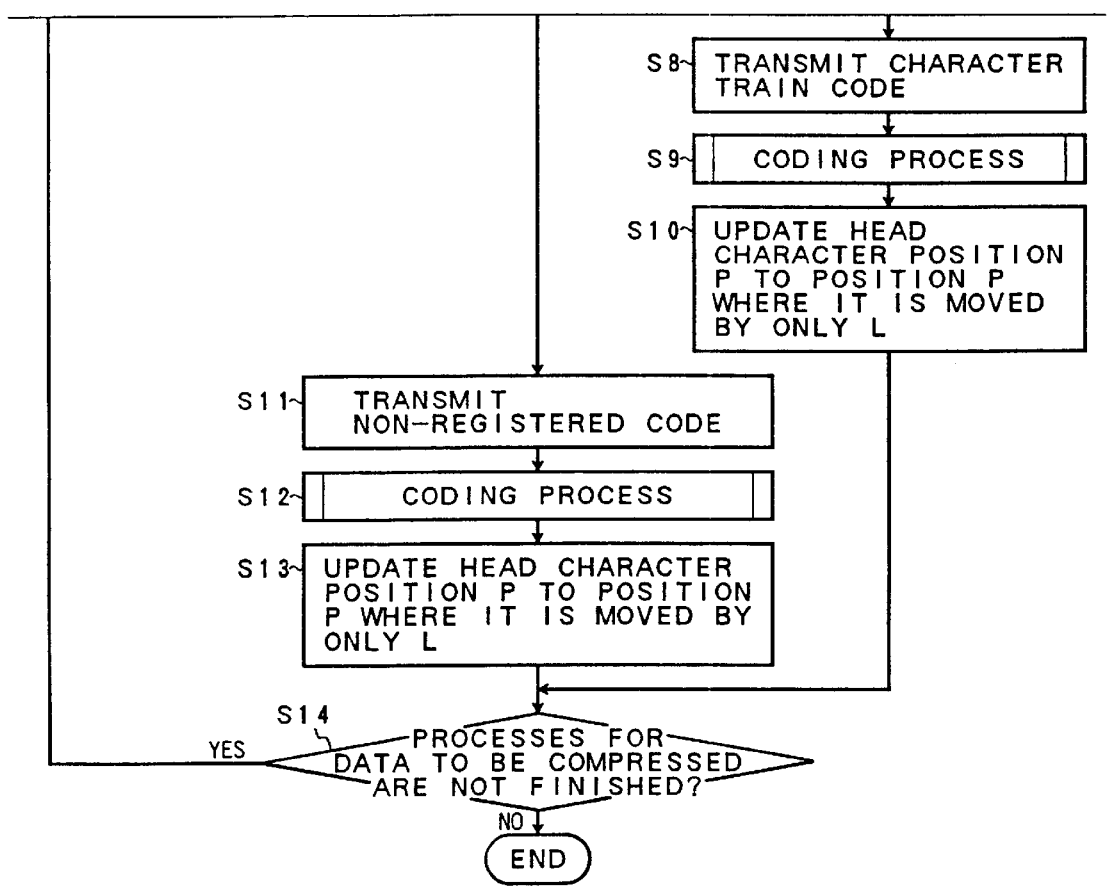

The flowcharts of FIGS. 18A and 18B are substantially the same as those of FIGS. 6A and 6B except for a coding process in steps S9 and S12. The coding process in steps S9 and S12 in FIGS. 18A and 18B becomes a process for inputting the character train code obtained in the first coding unit 72 from the second coding unit 74 in FIG. 15 as an intermediate code and, further, coding by the dictionary type coding of FIG. 16 or the statistic type coding of FIG. 17. A coding process in case of using the dictionary structure of FIG. 7 for the character train dictionary storing unit 14 in FIG. 15 is as shown in flowcharts of FIGS. 19A and 19B. The flowcharts for the coding process of FIGS. 19A and 19B are substantially the same as that for the coding process of FIGS. 8A and 8B except for a coding process in steps S9 and S12. The coding process in steps S9 and S12 becomes the process for the dictionary type coding or statistic type coding by the second coding unit 74 in FIG. 15. By executing the coding process at two stages as mentioned above, a compression ratio can be further raised.

Figure 20:
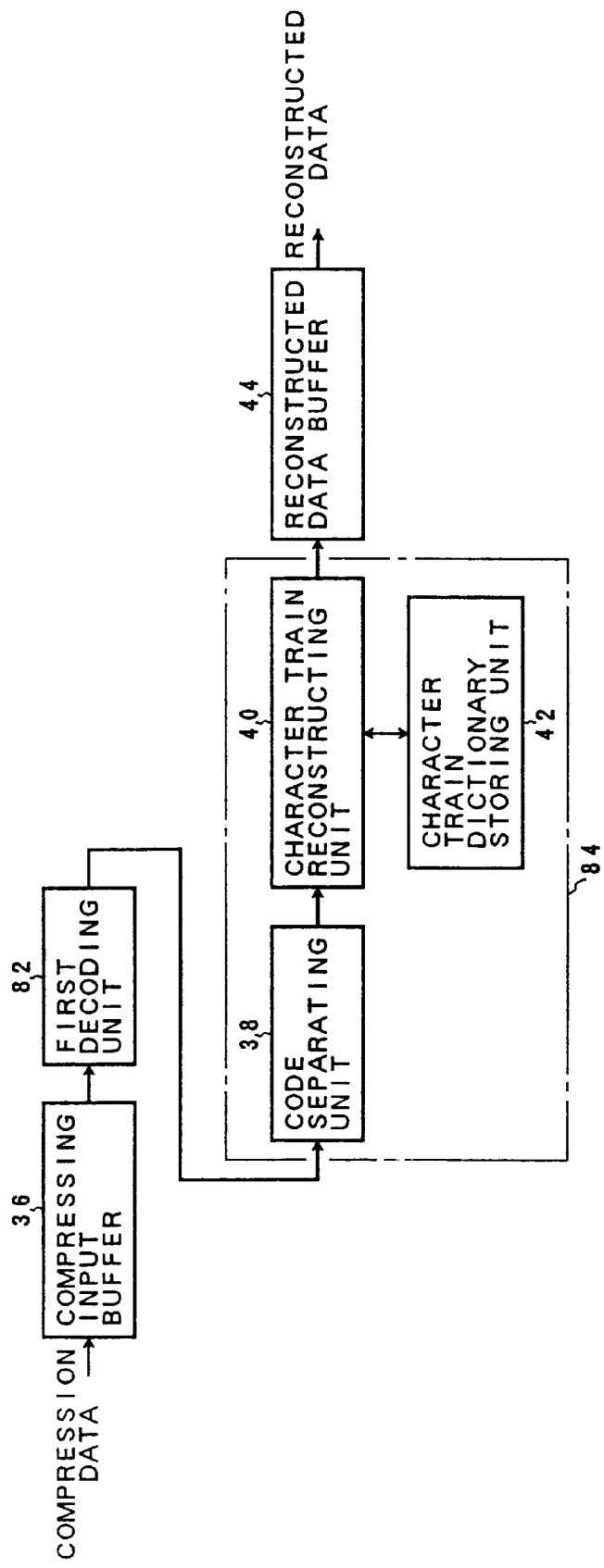
FIG. 20 is a block diagram of a data reconstructing apparatus for reconstructing compression data which was double coded in FIG. 15.

FIG. 20 is a block diagram of a data reconstructing apparatus for reconstructing the compression data obtained by the double coding of FIG. 15. In the data reconstructing apparatus, a first decoding unit 82 is provided subsequently to the compressing input buffer 36 and a second decoding unit 84 is provided subsequently to the first decoding unit 82, thereby finally obtaining reconstruction data in the reconstructed data buffer 44. The first decoding unit 82 is constructed by, for example, a dictionary type decoding unit 82-1 of FIG. 21 or a statistic type decoding unit 82-2 of FIG. 22. The dictionary type decoding unit 82-1 of FIG. 21 comprises a decoding unit 85, a decoding dictionary referring unit 86, and a decoding dictionary storing unit 87 and executes a decoding process of LZ77, LZ78, or the like. The statistic type decoding unit 82-2 of FIG. 22 comprises an arithmetic decoding unit 88 and a probability model unit 90 and executes an arithmetic decoding process corresponding to an arithmetic coding as a representative of a probability statistic type coding.

Figure 23:
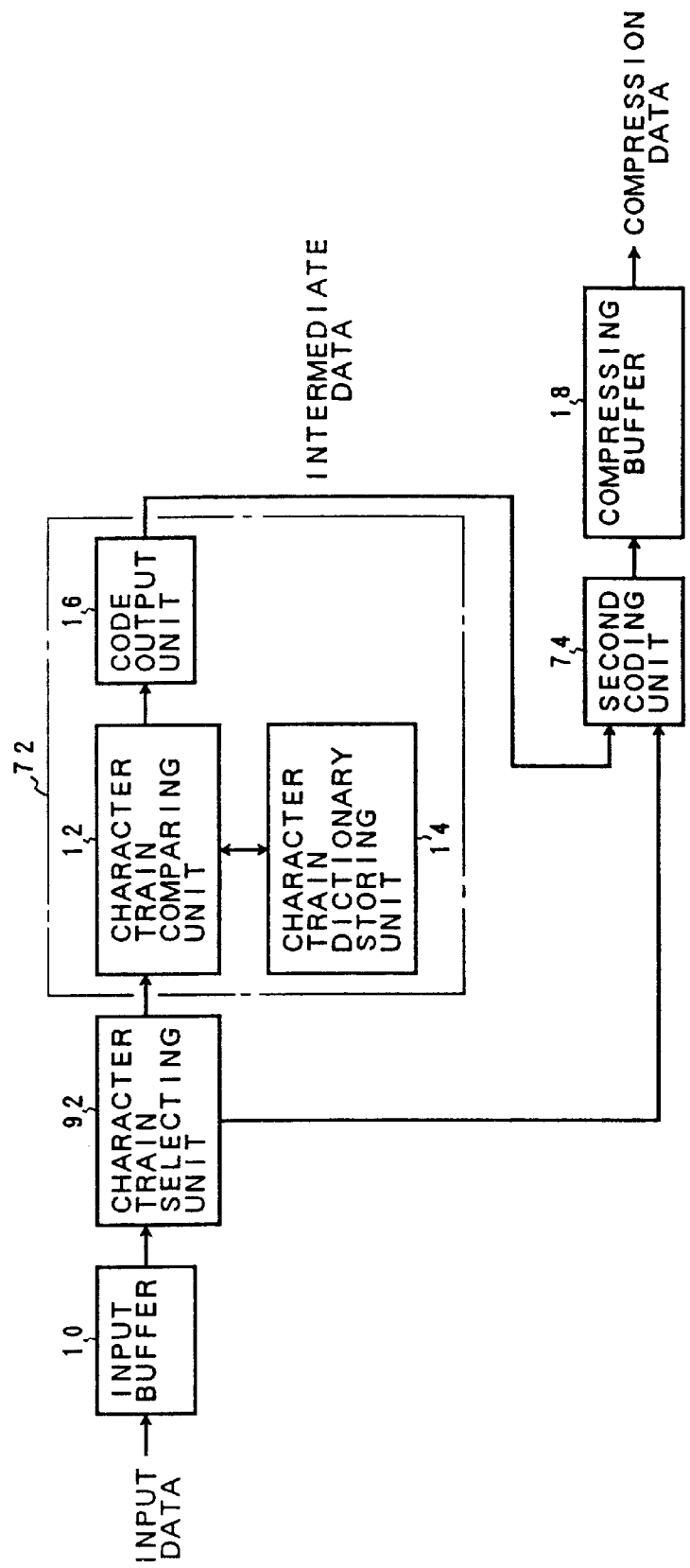
FIG. 23 is a block diagram of a data compressing apparatus for double coding Japanese data and single coding English data with respect to a data compression in FIG. 15.

FIG. 23 is a modification of the data compressing apparatus for performing the double decoding in FIG. 15. A character train selecting unit 92 is provided between the input buffer 10 and first coding unit 72. There is a case where an English character train and the like besides the Japanese character train are included in the Japanese document data as a compression target which is inputted to the input buffer 10. As for the English character train, since the dictionary in the character train dictionary storing unit 14 provided in the first coding unit 72 is not adapted, if it is coded as it is, there is an inconvenience such that a data amount after the coding is larger than the original data amount. To prevent such a problem, in the character train selecting unit 92, a Japanese character code and an English alphabet character code are discriminated, the character train of the Japanese character code is selected and inputted to the first coding unit 72, and the English character train is directly inputted to the second coding unit 74 and is coded. Therefore, the coding by the first coding unit 72 and second coding unit 74 is performed with respect to the Japanese character train and the coding by only the second coding unit 74 is executed with respect to the English character train. Since such a coding is adapted to the character kind, it is possible to prevent that the data amount after completion of the coding is larger than the original data amount.

FIG. 24 is a block diagram of a data reconstructing apparatus for reconstructing the compression data coded by the data compressing apparatus of FIG. 23. In the data reconstructing apparatus, a character train selecting unit 94 is provided subsequently to the first decoding unit 82. In the case where the intermediate code reconstructed by the first decoding unit 82 is a character code of an alphabet showing an English sentence, it is outputted as it is to the reconstructed data buffer 44. On the other hand, when the intermediate code is a Japanese character train code, it is inputted to the second decoding unit 84. The Japanese character train is reconstructed by using the code separating unit 38, character train reconstructing unit 40, and character train dictionary storing unit 42 and, after that, it is stored into the reconstructed data buffer 44.

Figure 25:
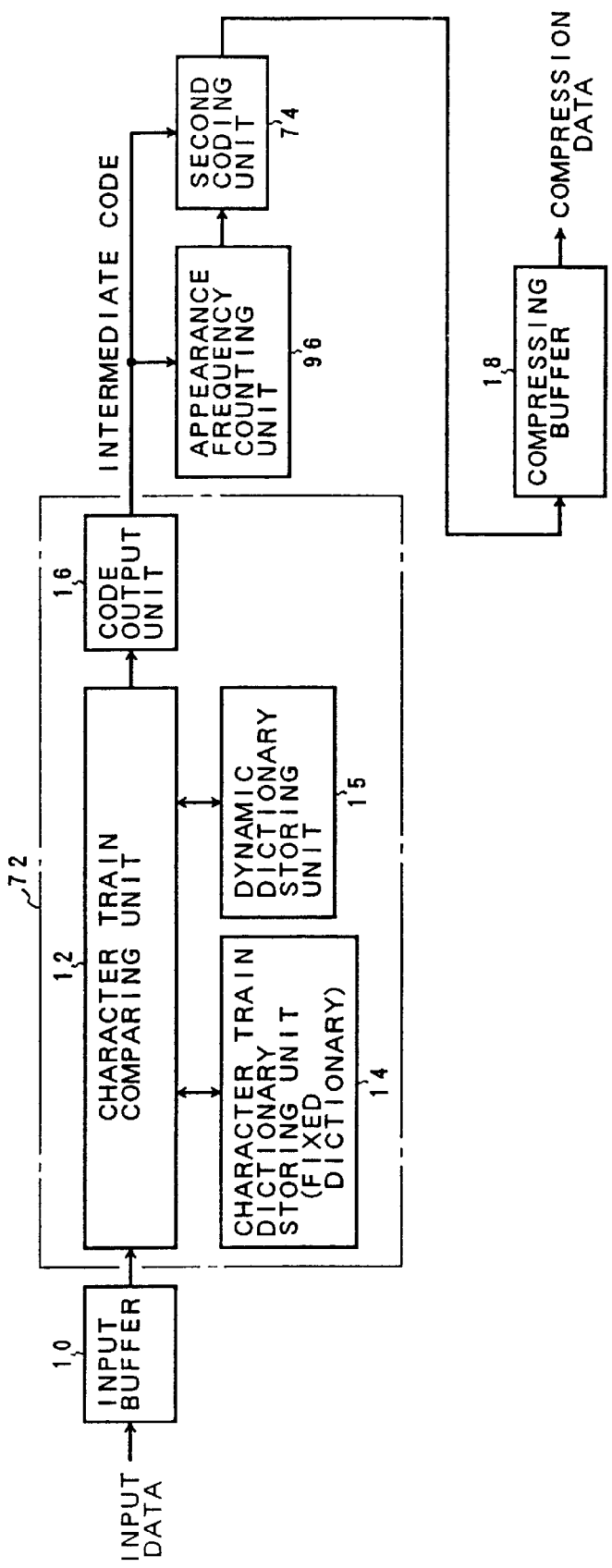
FIG. 25 is a block diagram of a data compressing apparatus having a dynamic dictionary storing unit with regard to the data compression in FIG. 15.

FIG. 25 is a block diagram of a data compressing apparatus in which a dynamic dictionary storing unit is provided for the first coding unit 72 provided in the data compressing apparatus of the double coding unit in FIG. 15. Although the data compressing apparatus is fundamentally the same as FIG. 15, in addition to the character train dictionary storing unit 14, the dynamic dictionary storing unit 15 is further provided for the character train comparing unit 12 of the first coding unit 72. Moreover, an appearance frequency counting unit 96 for inputting the intermediate code coded by the first coding unit 72 and counting an appearance frequency of the intermediate code is provided. The appearance frequency counted by the appearance frequency counting unit 96 is supplied to the second coding unit 74. Therefore, as a second coding unit 74, with respect to any one of the dictionary type coding and the statistic type coding, an adaptive coding such that a frequency is again calculated each time a character appears and a short code length is allocated to the character of a high appearance frequency in accordance with the appearance frequency which was calculated again is executed. The dynamic dictionary storing unit 15 provided for the first coding unit 72 has the same dictionary structure as that in FIG. 12 and each time a coding output is performed, the code is sequentially registered. By providing such a dynamic dictionary storing unit 15, the coding to the character train code in the first coding unit 72 can be performed at a high speed.

FIG. 26 is a block diagram of a data reconstructing apparatus for reconstructing the compression data coded by the data compressing apparatus of FIG. 23. In the data reconstructing apparatus, in addition to the character train dictionary storing unit 42, the dynamic dictionary storing unit 45 is newly provided for the second decoding unit 84 provided subsequently to the first decoding unit 82. As a dynamic dictionary storing unit 45, the same unit as that in FIG. 14 is used. The processing operation of the second decoding unit having the dynamic dictionary storing unit 45 is fundamentally the same as that of the data reconstructing apparatus of FIG. 13. Further, the character train reconstructed by the second decoding unit 82 is inputted to an appearance frequency counting unit 98. An appearance frequency of the character train is counted and supplied to the first decoding unit 82. Therefore, as a first decoding unit 82, an adaptive decoding such that a frequency is calculated again each time a character train appears and a variable length code is allocated in accordance with the appearance frequency which was calculated again is executed.

(Compression and Reconstruction of the Second Invention)

FIG. 27 is a block diagram of a data compressing apparatus in which words are classified into attribute groups, specifically speaking, attribute groups of every part of speech in the compression of Japanese document data, a character train attribute code comprising a combination of an attribute code showing the attribute group and a character train code indicative of the number of character trains in the attribute group is allocated, and the compression is performed.

The data compressing apparatus comprises an input buffer 100, a character train comparing unit 102, a character train attribute dictionary storing unit 104, a code output unit 106, and a compressing buffer 108. Thirteen kinds of parts of speech as an examination result of the Japanese dictionary shown in FIG. 4 are set to attribute groups and a character train code as a number of each attribute group is allocated to word character trains of the number as many as the number of morphemes showing the number of words included in each attribute group and is registered in the character train attribute dictionary storing unit 104.

FIG. 28 shows the number of words, the number of attribute information bits, the number of word information bits, and the total number of bits with respect to the 13 kinds of parts of speech in FIG. 4. First, since the number of kinds of parts of speech is equal to 13, the number of attribute information bits which are used for allocation of the attribute codes can be expressed by four bits. On the other hand, the number of word information bits to allocate a character train code to a code is equal to the number of bits according to the number of words of each part of speech. Among them, the number of words of the noun class is the largest and the number of word bits of the noun class is equal to 17. On the other hand, from FIG. 4, with respect to the post positional word class in which the total number in a document is the largest, the number of words is small to be 171 and the number of word information bits can be expressed by 8 bits. Further, the number of words of the verb class is equal to 14,638 and the number of word information bits in this case is equal to 14. With respect to the other parts of speech class as well, as shown in FIG. 28, they can be expressed in a range of 8 to 14 bits. Thus, the total number of bits in which the number of attribute information bits which give the attribute code and the number of word information bits which give the character train code are added is equal to 21 in case of the noun class in which the number of words is the largest and is equal to 11 in case of the interjection class in which the number of words is the smallest. Therefore, with respect to the other parts of speech excluding the noun class and verb class in which the total number of bits exceeds 17, it is sufficient to use the bits of the number smaller than that of the character train code of 17 bits used in the data compressing apparatus in FIG. 3. By the data compressing apparatus in which the code added with the character train code is allocated every attribute unit in FIG. 27, a compression ratio can be eventually further raised.

FIGS. 29A and 29B show a dictionary construction of the character train attribute dictionary storing unit 104 in FIG. 27. The character train attribute dictionary storing unit 104 has a double layer structure of a head character storing unit 110 and a dependent character train storing unit 112. In the head character storing unit 110, a character code 114 of a head character to be coded is used as an index and a head address 116 of the dependent character train storing unit 112 and the number of dependent character trains (118) have been stored. A length of dependent character train (120), a dependent character train 122, a character train code 124, and further, an attribute code 126 have been stored in the dependent character train storing unit 112. The dictionary structure of the character train attribute dictionary storing unit 104 differs with respect to a point that an attribute code is newly added to the dictionary structure in which a code is allocated to only the character train code shown in FIG. 5. It will be obviously understood that the character train code 124 is the number in which the number of words of the attribute group of each part of speech shown in FIG. 28 is set to the maximum value. For example, the number of words is equal to 14,638 in case of the verb class and the number of bits of the character train code 124 is equal to 14. The character train codes of 14 bits within a range from "all 0" to "all 1" are allocated to each of the verb character trains comprising a combination of the head characters and dependent character trains included in the 14,638 verb classes. A code "NULL" of the dependent character train 122 in the dependent character train storing unit 112 relates to the case where there is no dependent character train. In this case, a coupling code of the character train code and the attribute code is allocated to the code and is outputted with respect to the head character. In the case where the words are classified into the attribute groups corresponding to 13 kinds of parts of speech, the attribute code is set to four bits. However, for example, it is also possible to construct such that eight kinds of parts of speech among 13 kinds of parts of speech are included into the attribute groups and the remaining kinds of parts of speech are not coded but the original character codes are used as they are.

FIGS. 30A and 30B show a coding process by the data compressing apparatus of FIG. 27 using the dictionary structure of FIGS. 29A and 29B. An input character train in FIG. 30A is collated with a combination of the head character and the dependent character in the character train attribute dictionary storing unit 104 shown in FIGS. 29A and 29B every character trains 128-1 to 128-$n$ showing words. When they coincide, the character train code 124 and attribute code 126 stored in the dependent character train storing unit 112 are combined and output codes 130-1 to 130-$n$ in FIG. 30B are generated.

The storage byte length (M) in the dependent character train storing unit 112 in the dictionary structure in FIGS. 29A and 29B can be shown by, for example, the following equation.

$$\begin{aligned} \text{Storage byte length } M &= \text{length} + \text{character train} + \\ &\quad \text{character train code} + \\ &\quad \text{attribute code} \\ &= 3 \text{ bits} + 96 \text{ bits} + 7 \sim 17 \text{ bits} + \\ &\quad 4 \text{ bits} \\ &= 110 \sim 120 \text{ bits} \\ &= 15 \text{ bytes} \end{aligned} \quad (8)$$

Since the character train code 124 changes in a range from 7 bits to 17 bits as shown in the number of word information bits in FIG. 28, 110 to 120 bits are necessary as a storage byte length. However, it is not limited to the variable length but 15 bytes corresponding to 120 bits of the maximum storage length is set to the storage byte length (M).

FIGS. 31A and 31B are flowcharts for the coding process of the data compressing apparatus in FIG. 27 using the dictionary structure of FIGS. 29A and 29B. The processes of this flowchart are substantially the same as the coding process in case of allocating only the character train code shown in FIGS. 6A and 6B to the code except for a case of transmitting the attribute code and character train code obtained by the detection of the coincidence with the character train registered in the character train attribute dictionary storing unit 104 in steps S8 and S10.

Figure 32A:
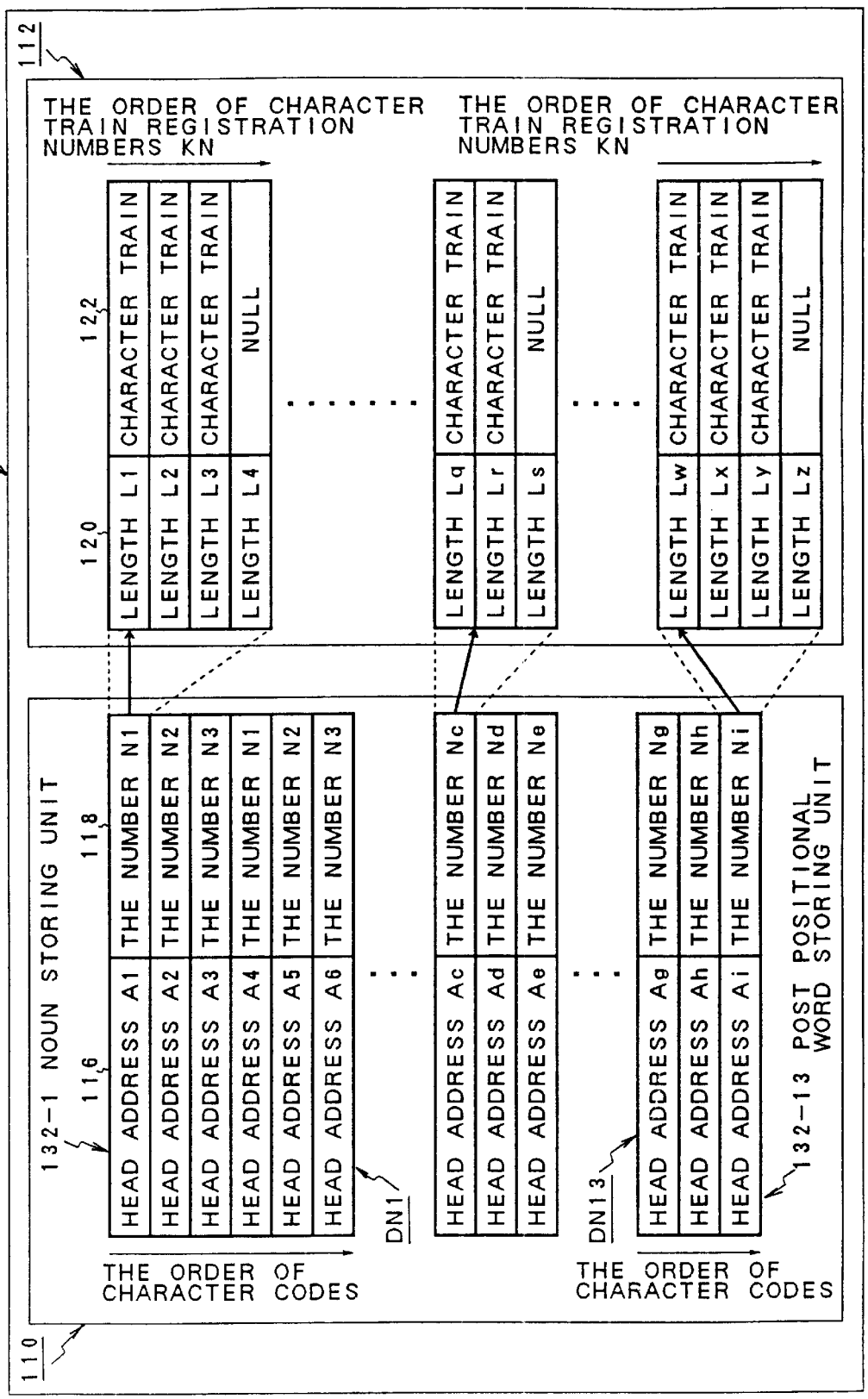

FIG. 32A shows another dictionary structure of the character train attribute dictionary storing unit 104 in FIG. 27. In the dictionary structure, the head character storing unit 110 is divided into 13 groups in correspondence to 13 kinds of parts of speech shown in FIG. 28 and is constructed by a noun storing unit 132-1, a verb storing unit 132-2, an adjective storing unit 132-3, an adjective verb storing unit 132-4, an adverb storing unit 132-5, a participial adjective storing unit 132-6, a conjunction storing unit 132-7, a prefix storing unit 132-8, a suffix storing unit 132-9, a words' ending storing unit 132-10, an auxiliary verb storing unit 132-11, an interjection storing unit 132-12, and a post positional word storing unit 132-13. The verb storing unit 132-2 to the interjection storing unit 132-12 are not shown.

Dictionary numbers DN1 to DN13 are provided for the noun storing unit 132-1 to post positional word storing unit 132-13, respectively. The head address 116 and the number of dependent character trains (118) for the dependent character train storing unit 112 are stored every dictionary numbers DN1 to DN13 in accordance with the order of the character codes. In the dependent character train storing unit 112, only the length of dependent character train (120) and dependent character train 122 are registered and the attribute code and character train code which are allocated to the code due to the coincidence detection of the dependent character train are not stored. In place of the attribute code and character train code which are not allocated, as for the attribute code, the dictionary numbers DN1 to DN13 allocated to each of the noun storing unit 132-1 to the post positional word storing unit 132-13 in the head character storing unit 110 are used as 4-bit information. On the other hand, the character train registration number $K_N$ in each storage group in the dependent character train storing unit 112 which has been grouped every dictionary numbers DN1 to DN13 is allocated to the character train code. The storage byte length (M) in the dependent character train storing unit 112 is given by, for example, the following equation.

$$\begin{aligned}\text{Storage byte length } M &= \text{length} + \text{character train} \quad (9)\\ &= 3 \text{ bits} + 96 \text{ bits}\\ &= 99 \text{ bits}\\ &= 13 \text{ bytes}\end{aligned}$$

In this case, the character train registration number $K_N$ in the dependent character train storing unit 112 belonging to an arbitrary attribute group is defined by the following equation.

$$K=(X-AA)/M \quad (10)$$

where,

X: Storing address in the dependent character
   train storing unit
   X = M × the number (N) of coincident
   dependent character trains
AA: start address of the division storing unit
   of the dictionary number DN
   (offset value which changes depending on
   the attribute)
N: numbers (1, 2, 3, ..., N) of the coincidence
   detected dependent character trains
M: storage byte length in the dependent
   character train storing unit The start address AA in the dependent character train storing unit 112 has been predetermined as shown in FIG. 32B in correspondence to each of the dictionary numbers DN corresponding to the attribute codes of the noun storing unit 132-1 to the post positional word storing unit 132-13 in the head character train storing unit 110. Therefore, by using the head character and the start address AA in the dependent character train storing unit 112 which is obtained from the dictionary number DN1 when the coincidence of the dependent character train is obtained by referring to the dictionary, the character train registration number $K_N$ in the relevant attribute group can be calculated by the equation (10).

Figure 33B:
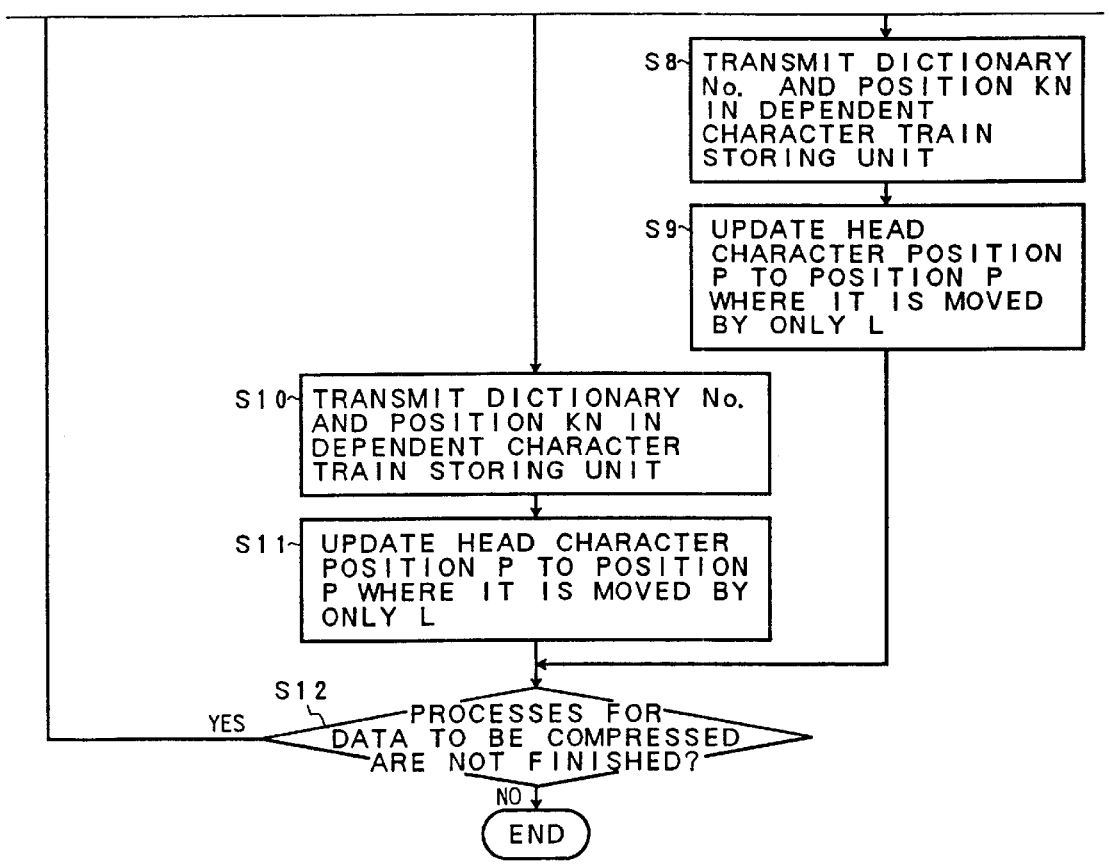

FIGS. 33A and 33B are flowcharts for the coding process of the data compressing apparatus in FIG. 27 using the dictionary structure of FIG. 32A. The code allocation when the coincidence of the character trains registered in the dictionary can be detected in steps S8 and S10 is the same as that in the flowcharts of FIGS. 31A and 31B except for a point that the dictionary number DN is allocated with respect to the attribute code and the character train registration number $K_N$ in the dependent character train is allocated to the character train code.

Figure 34:
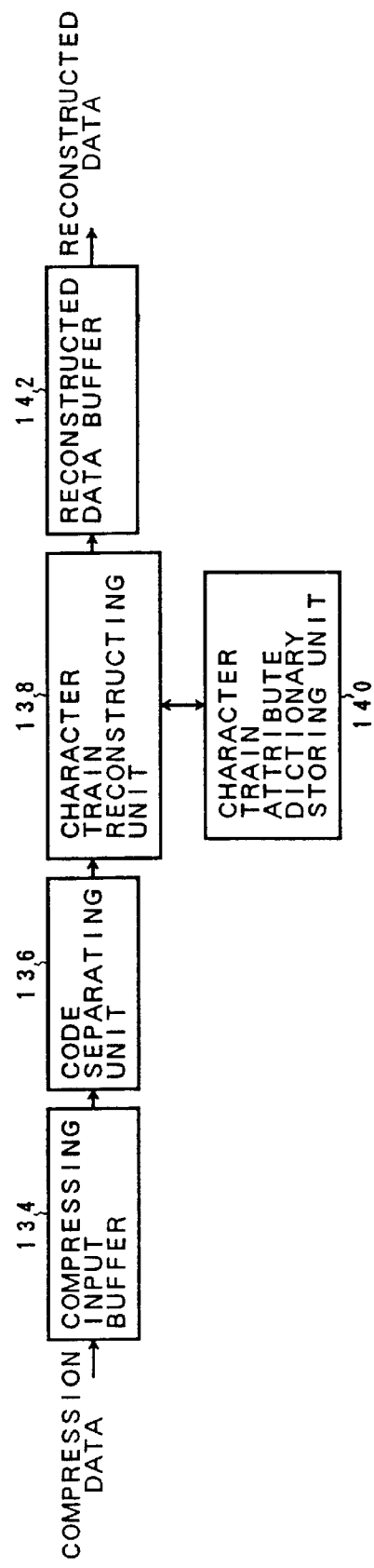
FIG. 34 is a block diagram of a data reconstructing apparatus for reconstructing the compression data coded in FIG. 27.

FIG. 34 is a block diagram of a data reconstructing apparatus for reconstructing the compression data decoded by the data compressing apparatus in FIG. 27. The data reconstructing apparatus comprises a compressing input buffer 134, a code separating unit 136, a character train reconstructing unit 138, a character train attribute dictionary storing unit 140, and a reconstructed data buffer 142. The code separating unit 136 extracts a code comprising a combination of the attribute code and the character train code from the code train of the compression data inputted from the compressing input buffer 134, and separates into an attribute code of 4 bits and remaining character train codes. In the actual apparatus, the character train code is constructed by up to 17 bits. By combining four bits of the attribute code, total 21 bits are derived. However, to simplify the processes, the character train code is outputted as 3-byte data. In the code separating unit 136, therefore, the code trains are extracted on a 3-byte unit basis from the code trains of the compression data. The head four bits are separated as an attribute code. The remaining 17 bits are separated as a character train code. On the basis of the dictionary number DN and the character train code K or character train registration number $K_N$ which are given by the attribute codes separated by the code separating unit 136, the character train reconstructing unit 138 obtains the position address X of the storing position in the character train attribute dictionary storing unit 140 from the following equation.

$$X=M\cdot K+AA \quad (11)$$

where,

N: character train code (=character train
   registration number $K_N$)
A1: start address at the storing position
M: storage byte length (fixed)

Figure 35:
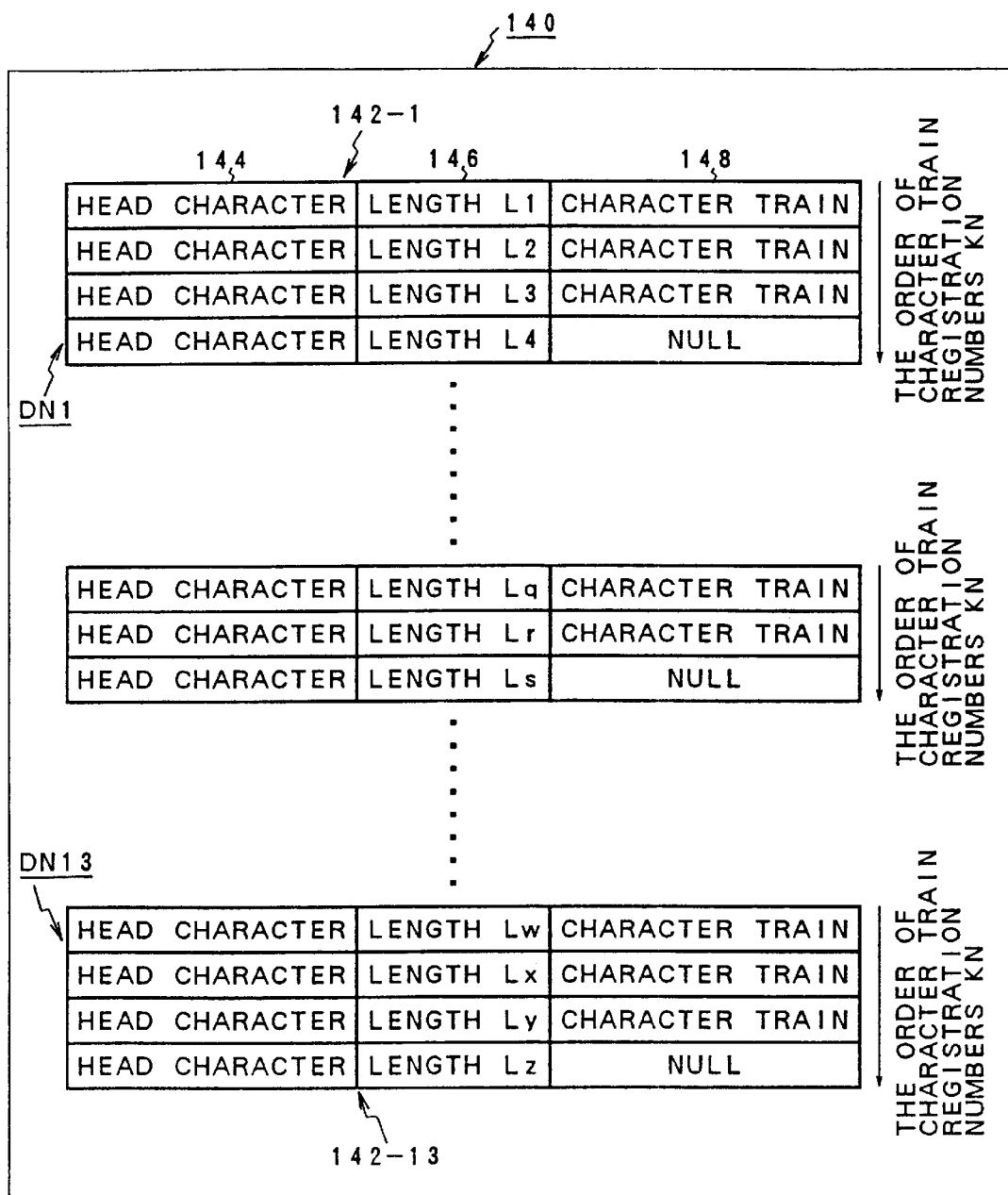
FIG. 35 is an explanatory diagram of a dictionary structure of a character train attribute dictionary storing unit provided in FIG. 34.

FIG. 35 is a dictionary structure of the character train attribute dictionary storing unit 140 in FIG. 34. For every dictionary numbers DN1 to DN13, the character train attribute dictionary storing unit 140 is constructed by a noun storing unit 142-1, a verb storing unit 142-2, an adjective storing unit 142-3, an adjective verb storing unit 142-4, an adverb storing unit 142-5, a participial adjective storing unit 142-6, a conjunction storing unit 142-7, a prefix storing unit 142-8, a suffix storing unit 142-9, a words' ending storing unit 142-10, an auxiliary verb storing unit 142-11, an interjection storing unit 142-12, and a post positional word storing unit 142-13. The verb storing unit 142-2 to interjection storing unit 142-12 are not shown. The dictionary numbers DN1 to DN13 are respectively allocated to the noun storing unit 142-1 to the post positional word storing unit 142-13. A head character 144 and the subsequent dependent character train 148 are registered in accordance with the order of the character train codes in the group of each part of speech. Further, a length of dependent character train (146) is registered. The storage byte length (M) is obtained as follows.

$$\begin{aligned}\text{Storage byte length } M &= \text{head character} + \text{length} + \\ &\quad \text{character code train} \\ &= 16 \text{ bits} + 3 \text{ bits} + 96 \text{ bits} \\ &= 115 \text{ bits} \\ &= 15 \text{ bytes}\end{aligned} \quad (12)$$

The head address AA of each of the storing units 142-1 to 142-10 has been predetermined as shown in FIG. 32B in correspondence to the dictionary numbers DN1 to DN13. Therefore, by obtaining the head address AA from the separated attribute information and substituting the head address AA and the obtained character train code (K) into the equation (11), one address (X) corresponding to the character train code (K) can be obtained.

(Compression and Reconstruction by the Double Coding of the Second Invention)

Figure 36:
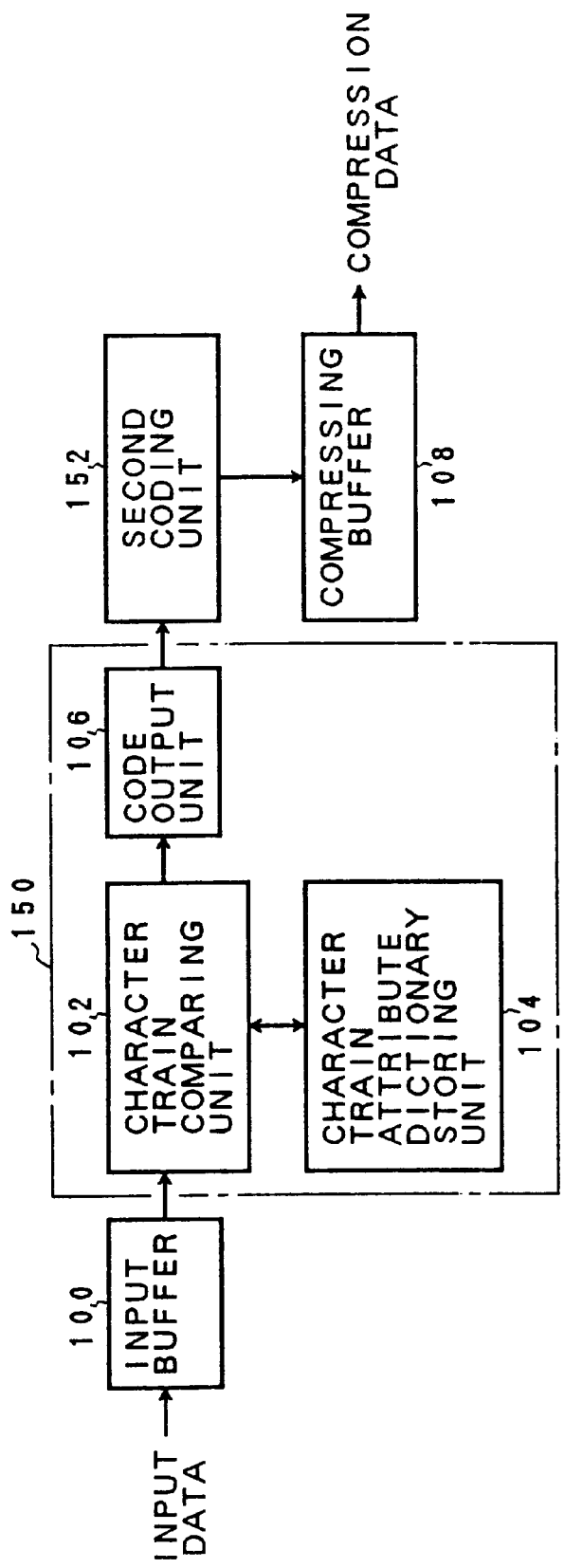
FIG. 36 is a block diagram of a data compressing apparatus for performing a double coding for further coding the code in the second coding unit which was coded in FIG. 27.

FIG. 36 shows a data compressing apparatus for further performing a coding at the second stage by using a combination code of the attribute code and character train code which were coded by the data compressing apparatus in FIG. 27 as an intermediate code. That is, subsequent to the input buffer 100, a first coding unit 150 is provided. In a manner similar to the data compressing apparatus in FIG. 27, the first coding unit 150 comprises the character train comparing unit 102, character train attribute dictionary storing unit 104, and a code output unit 106. Subsequent to the first coding unit 150, a second coding unit 152 is provided. Finally, the compressing buffer 108 is provided. As a second coding unit 152, a dictionary type coding unit 152-1 in FIG. 37 or a statistic type coding unit 152-2 in FIG. 38 is used. The dictionary type coding unit 152-1 comprises a compressing dictionary referring unit 154, a compressing dictionary storing unit 155, and a coding unit 156 and LZ77 or LZ78 is used. The statistic type coding unit 152-2 in FIG. 38 is constructed by a probability model unit 157 and an arithmetic coding unit 158 and executes an arithmetic coding as a representative coding method of the statistic type coding methods. In such a second coding unit 152 in FIG. 36 in which the dictionary type coding or statistic type coding is executed, since the data is inputted and coded on a byte unit basis, it is necessary that the code comprising a combination of the attribute code and character train code which is outputted from the first coding unit 150 is set to byte data corresponding to a multiple of 8 bits.

Figure 39B:
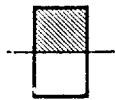

FIGS. 39A and 39B collectively show the number of attribute information bits in the attribute group of the part of speech in FIG. 28, the number of dummy bits for converting the number of word information bits into byte information of a multiple of 8 bits, and the total number of bits obtained by the addition of the dummy bits and the number of bytes. As will be obviously understood from FIGS. 39A and 39B, with respect to 13 kinds of attribute groups from the noun class to the interjection class, it is sufficient that the number of bytes of the code comprising a combination of the attribute code showing the attribute information and the character train code showing the number in the attribute group is set to either two bytes or three bytes. That is, with regard to the noun class and the verb class in which the number of words is large, the code is set to the 3-byte code. With respect to all of the other classes, the code is set to the 2-byte code.

FIGS. 40A and 40B show a conversion to the byte data when outputting the code from the first coding unit 150 in FIG. 36. That is, with respect to an input character train in FIG. 40A, the character trains 128-1 to 128-$n$ of the word unit are inputted, thereby forming intermediate codes 160-1 to 160-$n$ comprising combinations of attribute codes 126-1 to 126-$n$ and character train codes 124-1 to 124-$n$ as intermediate codes in FIG. 40B by the first coding unit 150. In this case, in order to convert into the byte data as a multiple of 8 bits, dummy bits 162-1 and 162-2 are added as necessary. In case of the intermediate code 160-$n$, for example, since it is constructed by 16 bits like an adjective verb class in FIG. 28, there is no need to add the dummy data.

Figure 41B:
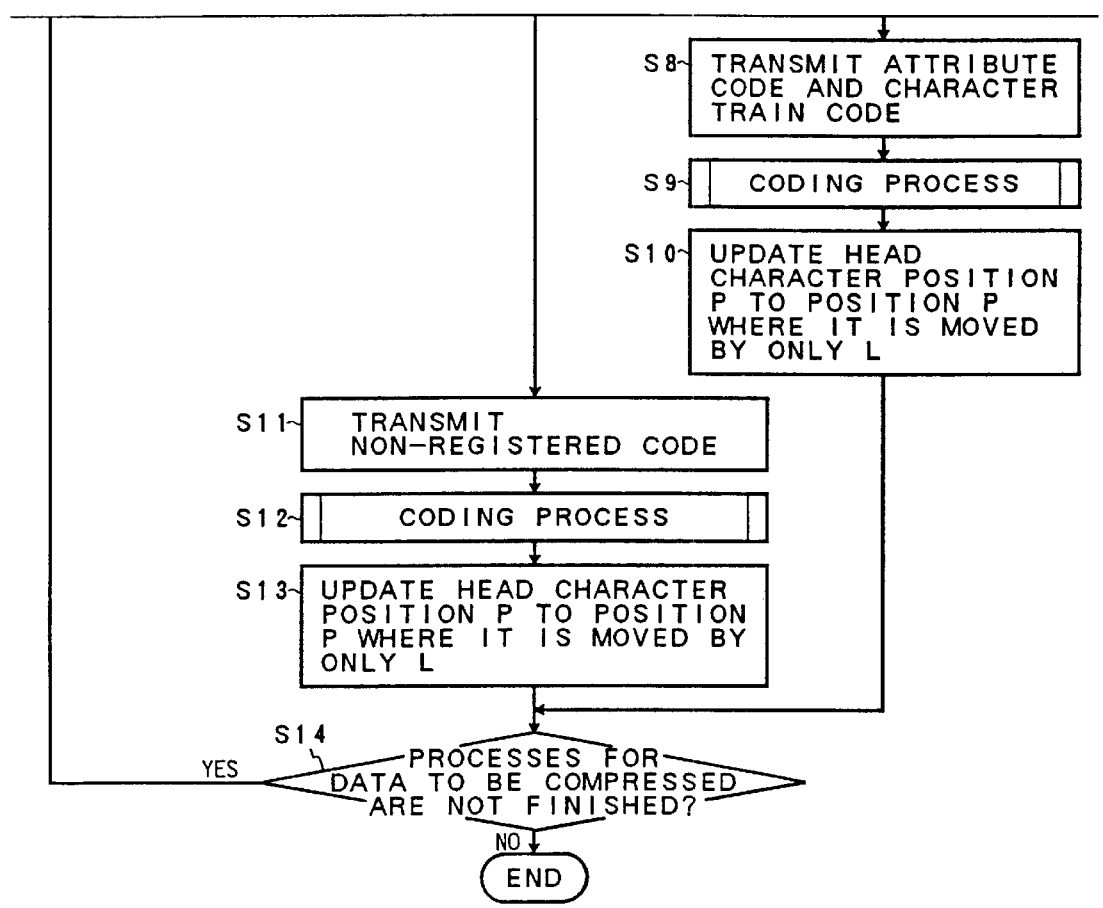

FIGS. 41A and 41B are flowcharts for the coding process in the data compressing apparatus in FIG. 36. A coding process in steps S9 and S12 is the dictionary type coding or statistic type coding by the second coding unit 152. The other processes are the processes by the first coding unit 150 and is the same as the process in FIGS. 31A and 31B. The flowchart of FIGS. 41A and 41B relates to the case of using the dictionary structure of FIGS. 29A and 29B as a character train attribute dictionary storing unit 104 provided in the first coding unit 150 in FIG. 36.

Flowcharts of FIGS. 42A and 42B relate to the case of using the dictionary structure of FIG. 32 as a character train attribute dictionary storing unit 104 provided in the first coding unit 150 in FIG. 36. A coding process in steps S9 and S12 is the coding process by the second coding unit 152 in FIG. 36 and the other processes are the same as those in FIGS. 33A and 33B.

Figure 43:
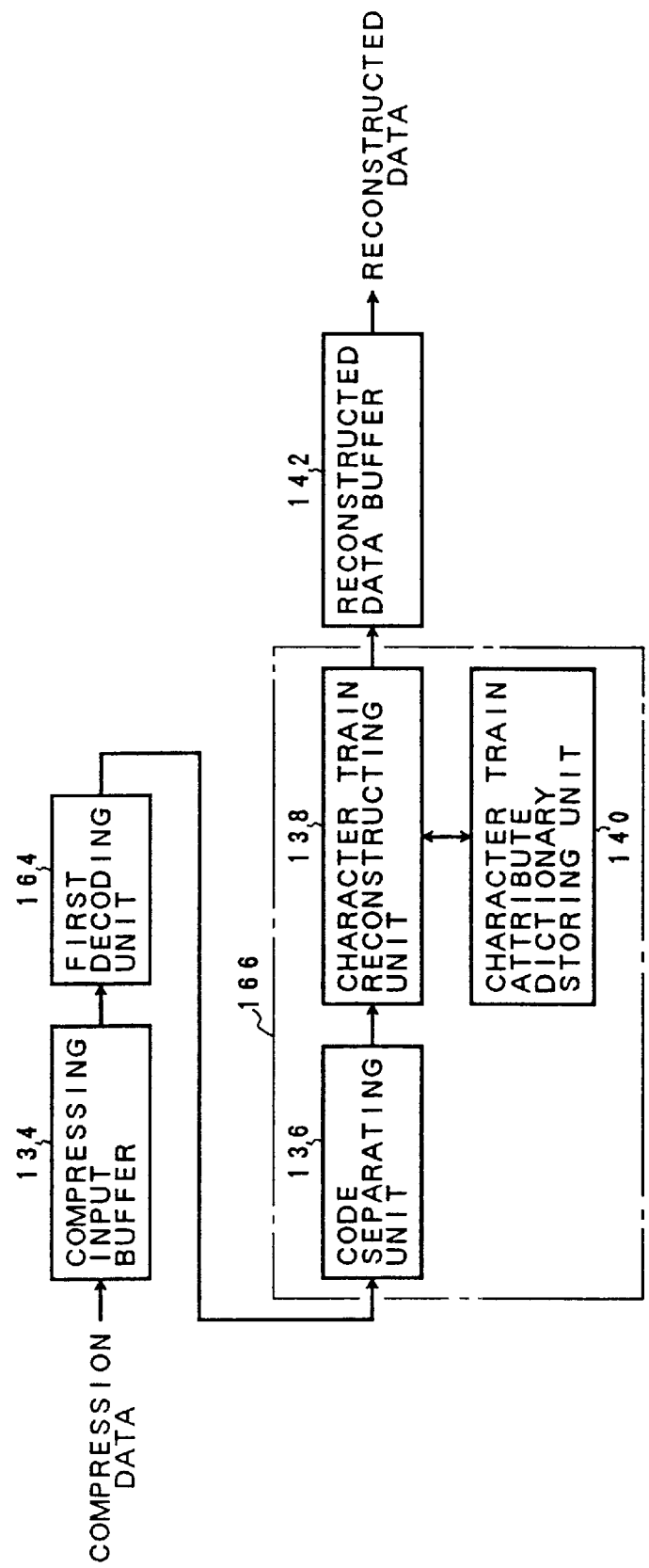
FIG. 43 is a block diagram of a data reconstructing apparatus for reconstructing compression data which was double coded in FIG. 36.

FIG. 43 is a block diagram of a data reconstructing apparatus for reconstructing the compression data coded by the data compressing apparatus in FIG. 36. In the data reconstructing apparatus, a first decoding unit 164 is provided subsequently to the compressing input buffer 134, a second decoding unit 166 is provided subsequently to the first decoding unit 164, and the reconstructed data buffer 142 is finally provided. As a first decoding unit 164, a dictionary type decoding unit 164-1 in FIG. 44 or a statistic type decoding unit 164-2 in FIG. 45 can be used. The dictionary type decoding unit 164-1 in FIG. 44 is constructed by a decoding unit 168, a decoding dictionary referring unit 169, and a decoding dictionary storing unit 170 and executes a decoding of LZ77 or LZ78. The statistic type decoding unit 164-2 in FIG. 45 is constructed by an arithmetic decoding unit 171 and a probability model unit 172 and executes an arithmetic decoding. In the second decoding unit 166, the code separating unit 136, character train decoding unit 138, and character train attribute dictionary storing unit 140 of the data reconstructing apparatus shown in FIG. 34 are used as they are. A dictionary structure of the character train attribute dictionary storing unit 140 is the same as that in FIG. 35.

Figure 46:
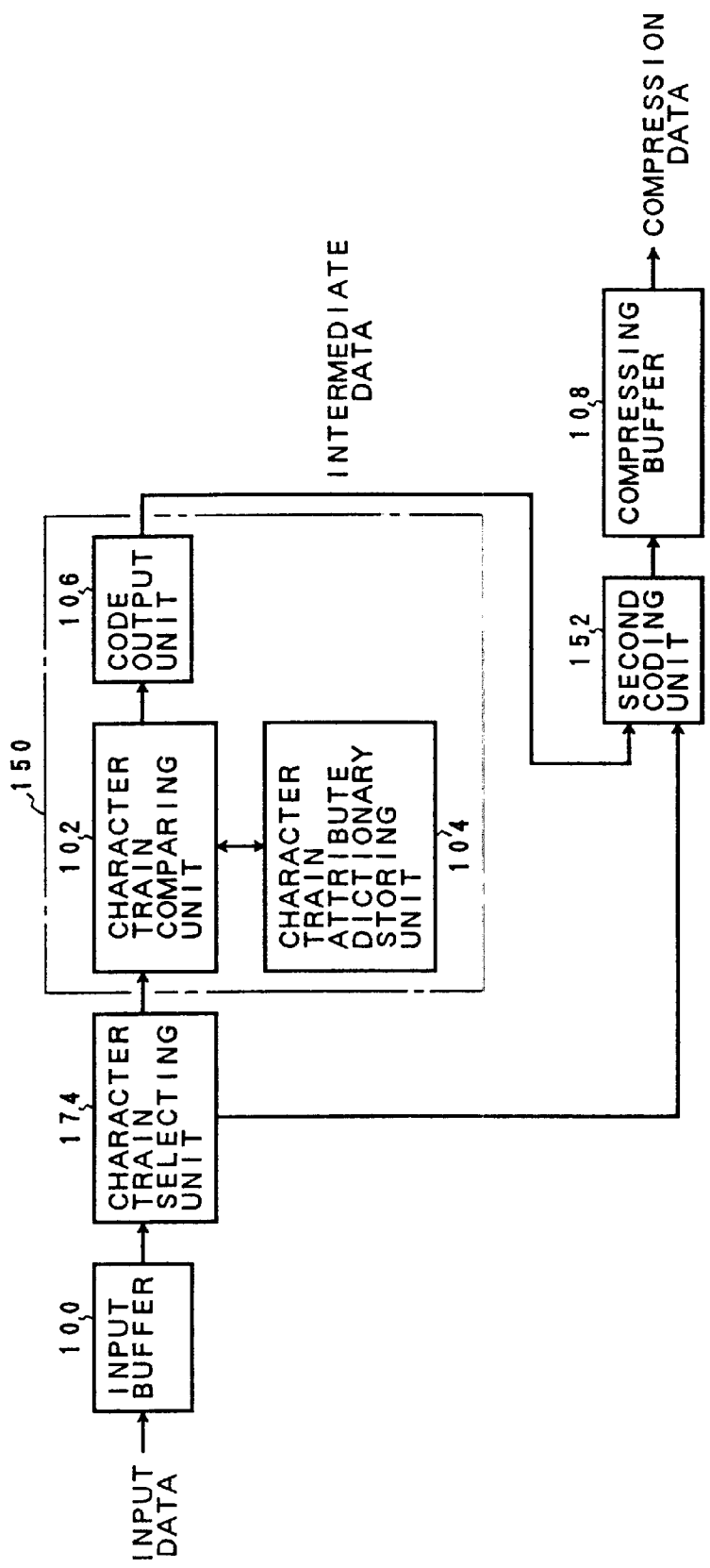
FIG. 46 is a block diagram of a data compressing apparatus for double coding Japanese data and single coding English data with respect to the data compression in FIG. 36.

FIG. 46 shows a modification of the data compressing apparatus for performing a double coding of FIG. 36 and is characterized in that a character train selecting unit 174 is provided subsequently to the input buffer 100. In the case where the character code of the character train inputted from the input buffer 100 is a Japanese character code, the character train selecting unit 174 inputs it to the first coding unit 150. When the character code is an alphabet character code of English sentence or the like, the character train selecting unit 174 inputs it to the second coding unit 152. Thus, an inconvenience such that the English character train is inputted to the first coding unit 150 and is not adapted to the character train attribute dictionary storing unit 104, so that an amount of data for coding increases over an amount of original data is solved.

Figure 47:
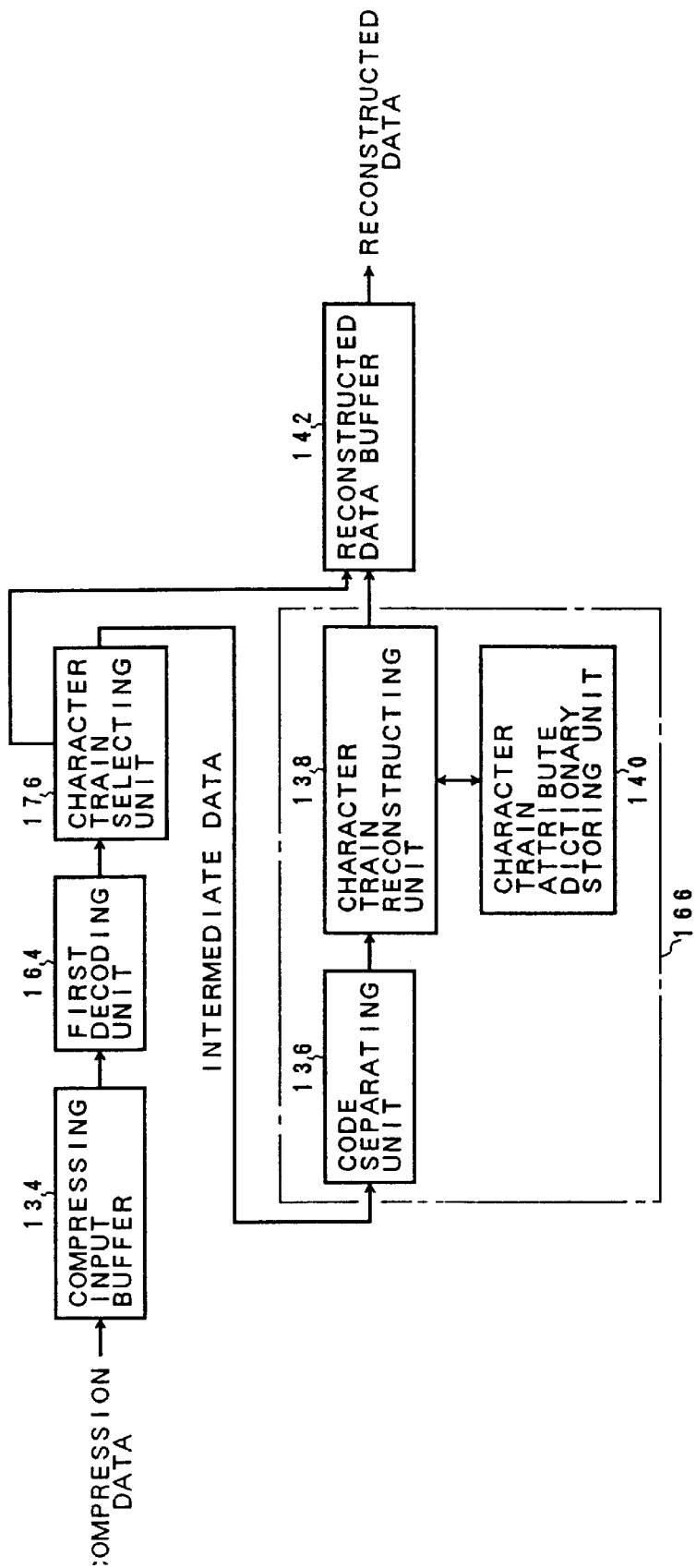
FIG. 47 is a block diagram of a data reconstructing apparatus for reconstructing compression data which was selectively coded in FIG. 46.

FIG. 47 is a block diagram of a data reconstructing apparatus for reconstructing the data coded by the data compressing apparatus in FIG. 46. In the data reconstructing apparatus, a character train selecting unit 176 is provided subsequently to the first decoding unit 164. In the case where the character train decoded by the first decoding unit 164 is an English character code such as an alphabet or the like, the character train selecting unit 176 considers that the reconstruction has been finished, so that the decoded character train is outputted to the reconstructed data buffer 142. On the other hand, in the case where the decoded character train is an intermediate code comprising a combination of the attribute information and the character train code, it is inputted to the second decoding unit 166. A reconstructing process of the Japanese character train based on the code separating unit 136, character train reconstructing unit 138, and character train attribute dictionary storing unit 140 is executed. According to the first invention of the invention as mentioned above, even in case of Japanese document data of, for example, a few kbytes such that an enough compression ratio cannot be obtained by the dictionary type coding or statistic type coding, the character train codes of the number of bits according to the number of words are predetermined, the dictionary is retrieved on a word unit basis, and it is allocated as a code. Thus, in case of Japanese, for example, the data amount after completion of the compression can be compressed to the half or less of the original data amount irrespective of an amount of data as a processing target. By executing the double coding in which the ordinary dictionary type coding and the statistic type coding are combined, the compression ratio can be further raised. As a dictionary structure, the character codes of the head characters are used as an index, the dependent character trains subsequent to the head character are grouped and stored. By sequentially reading out the dependent character trains subsequent to the head characters and detecting the coincidence, the dictionary retrieval can be performed at a higher speed. Further, when the code output by the decoding is obtained, its result is registered into the dynamic dictionary, the next coding is executed with reference to the coded dynamic dictionary, so that the dictionary retrieval can be executed at a further high speed.

In the second invention of the invention, Japanese is classified into dependent groups according to the kinds of parts of speech, the attribute codes are allocated to the dependent groups, the character train code is allocated to the number of parts of speech in the attribute group, and it is converted into the code comprising a combination of the attribute code and the character train code. Thus, as compared with the case of uniformly allocating the character train code of a fixed length and coding with respect to all of the words, the allocation code length is further reduced and the compression ratio can be raised. As for the decoding in which the attribute code and the character train code are combined as well, by further combining the ordinary dictionary type coding or statistic type coding, the compression ratio can be further raised. By using the dynamic dictionary for forming a dictionary while performing the coding, with respect to the character train which was once coded, the dictionary retrieval can be performed at a high speed. The processing speed can be raised due to the high dictionary retrieving speed.

Although the above embodiments relate to the example of using Japanese document data as document data as a target of the compression, in a manner similar to Japanese, the invention can be also applied as it is to document data of a language such as Chinese, Hangul, or the like in which a word is not separated by spaces.

The invention is not limited by the numerical values shown in the foregoing embodiments. Many proper modifications of the invention are possible within the scope of the invention without losing the object and advantages of the invention.

What is claimed is:

1. A data compressing apparatus for compressing non-compression data formed by character codes of a language having a word structure which is not separated by spaces, comprising:

a character train dictionary storing unit for storing a dictionary in which a character train serving as a processing unit upon compression has been registered;

a character train comparing unit for detecting a partial character train which coincides with said registration character train by comparing the registration character train in said character train dictionary storing unit with a partial character train in said non-compression data; and a code output unit for allocating a predetermined code every said partial character train detected by said character train comparing unit and outputting.

2. An apparatus according to claim 1, wherein said character train dictionary storing unit comprises:

a head character storing unit in which a head character of the partial character train to be compressed has been stored; and a dependent character train storing unit in which a dependent character train which depends on the head character stored in said head character storing unit has been stored.

3. An apparatus according to claim 2, wherein said head character storing unit stores a head address and the number of dependent character trains in said dependent character train storing unit while using the head character as an index, and said dependent character train storing unit stores a length of dependent character train, the dependent character train, and the character train code as a set at one or a plurality of storing positions which are designated by the head address in said head character storing unit.

4. An apparatus according to claim 3, wherein said character train comparing unit obtains the length of dependent character train from said dependent character train storing unit with reference to the head character storing unit in said character train dictionary storing unit by a head character in the non-compression data which is at present being processed, extracts the partial character train of the length of said dependent character train subsequent to the head character from said non-compression data, and performs a coincidence retrieval with the registered dependent character train, and when a retrieval result indicative of the coincidence with the registration character train is received from said character train comparing unit, said code output unit outputs the character train code stored in said dependent character train storing unit.

5. An apparatus according to claim 2, wherein said head character storing unit stores the head address and the number of dependent character trains in said dependent character train storing unit while using the head character as an index, and said dependent character train storing unit stores a length of dependent character train and the dependent character train as a set at one or a plurality of storing positions which are designated by a head address in said head character storing unit.

6. An apparatus according to claim 5, wherein said character train comparing unit obtains the length of dependent character train from said dependent character train storing unit with reference to the head character storing unit in said character train dictionary storing unit by a head character in the non-compression data which is at present being processed, extracts the partial character train of the length of said dependent character train subsequent to the head character from said non-compression data, and detects a coincidence with the registered dependent character train, and when a detection result indicative of the coincidence with the registration character train is received from said character train comparing unit, said code output unit outputs a character train registration number indicative of the storing position in said dependent character train storing unit as a character train code of the coincidence detected character train.

7. An apparatus according to claim 1, further comprising a dynamic dictionary storing unit in which a dynamic dictionary for registering the character train code outputted from said code output unit together with the partial character train of the non-compression data whose coincidence was detected has been stored, and wherein said character train comparing unit detects the partial character train which coincides with said registration character train by comparing the registration character train in said dynamic dictionary storing unit with the partial character train in said non-compression data with respect to the second and subsequent times, and when the coincident character train cannot be detected, said character train comparing unit retrieves said character train dictionary storing unit and detects the coincident partial character train.

8. A data reconstructing apparatus for comparing a registration character train which has been registered in a dictionary and serves as a processing unit upon compression with a partial character train in said non-compression data for the non-compression data, as a target, formed by a character code of a language having a word structure which is not separated by spaces, thereby detecting the partial character train which coincides with said registration character train, for inputting compression data to which a predetermined character train code has been allocated every said detected partial character train, and reconstructing original non-compression data, comprising:

a code separating unit for separating the character train code serving as a reconstruction unit from compression data;

a character train dictionary storing unit for storing a dictionary in which a reconstruction character train corresponding to the character train code serving as a processing unit upon reconstruction has been registered; and a character train reconstructing unit for reconstructing an original character train with reference to said character train dictionary storing unit by the character train code separated by said code separating unit.

9. An apparatus according to claim 8, wherein said character train dictionary storing unit stores the character train code, a head character, a length of dependent character train, and the dependent character train as a set every character train code as a reconstruction target, and said character train reconstructing unit recognizes a storing position in said character train dictionary storing unit on the basis of the character train code which is at present being processed and reconstructs the character train.

10. An apparatus according to claim 8, wherein said character train dictionary storing unit is constructed by a head character storing unit in which a head character of the partial character train to be compressed has been stored and a dependent character train storing unit in which a dependent character train which depends on the head character stored in said head character storing unit has been stored, said head character storing unit stores a head address and the number of dependent character trains in said dependent character train storing unit while using the head character as an index, said dependent character train storing unit stores a return address to said head character storing unit, a length of dependent character train, and the dependent character train as a set at a storing position designated by the head address in said head character storing unit, and said character train reconstructing unit reconstructs the dependent character train with reference to said dependent character train storing unit on the basis of the character train code which is at present being processed and reconstructs the head character with reference to said head character storing unit by obtaining said return address.

11. An apparatus according to claim 8, further comprising a dynamic dictionary storing unit in which a dynamic dictionary for registering the character train outputted from said character train reconstructing unit together with the coincidence detected character train code before reconstruction has been stored, and wherein said character train reconstructing unit compares the registration character train code in said dynamic dictionary storing unit with the character train code in said compression data with respect to the second and subsequent times, thereby detecting the character train code which coincides with said registration character train code, and when the coincident character train code cannot be detected, said character train reconstructing unit retrieves said character train dictionary storing unit and detects the coincident character train code.

12. A data compressing apparatus for compressing non-compression data formed by a character code of a language having a word structure which is not separated by spaces, comprising:

a first coding unit for comparing a registration character train which has been registered in a dictionary and serves as a processing unit when compressing with a partial character train in said non-compression data, thereby detecting the partial character train which coincides with said registration character train, and for allocating a predetermined character train code every said detected partial character train and outputting as an intermediate code; and a second coding unit for inputting an intermediate code train compressed by said first coding unit and compressing it again.

13. An apparatus according to claim 12, wherein said second coding unit is a dictionary type coding unit for replacing said intermediate code train by a registration number of the dictionary and registering the intermediate code train of a higher appearance frequency by a longer code train and coding.

14. An apparatus according to claim 12, wherein said second coding unit is a statistic type coding unit for allocating a short code to the intermediate code of a high appearance frequency and outputting on the basis of a statistic appearance frequency of said intermediate code.

15. An apparatus according to claim 12, further comprising a character train selecting unit for discriminating whether said non-compression data is a first character train of the language which is not separated by spaces or a second character train of the language which is separated by spaces, inputting said first character train to said first coding unit, and inputting said second character train to said second coding unit.

16. An apparatus according to claim 12, wherein said first coding unit comprises:
   a character train dictionary storing unit for storing a dictionary in which the character train serving as a processing unit upon compression has been registered;
   a character train comparing unit for comparing the registration character train in said character train dictionary storing unit with the partial character train in said non-compression data, thereby detecting the partial character train which coincides with said registration character train; and
   a code output unit for allocating a predetermined character train code every partial character train detected by said character train comparing unit and outputting.

17. An apparatus according to claim 16, wherein said character train dictionary storing unit comprises:
   a head character storing unit in which a head character of the partial character train to be compressed has been stored; and
   a dependent character train storing unit in which a dependent character train which depends on the head character stored in said head character storing unit has been stored.

18. An apparatus according to claim 17, wherein
   said head character storing unit stores a head address and the number of dependent character trains in said dependent character train storing unit while using the head character as an index, and
   said dependent character train storing unit stores a length of dependent character train, said dependent character train, and the character train code as a set at one or a plurality of storing positions which are designated by the head address in said head character storing unit.

19. An apparatus according to claim 18, wherein
   said character train comparing unit obtains the length of dependent character train from said dependent character train storing unit with reference to said head character storing unit in said character train dictionary storing unit by the head character in the non-compression data which is at present being processed, extracts the partial character train of the length of said dependent character train subsequent to the head character from said non-compression data, and detects a coincidence with the registered dependent character train, and
   when a detection result indicative of the coincidence with the registration character train is received from said character train comparing unit, said code output unit allocates the character train code stored in said dependent character train storing unit every said coincidence detected character train and outputs.

20. An apparatus according to claim 16, wherein
   said head character storing unit stores a head address and the number of dependent character trains in said dependent character train storing unit while using the head character as an index, and
   said dependent character train storing unit stores a length of dependent character train and said dependent character train as a set at one or a plurality of storing positions which are designated by the head address in said head character storing unit.

21. An apparatus according to claim 20, wherein
   said character train comparing unit obtains the length of dependent character train from said dependent character train storing unit with reference to said head character storing unit in said character train dictionary storing unit by the head character in the non-compression data which is at present being processed, extracts the partial character train of the length of said dependent character train subsequent to the head character from said non-compression data, and detects a coincidence with the registered dependent character train, and
   when a detection result indicative of the coincidence with the registration character train is received from said character train comparing unit, said code output unit outputs the character train code to which a character train registration number showing a storing position in said dependent character train storing unit has been allocated every said coincidence detected character train.

22. An apparatus according to claim 16, further comprising:
   a dynamic dictionary storing unit in which a dynamic dictionary for registering the character train code outputted from said code output unit together with the partial character train of said coincidence detected non-compression data has been stored; and
   an appearance frequency counting unit for counting an appearance frequency of the character train code outputted from said code output unit and outputting a count value to said second coding unit,
   and wherein said character train comparing unit compares the registration character train in said dynamic dictionary storing unit with the partial character train in said non-compression data with respect to the second and subsequent times, thereby detecting the partial character train which coincides with said registration character train, and retrieves said character train dictionary storing unit in the case where the coincident character train cannot be detected, and detects the coincident partial character train.

23. A data reconstructing apparatus for inputting compression data in which a coding at a first stage for detecting a registration character train which has been registered in a dictionary and serves as a processing unit upon compression for non-compression data, as a target, formed by character codes of a language having a word structure that is not separated by spaces and a coincident partial character train in said non-compression data and for outputting a predetermined character train code as an intermediate code and a coding at a second stage for inputting said intermediate code train and again coding have been executed and reconstructing the original non-compression data, comprising:
   a first decoding unit for inputting said compression data and reconstructing said intermediate code train; and
   a second decoding unit for inputting the intermediate code train reconstructed by said first decoding unit and reconstructing the original character train.

24. An apparatus according to claim 23, wherein in the case where a dictionary type coding such that the intermediate code train is replaced by a registration number of the dictionary and the intermediate code train of a higher appearance frequency is registered by a longer code train and is coded is executed as the coding at said second stage, said first decoding unit performs a dictionary type decoding for reconstructing said intermediate code with reference to the dictionary by the input code.

25. An apparatus according to claim 23, wherein in the case where a statistic type coding such that a short code is allocated to the intermediate code of a high appearance frequency and is outputted on the basis of a statistic appearance frequency of the intermediate code is executed as the coding at said second stage, said first decoding unit performs a statistic type decoding for reconstructing the intermediate code on the basis of the appearance frequency of the reconstructed intermediate code.

26. An apparatus according to claim 23, wherein in the case where the codings at said first and second stages are executed to a character train of the language which is not separated by spaces with respect to said non-compression data and the coding at only said second stage is performed to a character train of a language which is separated by spaces, a character train selecting unit for inputting the intermediate code train in which the code train by the codings at said first and second stages was decoded to said second decoding unit and for outputting the character train, as it is, in which the code train of only the coding at said second stage has been reconstructed is provided subsequently to said first decoding unit.

27. An apparatus according to claim 23, further comprising:
    a code separating unit for separating a character train code serving as a reconstructing unit from the compression data;
    a character train dictionary storing unit for storing the dictionary in which a reconstruction character train corresponding to a character train code serving as a processing unit upon reconstruction has been registered; and
    a character train reconstructing unit for reconstructing the original character train with reference to said character train dictionary storing unit by the character train code separated by said code separating unit.

28. An apparatus according to claim 23, wherein
    said character train dictionary storing unit stores a character train code, a head character, a length of dependent character train, and said dependent character train as a set every character train code as a reconstruction target, and
    said character train reconstructing unit recognizes a storing position in said character train dictionary storing unit on the basis of the character train code which is at present being processed and reconstructs the character train.

29. An apparatus according to claim 23, wherein
    said character train dictionary storing unit comprises a head character storing unit in which a head character of the partial character train to be compressed has been stored and a dependent character train storing unit in which a dependent character train which depends on the head character stored in said head character storing unit has been stored,
    said head character storing unit stores a head address and the number of dependent character trains in said dependent character train storing unit while using the head character as an index,
    said dependent character train storing unit stores a return address to said head character storing unit, a length of dependent character train, and said dependent character train as a set at one or a plurality of storing positions which are designated by the head address in said head character storing unit, and
    said character train reconstructing unit reconstructs the dependent character train with reference to said dependent character train storing unit on the basis of the character train code which is at present being processed and reconstructs the head character with reference to said head character storing unit by obtaining said return address.

30. An apparatus according to claim 27, further comprising:
    a dynamic dictionary storing unit in which a dynamic dictionary for registering the character train outputted from said character train reconstructing unit together with the coincidence detected character train code before the reconstruction has been stored; and
    an appearance frequency counting unit for counting an appearance frequency of the character train outputted from said character train reconstructing unit and outputting a count value to said second coding unit,
    and wherein said character train reconstructing unit compares the registration character train code in said dynamic dictionary storing unit with the character train code in said compression data with respect to the second and subsequent times, thereby detecting the character train code which coincides with said registration character train code, and retrieves said character train dictionary storing unit when the coincident character train code cannot be detected, and detects the coincident character train code.

31. A data compressing method of compressing non-compression data formed by character codes of a language having a word structure which is not separated by spaces, comprising:
    a character train comparing step of comparing a registration character train in a character train dictionary storing unit in which a dictionary in which a character train serving as a processing unit upon compression was registered has been stored with a partial character train in said non-compression data, thereby detecting the partial character train which coincides with said registration character train; and
    a code output step of outputting a predetermined character train code every said partial character train detected by said character train comparing step.

32. A data reconstructing method of comparing a registration character train which has been registered in a dictionary and serves as a processing unit upon compression for non-compression data, as a target, formed by character codes of a language having a word structure which is not separated by spaces with a partial character train in said non-compression data, thereby detecting the partial character train which coincides with said registration character train, and inputting compression data to which a predetermined character train code has been allocated every said detected partial character train, and reconstructing the original non-compression data, comprising:
    a code train separating step of separating a character train code serving as a reconstructing unit from the compression data; and
    a character train reconstructing step of reconstructing the original character train with reference to the dictionary in which a reconstruction character train corresponding to the character train code serving as a processing unit upon reconstruction has been registered by the character train code separated in said code train separating step.

33. A data compressing method of compressing non-compression data formed by character codes of a language having a word structure which is not separated by spaces, comprising:

a first coding step of comparing a registration character train which has been registered in a dictionary and serves as a processing unit upon compression with a partial character train in said non-compression data, detecting the partial character train which coincides with said registration character train, and allocating a predetermined character train code every said detected partial character train, and outputting as an intermediate code; and a second coding step of inputting the intermediate code train compressed by said first coding step and again compressing it.

34. A data reconstructing method of inputting compression data in which a coding at a first stage such that a registration character train which has been registered in a dictionary and serves as a processing unit upon compression for non-compression data, as a target, formed by character codes of a language having a word structure which is not separated by spaces and a coincident partial character train in said non-compression data are detected and a predetermined character train code is allocated and an intermediate code is outputted and a coding at a second stage such that said intermediate code train is inputted and is again coded have been performed and reconstructing the original non-compression data, comprising:

a first decoding step of inputting said compression data and reconstructing said intermediate code train; and a second decoding step of inputting the intermediate code train decoded by said first decoding step and reconstructing the original character train.

35. A data compressing apparatus for compressing non-compression data which is formed by character codes, comprising:

a character train attribute dictionary storing unit for storing a dictionary in which character trains serving as a processing unit upon compression have been classified in accordance with attributes and divided into a plurality of attribute groups and registered;

a character train comparing unit for comparing the registration character train in said character train attribute dictionary storing unit with a partial character train in said non-compression data, thereby detecting the partial character train which coincides with said registration character train; and a code output unit for allocating a set of a predetermined character train code and an attribute code showing said attribute group every said partial character train detected by said character train comparing unit and outputting.

36. An apparatus according to claim 35, wherein said character train attribute dictionary storing unit comprises:

a head character storing unit in which a head character of the partial character train to be compressed has been stored; and a dependent character train storing unit in which a dependent character train which depends on the head character stored in said head character storing unit has been stored.

37. An apparatus according to claim 36, wherein said head character storing unit stores a head address and the number of dependent character trains in said dependent character train storing unit while using the head character as an index, and said dependent character train storing unit stores a length of dependent character train, said dependent character train, a character train code, and the attribute code as a set at a storing position which is designated by the head address in said head character storing unit.

38. An apparatus according to claim 37, wherein said character train comparing unit refers to said head character storing unit of said character train attribute dictionary storing unit by the head character in said non-compression data which is at present being processed, obtains the length of dependent character train from said dependent character train storing unit, extracts the partial character train of the length of said dependent character train subsequent to the head character from said non-compression data, and retrieves a coincidence with the registered dependent character train, and when a retrieval result showing the coincidence with the registration character train is received from said character train comparing unit, said code output unit allocates a set of the character train code and the attribute code stored in said dependent character train storing unit every said coincidence detected partial character train and outputs.

39. An apparatus according to claim 36, wherein said head character storing unit is divided into a plurality of attribute storing units according to said attribute groups, a peculiar dictionary number is set into each of said plurality of attribute storing units, the head address and the number of dependent character trains in said dependent character train storing unit are stored therein while using the head character of the same character train as an index, and said dependent character train storing unit stores a length of dependent character train and said dependent character train as a set at storing positions which are designated by the head addresses in said plurality of attribute storing units.

40. An apparatus according to claim 39, wherein said character train comparing unit refers to said attribute storing unit in said character train attribute dictionary storing unit by the head character in said non-compression data which is at present being processed, obtains the length of dependent character train from said corresponding dependent character train storing unit, extracts the partial character train of the length of said dependent character train subsequent to the head character from said non-compression data, and retrieving a coincidence with the registered dependent character train, and when a retrieval result indicative of the coincidence with the registration character train is received from said character train comparing unit, said code output unit allocates a set of a character train registration number showing the storing position in said dependent character train storing unit and a dictionary number in said attribute storing unit to said coincidence detected character train and outputs.

41. A data reconstructing apparatus for comparing a registration character train in a dictionary in which character trains serving as a processing unit upon compression have been classified in accordance with attributes and divided into a plurality of attribute groups and registered for non-compression data formed by character codes as a target with a partial character train in said non-compression data, thereby detecting the coincident partial character train, and inputs compression data to which a set of a predetermined character train code and an attribute code indicative of said attribute group have been allocated every said partial character train, and reconstructs the original non-compression data, comprising:

- a code separating unit for extracting a code serving as a reconstructing unit from compression data and separating into an attribute code and a character train code;
- a character train attribute dictionary storing unit which is divided into a plurality of attribute storing units according to said attribute groups and stores a dictionary in which a reconstruction character train corresponding to the character train code serving as a processing unit when reconstructing every said plurality of attribute storing units has been registered; and
- a character train reconstructing unit for reconstructing the original character train with reference to said character train attribute dictionary storing unit by said attribute code and said character train code separated by said code train separating unit.

42. An apparatus according to claim 41, wherein said character train attribute dictionary storing unit divides a set of a head character as a reconstruction target, a length of dependent character train, and said dependent character train into said attribute groups and stores into said plurality of attribute storing units, and said character train reconstructing unit selects said attribute storing unit on the basis of the separated attribute code, recognizes a storing position of the character train code in said selected attribute storing unit on the basis of the next separated character train code, and reconstructs a character train.

43. A data compressing apparatus for compressing non-compression data formed by character codes, comprising:

- a first coding unit for comparing a registration character train which has been registered in a character train attribute dictionary and serves as a processing unit upon compression with a partial character train in said non-compression data, thereby detecting the partial character train which coincides with said registration character train, and allocating a set of a predetermined character train code and an attribute code every said coincidence detected partial character train as an intermediate code and outputting; and
- a second coding unit for inputting the intermediate code train compressed by said first coding unit and again compressing.

44. An apparatus according to claim 43, wherein said second coding unit is a dictionary type coding unit for replacing said intermediate code train by a registration number of the dictionary and registering the intermediate code train of a higher appearance frequency by a longer code train and coding it.

45. An apparatus according to claim 43, wherein said second coding unit is a statistic type coding unit for allocating a short code to the intermediate code train of a high appearance frequency on the basis of a statistic appearance frequency of said intermediate code train and outputting.

46. An apparatus according to claim 43, further comprising a character train selecting unit for discriminating whether said non-compression data is a first character train of a language which is not separated by spaces or a second character train of a language which is separated by spaces, inputting said first character train to said first coding unit, and inputting said second character train to said second coding unit.

47. An apparatus according to claim 43, wherein said first coding unit comprises:

- a character train attribute dictionary storing unit for storing a dictionary in which character trains serving as a processing unit upon compression have been classified in accordance with attributes and divided into a plurality of attribute groups and registered;
- a character train comparing unit for comparing the registration character train in said character train attribute dictionary storing unit with the partial character train in said non-compression data, thereby detecting the partial character train which coincides with said registration character train; and
- a code output unit for allocating a set of a predetermined character train code and the attribute code showing said attribute group every said partial character train detected by said character train comparing unit and outputting.

48. An apparatus according to claim 47, wherein said character train attribute dictionary storing unit comprises:

- a head character storing unit in which a head character of the partial character train to be compressed has been stored; and
- a dependent character train storing unit in which a dependent character train which depends on the head character stored in said head character storing unit has been stored.

49. An apparatus according to claim 48, wherein said head character storing unit stores a head address and the number of dependent character trains in said dependent character train storing unit while using the head character as an index, and said dependent character train storing unit stores a length of dependent character train, said dependent character train, a character train code, and the attribute code as a set at a storing position which is designated by the head address in said head character storing unit, and further, the sum of the lengths of said attribute code and said character train code is a byte code of a multiple of 8 bits.

50. An apparatus according to claim 49, wherein said character train comparing unit refers to said head character storing unit in said character train attribute dictionary storing unit by the head character in the non-compression data which is at present being processed, obtains the length of dependent character train from said dependent character train storing unit, extracts the partial character train of the length of said dependent character train subsequent to the head character from the non-compression data, and detects the coincidence with the registered dependent character train, and when a detection result indicative of the coincidence with the registration character train is received from said character train comparing unit, said code output unit allocates a set of said character train code and said attribute code stored in said dependent character train storing unit to said coincidence detected character train and outputs.

51. An apparatus according to claim 50, wherein
said head character storing unit is divided into a plurality of attribute storing units according to said attribute groups,
a peculiar dictionary number is set into each of said plurality of attribute storing units, a head address and the number of dependent character trains in said dependent character train storing unit are stored while using the head character of the same character train as an index, and
said dependent character train storing unit stores a length of dependent character train and said dependent character train as a set at storing positions which are designated by head addresses in said plurality of attribute storing units.

52. An apparatus according to claim 51, wherein
said character train comparing unit refers to said attribute storing unit in said character train attribute dictionary storing unit by the head character in the non-compression data which is at present being processed, obtains the length of dependent character train from said corresponding dependent character train storing unit, extracts the partial character train of the length of said dependent character train subsequent to the head character from said non-compression data, and detects a coincidence with said registered dependent character train, and
when a detection result showing the coincidence with the registration character train is received from said character train comparing unit, said code output unit allocates a set of a character train registration number indicative of the storing position in said dependent character train storing unit and a dictionary number in said attribute storing unit to a byte code whose code length is a multiple of 8 bits and outputs.

53. A data reconstructing apparatus for inputting compression data in which a coding at a first stage such that a registration character train which has been registered in a character train attribute dictionary and serves as a processing unit upon compression for non-compression data formed by character codes as a target and a coincident partial character train in said non-compression data are detected and a set of a predetermined character train code and an attribute code are allocated as an intermediate code and are outputted and a coding at a second stage for inputting said intermediate code train and coding again have been performed and reconstructing the original non-compression data, comprising:
a first decoding unit for inputting said compression data and reconstructing said intermediate code train; and
a second decoding unit for inputting the intermediate code train decoded by said first decoding unit and reconstructing the original character train.

54. An apparatus according to claim 53, wherein in the case where an attribute dictionary type coding such that the intermediate code train is replaced by a registration number in the attribute dictionary and the intermediate code train of a higher appearance frequency is registered by a longer code train and coded is executed as the coding at said second stage, said first decoding unit executes an attribute dictionary type decoding for reconstructing said intermediate code with reference to the attribute dictionary by the input code.

55. An apparatus according to claim 53, wherein in the case where a statistic type coding such that a short code is allocated to the intermediate code of a high appearance frequency and is outputted on the basis of a statistic appearance frequency of the intermediate code is executed as the coding at said second stage, said first decoding unit performs a statistic type decoding for reconstructing the intermediate code on the basis of the appearance frequency of the reconstructed intermediate code.

56. An apparatus according to claim 53, wherein in the case where the codings at said first and second stages are executed to a character train of a language which is not separated by spaces with respect to said non-compression data and the coding at only said second stage is performed to a character train of a language which is separated by spaces, a character train selecting unit for inputting the intermediate code train due to the decoding of the code train by the codings at said first and second stages to said second decoding unit and for outputting the character train, as it is, in which the code train of only the coding at said second stage has been reconstructed is further provided subsequently to said first decoding unit.

57. An apparatus according to claim 53, wherein said second decoding unit further comprises:
a code separating unit for separating the attribute code and the character train code from the intermediate code;
a character train attribute dictionary storing unit which is divided into a plurality of attribute storing units according to attribute groups and which stores a dictionary in which a reconstruction character train corresponding to a character code serving as a processing unit upon reconstruction has been registered every said attribute storing unit; and
a character train reconstructing unit for reconstructing the original character train with reference to said character train attribute dictionary storing unit based on the attribute code and the character train code separated by said code separating unit.

58. An apparatus according to claim 57, wherein
said character train attribute dictionary storing unit stores a set of a head character as a reconstruction target, a length of dependent character train, and said dependent character train every said attribute group into said plurality of attribute storing units, and
said character train reconstructing unit selects said attribute storing unit on the basis of the separated attribute code and recognizes a storing position in said selected attribute storing unit on the basis of the next separated character train code and reconstructs the character train.

59. A data compressing method of compressing non-compression data formed by character codes, comprising:
a character train comparing step of comparing a registration character train in a dictionary in which character trains serving as a processing unit upon compression have been classified in accordance with attributes and divided into a plurality of attribute groups and registered with a partial character train in said non-compression data, thereby detecting the partial character train which coincides with said registration character train; and
a code output step of allocating a set of a predetermined character train code and an attribute code showing said attribute group every said partial character train detected by said character train comparing step and outputting.

60. A data reconstructing method of comparing a registration character train in a dictionary in which character trains serving as a processing unit upon compression have been classified in accordance with attributes and divided into a plurality of attribute groups and registered for non-compression data formed by character codes as a target with a partial character train in said non-compression data, thereby detecting the coincident partial character train, and inputting compression data to which a set of a predetermined character train code and an attribute code showing said attribute group has been allocated every said partial character train, and reconstructing the original non-compression data, comprising:

- a code separating step of extracting a code serving as a reconstructing unit from the compression data and separating into the attribute code and the character train code;
- a character train attribute dictionary storing step of forming a plurality of attribute storing units according to said attribute groups and storing a dictionary in which a reconstruction character train corresponding to the character train code serving as a processing unit upon reconstruction has been registered every said attribute storing unit; and
- a character train reconstructing step of reconstructing the original character train with reference to said character train attribute dictionary storing unit by the attribute code and the character train code separated by said code separating step.

61. A data compressing method of compressing non-compression data formed by character codes, comprising:

- a first coding step of comparing a registration character train which has been registered in a character train attribute dictionary and serves as a processing unit upon compression with a partial character train in said non-compression data, thereby detecting the partial character train which coincides with said registration character train, and allocating a set of intermediate codes in which a predetermined character train code and an attribute code are coupled every said detected partial character train as an intermediate code, and outputting; and
- a second coding step of inputting the intermediate code train compressed by said first coding step and again compressing.

62. A data reconstructing method of inputting compression data in which a coding at a first stage such that a registration character train which has been registered in a character train attribute dictionary and serves as a processing unit upon compression for non-compression data formed by character codes as a target and a partial character train which coincides in said non-compression data are detected and a set of a predetermined character train code and an attribute code is allocated as an intermediate code and outputted and a coding at a second stage for inputting said intermediate code train and coding again have been executed and reconstructing the original non-compression data:

- a first decoding step of inputting said compression data and reconstructing said intermediate code train; and
- a second decoding step of inputting the intermediate code train reconstructed by said first decoding step and reconstructing the original character train.

* * * * *